(12) United States Patent
Ito et al.

(10) Patent No.: US 7,208,817 B2
(45) Date of Patent: Apr. 24, 2007

(54) SEMICONDUCTOR DEVICE

(75) Inventors: Fujio Ito, Hnno (JP); Hiromichi Suzuki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/849,196

(22) Filed: May 20, 2004

(65) Prior Publication Data
US 2004/0232527 A1    Nov. 25, 2004

(30) Foreign Application Priority Data
May 20, 2003    (JP)    ............................. 2003-141911

(51) Int. Cl.
*H01L 23/495*    (2006.01)
*H01L 23/48*    (2006.01)
*H01L 23/52*    (2006.01)
*H01L 29/40*    (2006.01)

(52) U.S. Cl. ...................... 257/666; 257/668; 257/669; 257/787; 257/676

(58) Field of Classification Search ................ 257/666, 257/668, 669, 787, 676
See application file for complete search history.

(56) References Cited

U.S. PATENT DOCUMENTS

| | | | | | |
|---|---|---|---|---|---|
| 5,726,079 | A | * | 3/1998 | Johnson ....................... | 438/106 |
| 5,976,912 | A | * | 11/1999 | Fukutomi et al. ........... | 438/110 |
| 6,410,979 | B2 | * | 6/2002 | Abe ........................... | 257/684 |
| 6,483,184 | B2 | * | 11/2002 | Murata ....................... | 257/698 |
| 6,642,609 | B1 | * | 11/2003 | Minamio et al. ........... | 257/666 |
| 6,781,223 | B2 | * | 8/2004 | Mihara et al. .............. | 257/684 |
| 6,927,483 | B1 | * | 8/2005 | Lee et al. .................... | 257/676 |

FOREIGN PATENT DOCUMENTS

JP    2001-244399    9/2001

* cited by examiner

*Primary Examiner*—Sara Crane
*Assistant Examiner*—Samuel A. Gebremariam
(74) *Attorney, Agent, or Firm*—Antonelli, Terry, Stout & Kraus, LLP.

(57) ABSTRACT

A semiconductor device has an, improved mounting reliability and has external terminals formed by exposing portions of leads from a back surface of a resin sealing member. End portions on one side of the leads are fixed to a back surface of a semiconductor chip, and portions of the leads positioned outside the semiconductor chip are connected with electrodes formed on the semiconductor chip through wires.

6 Claims, 48 Drawing Sheets

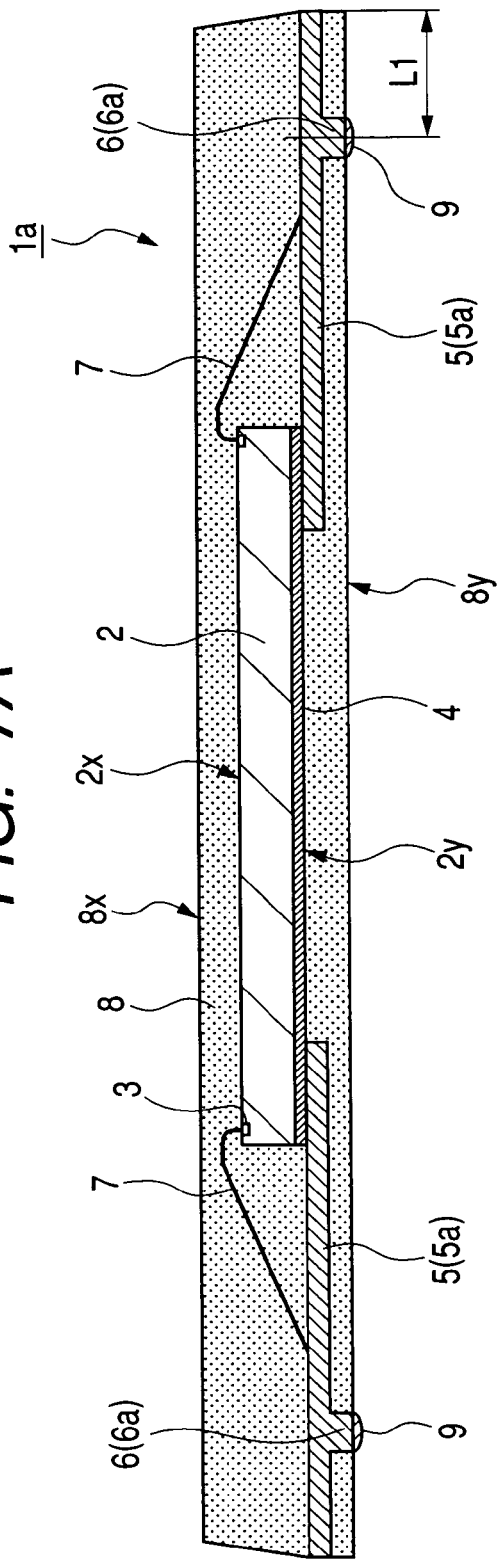
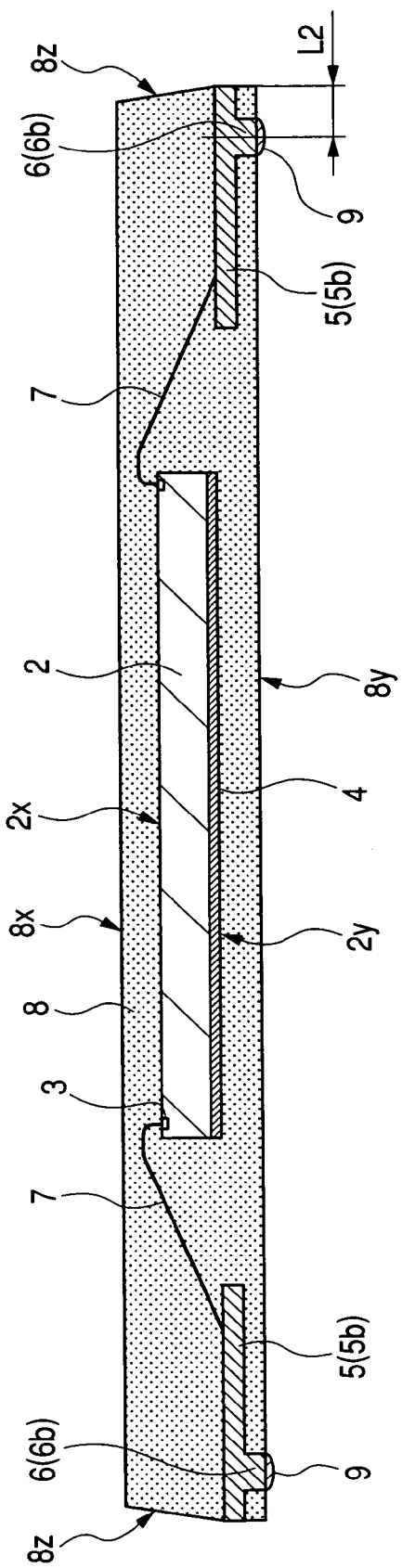
FIG. 7A
FIG. 7B

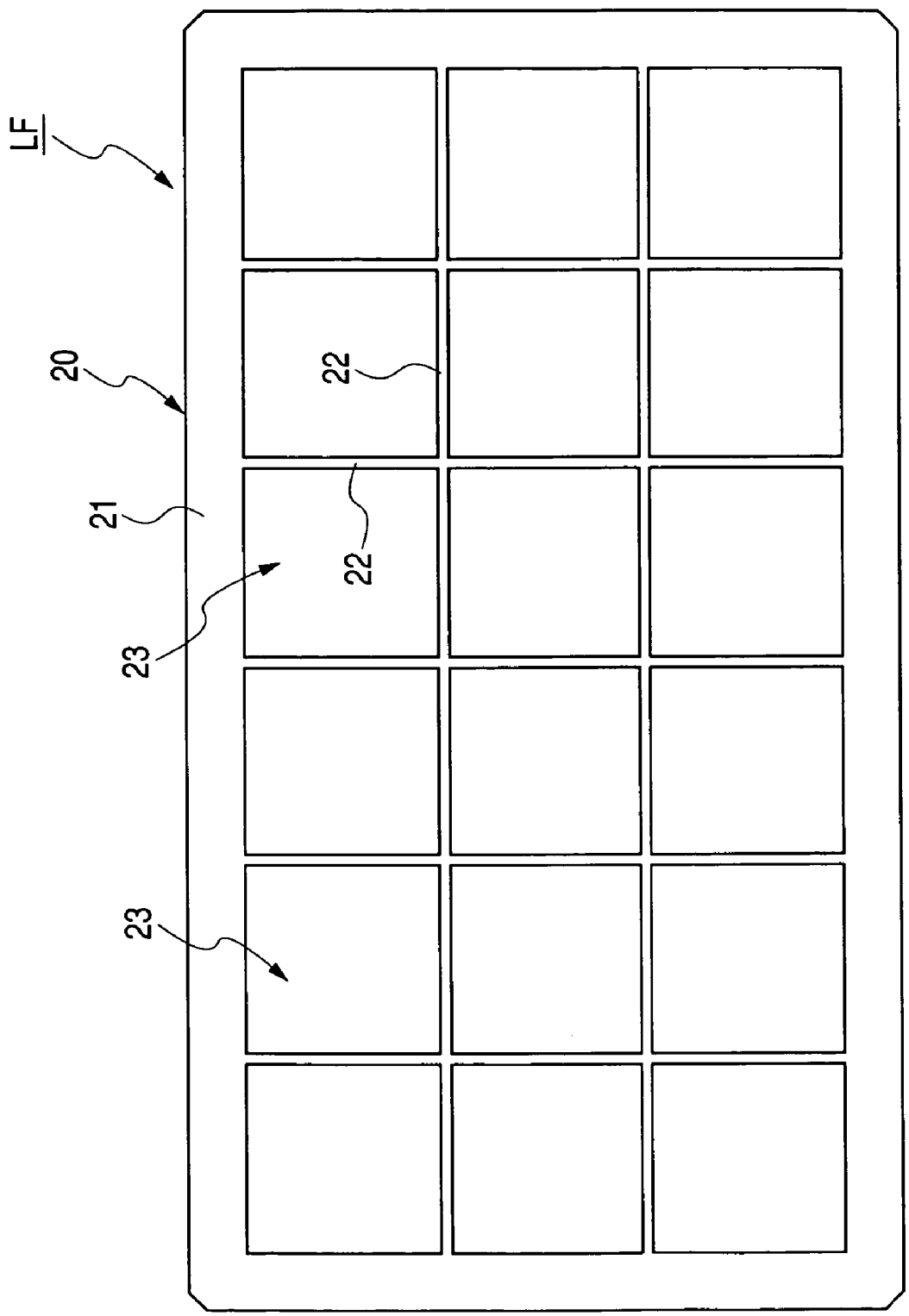

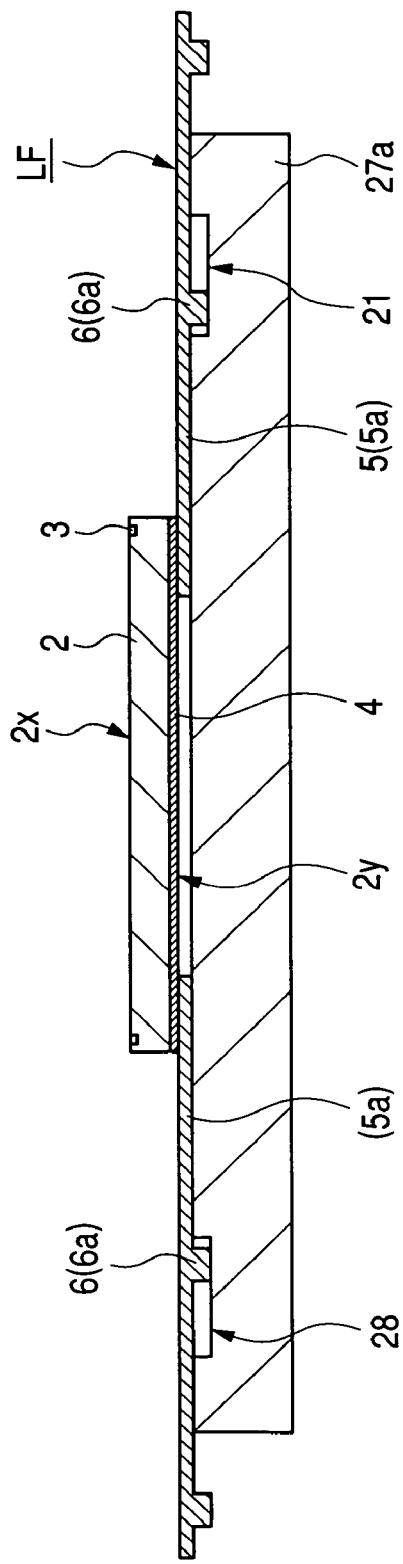
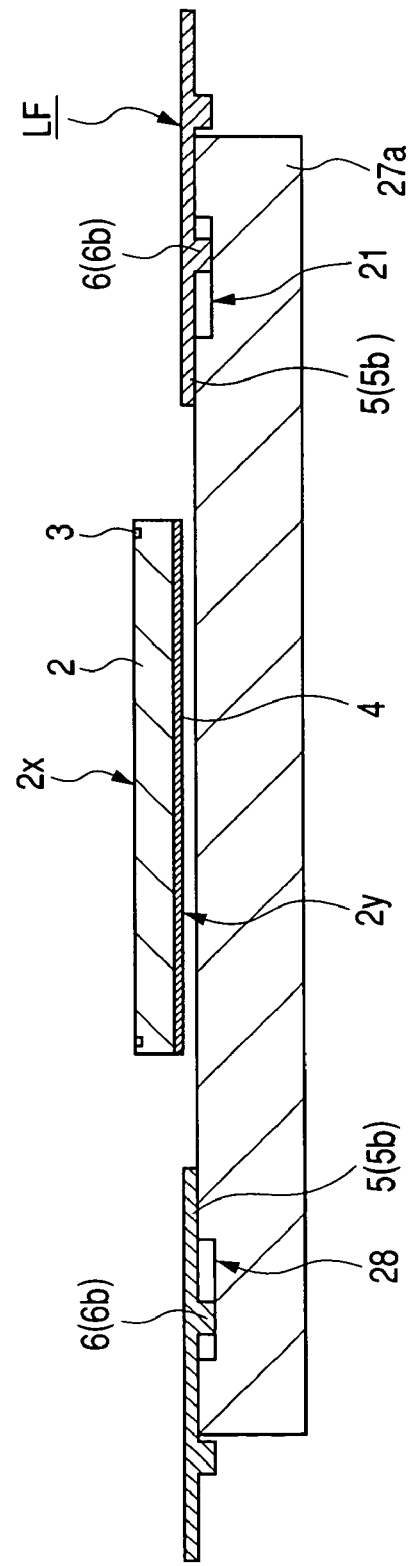

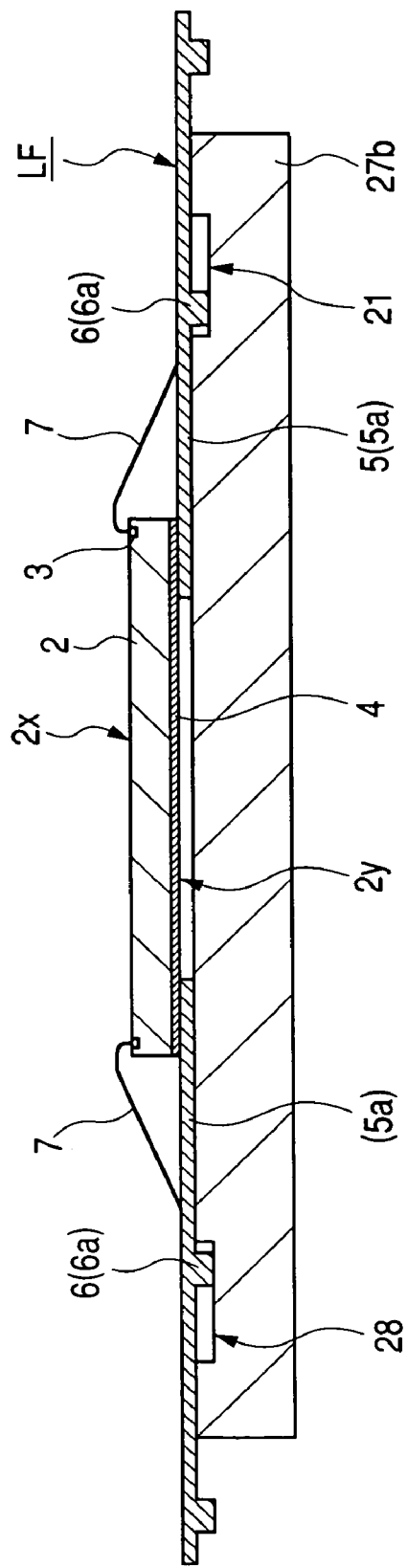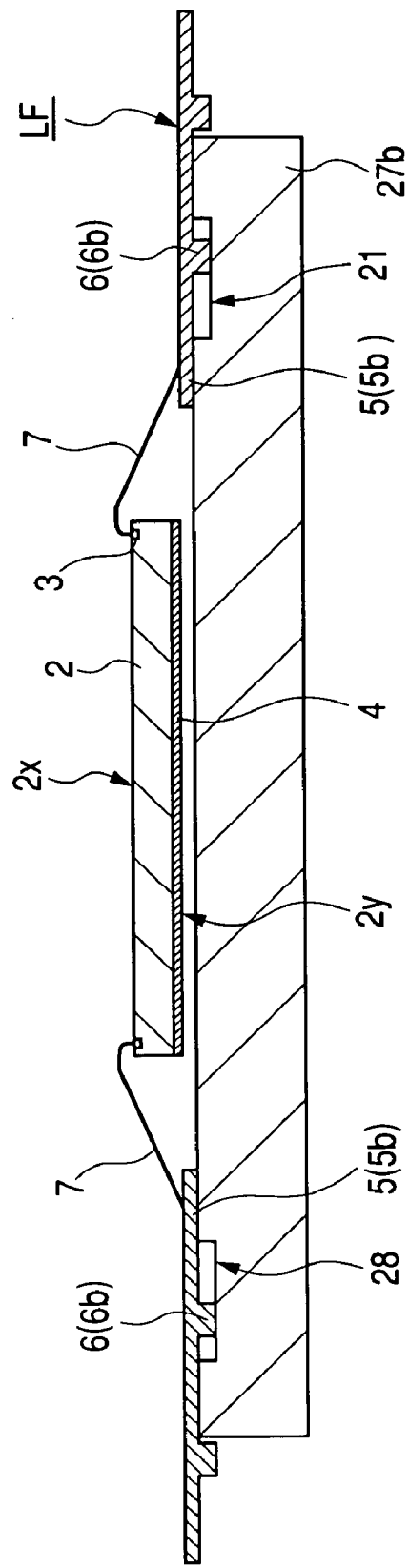

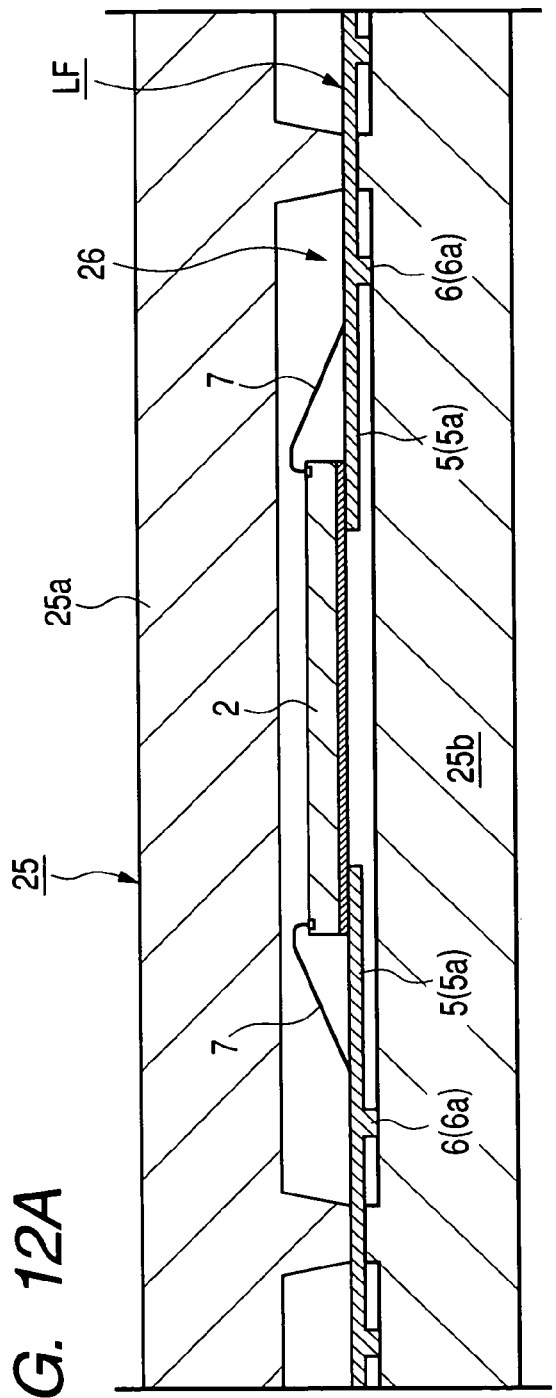
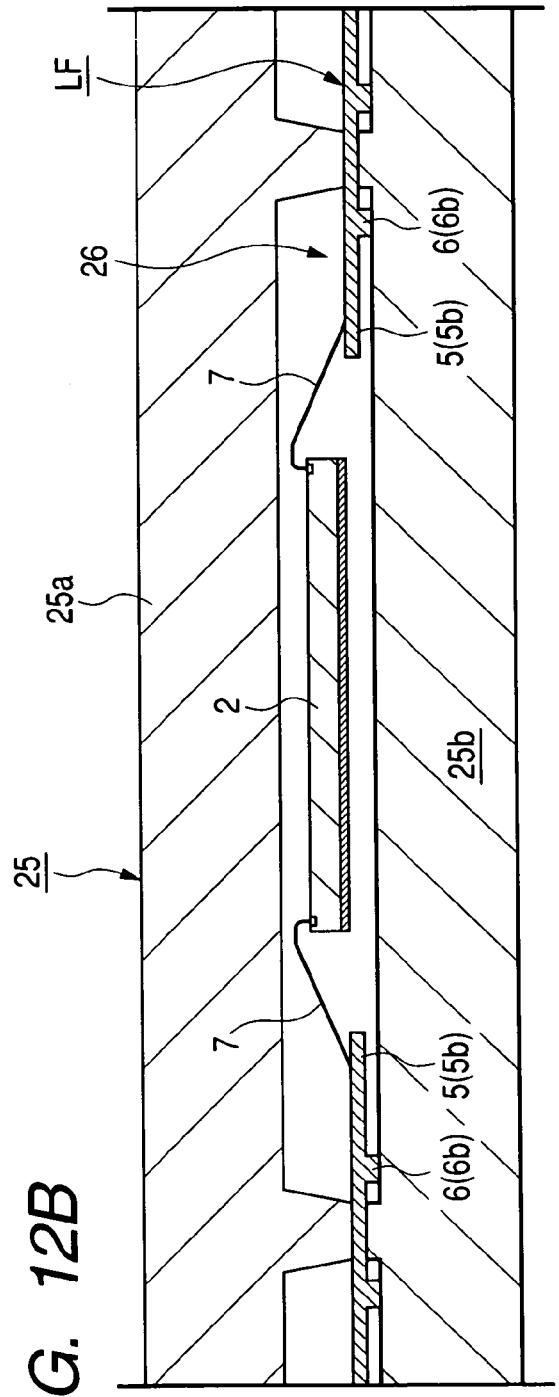

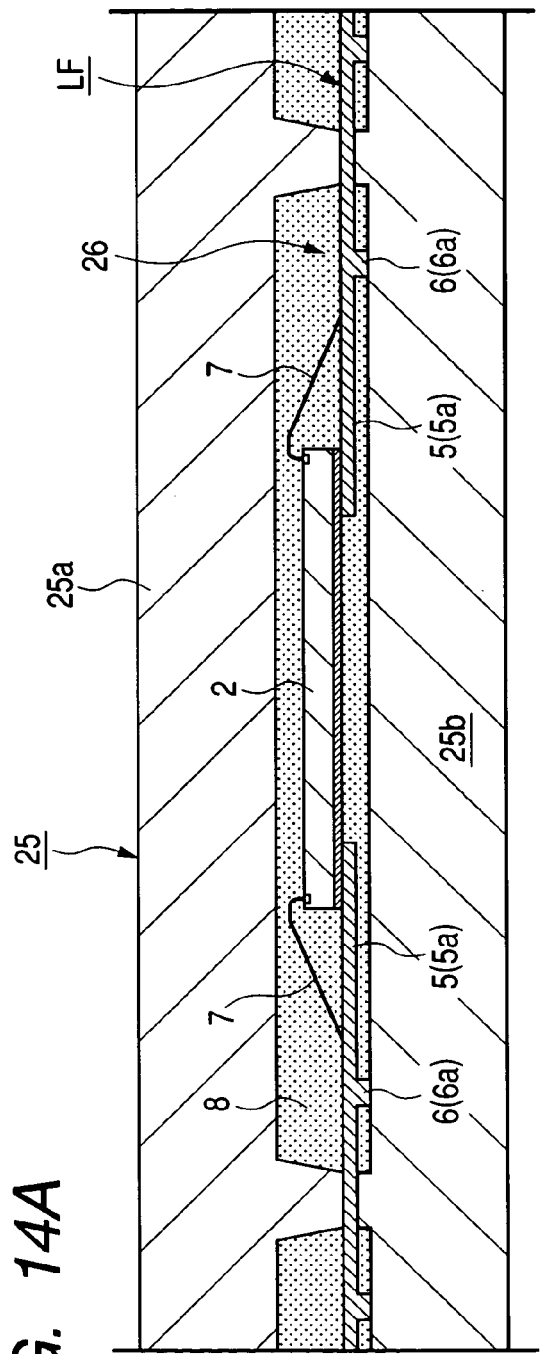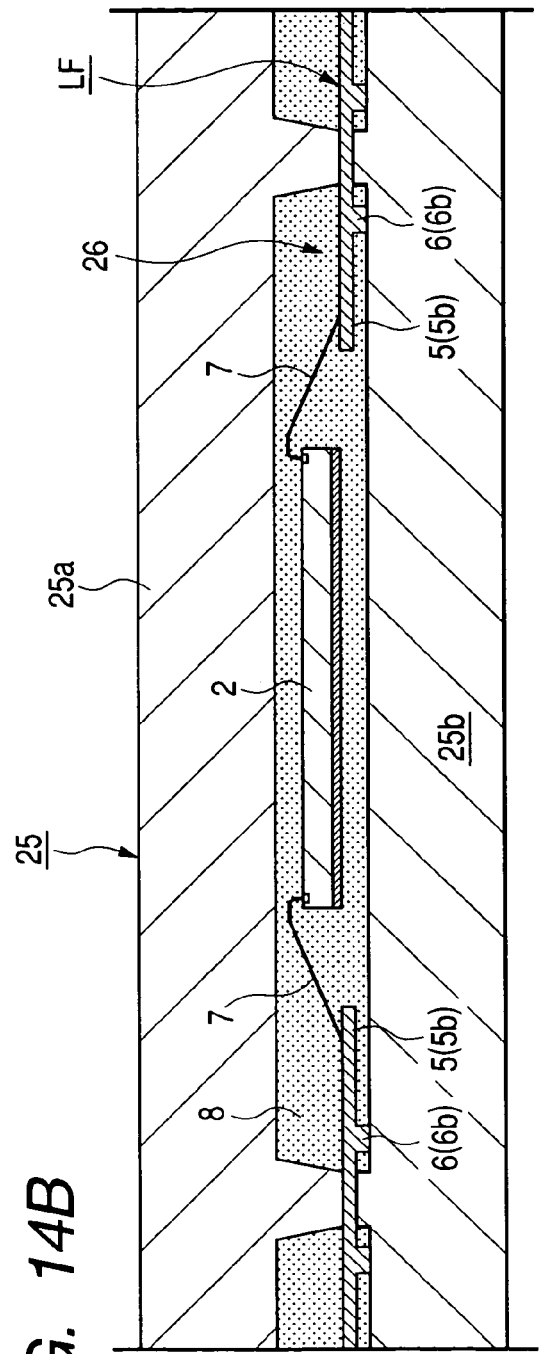

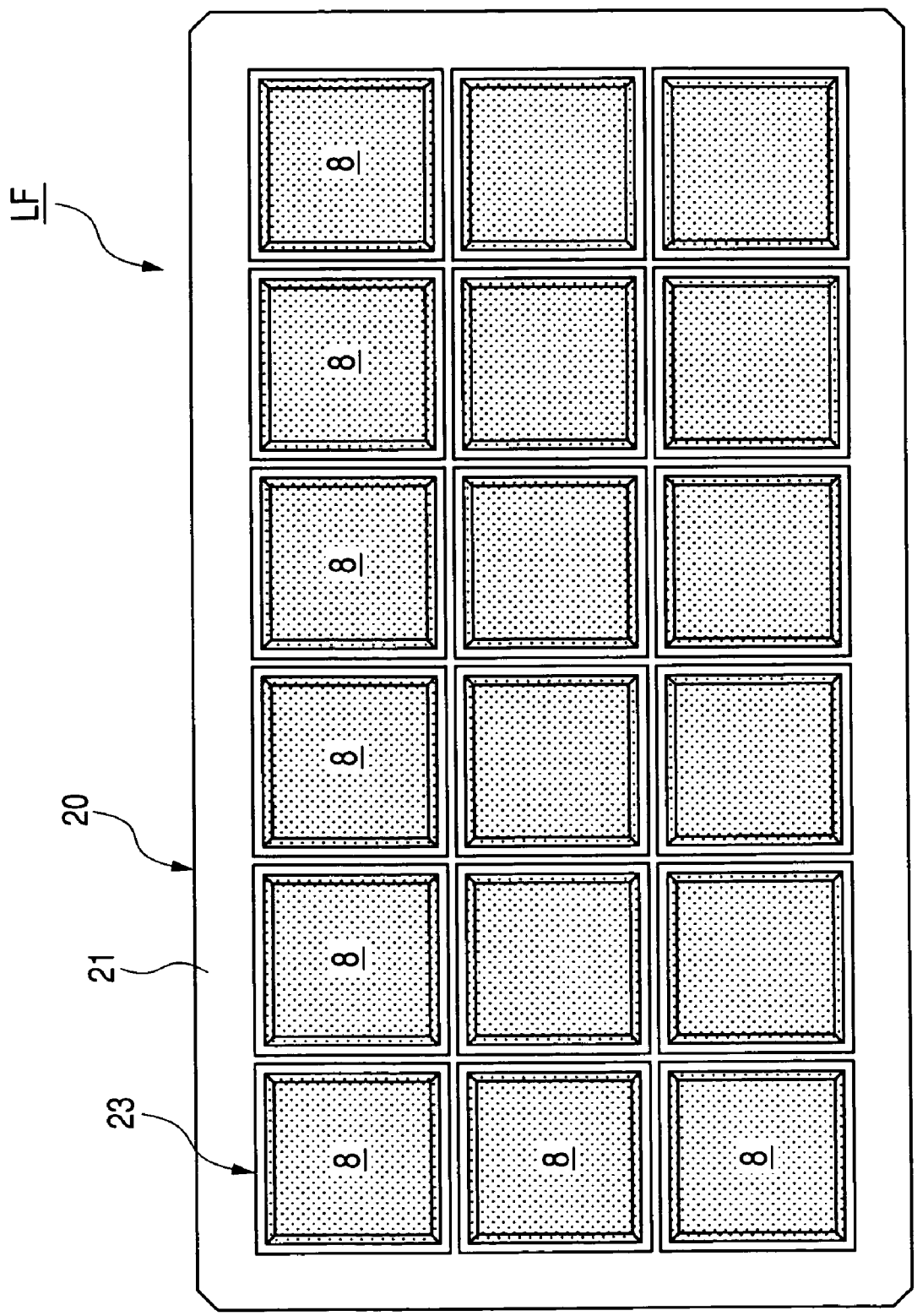

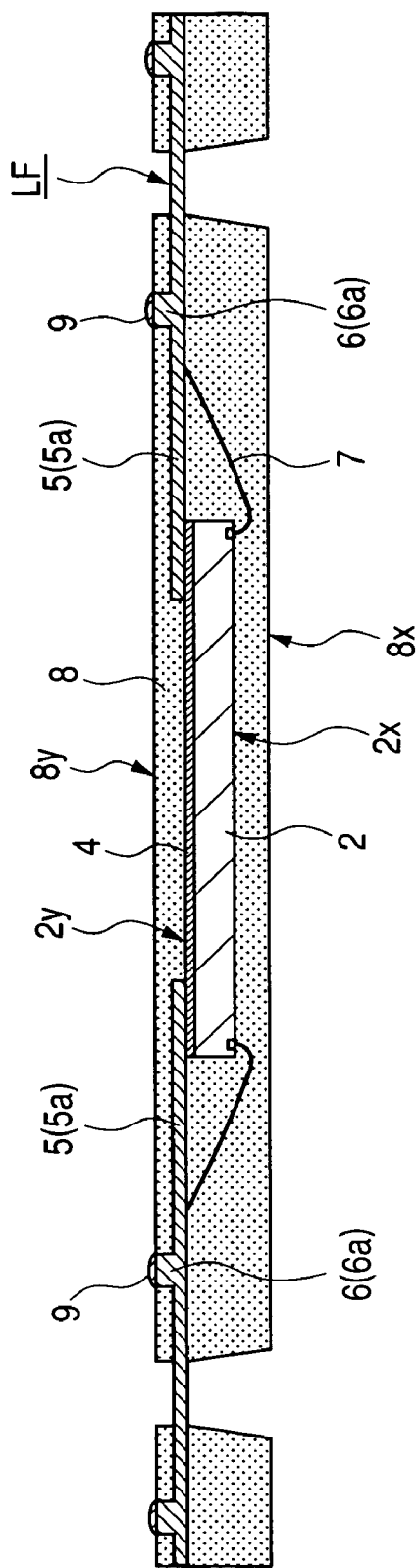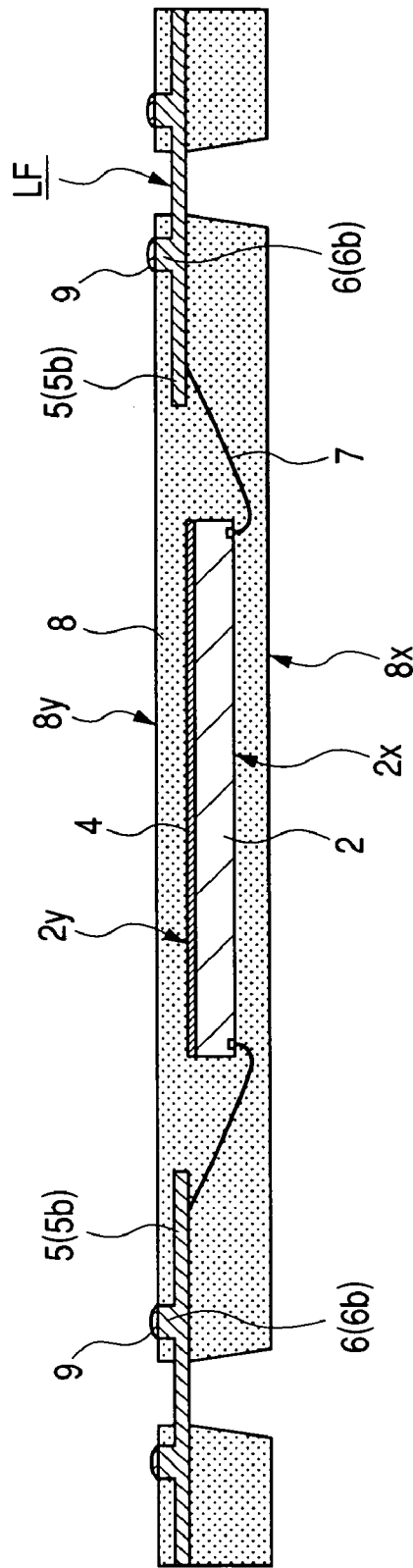

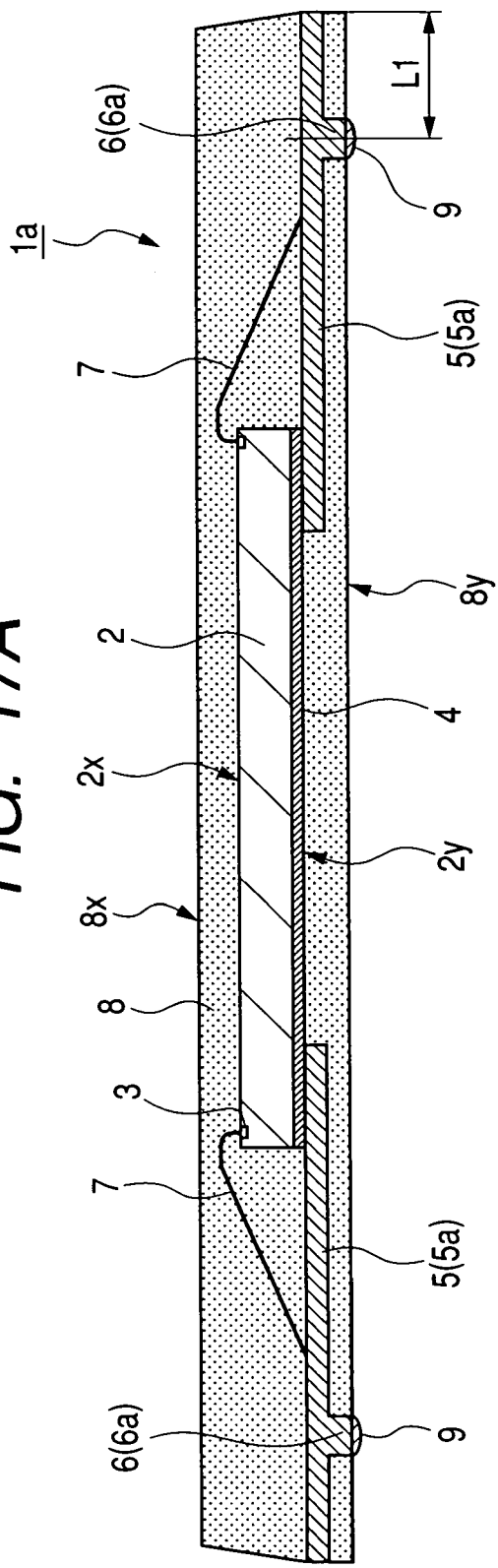
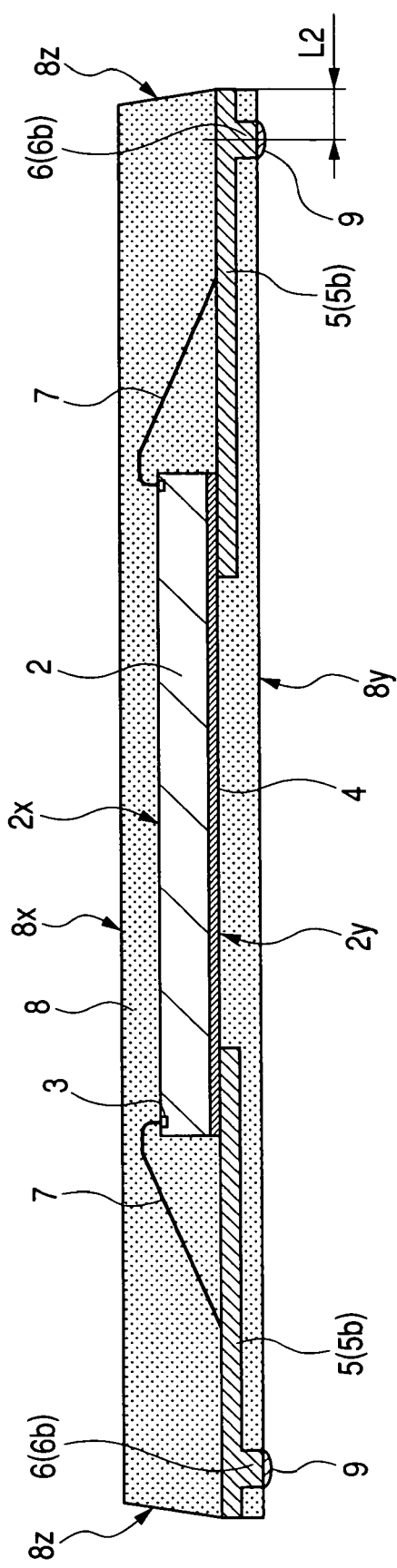

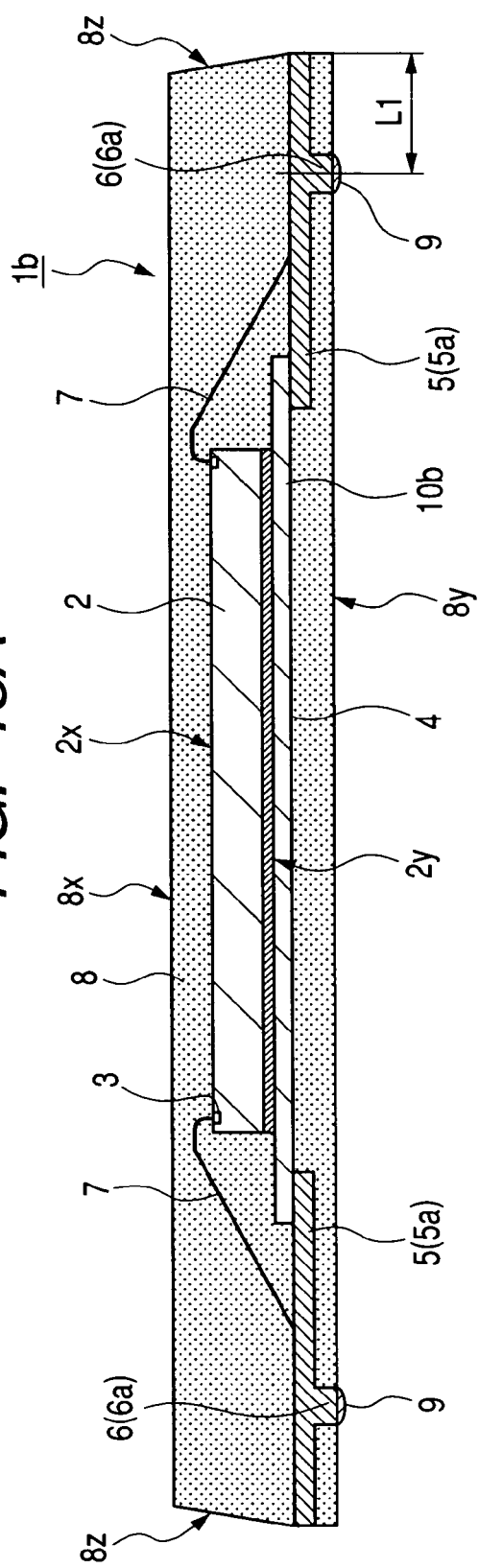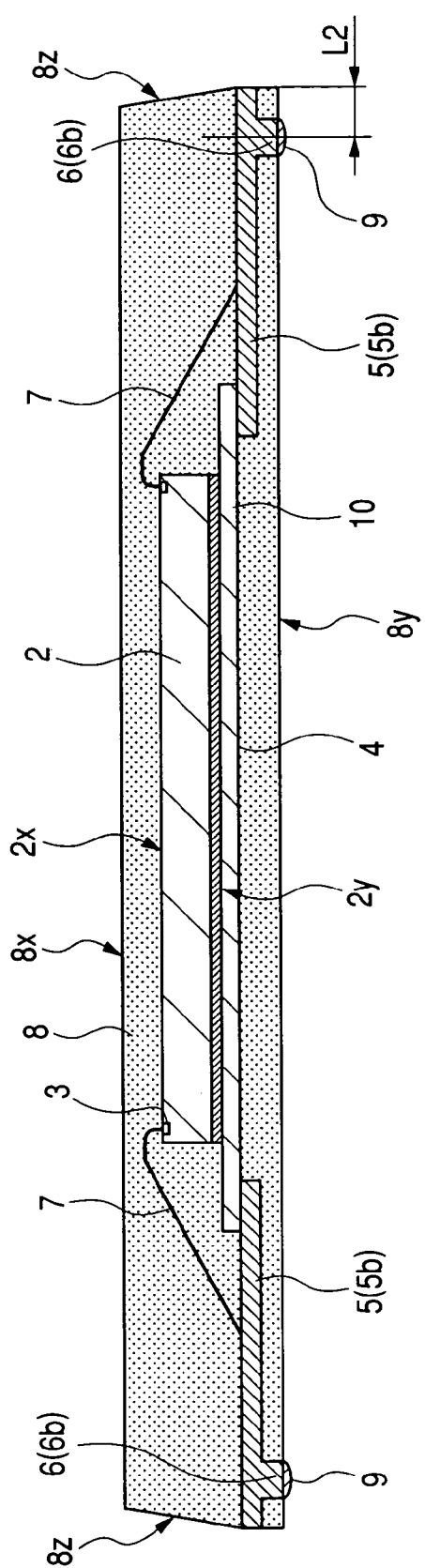

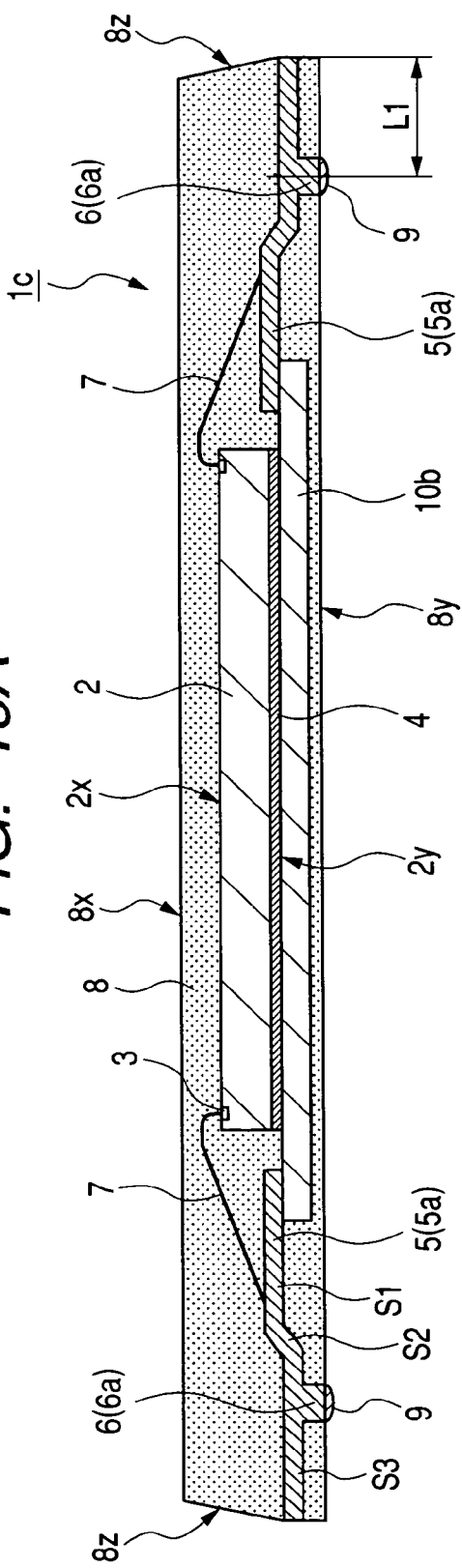
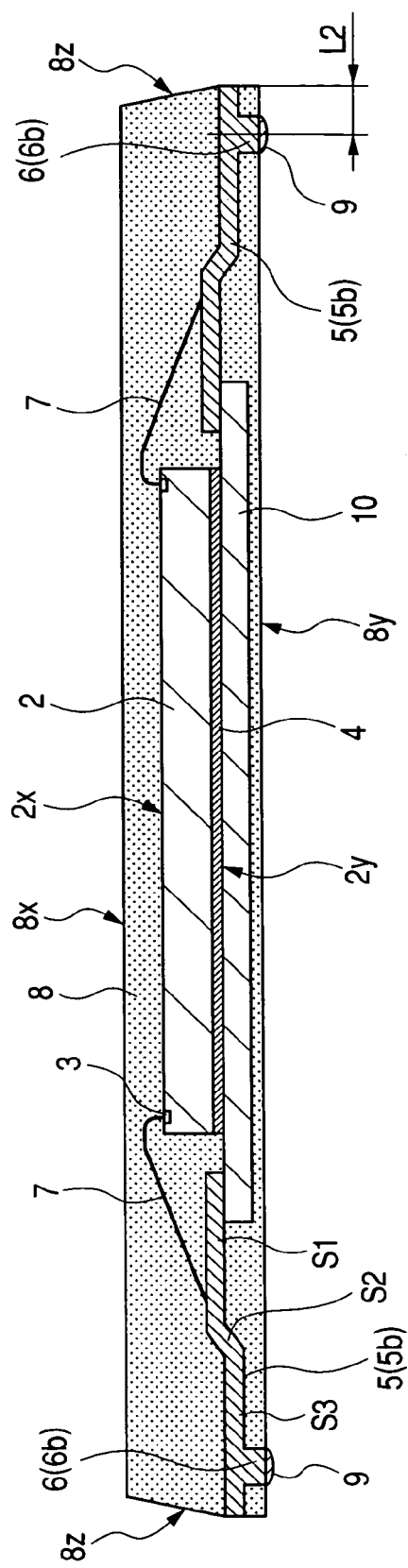
FIG. 19A
FIG. 19B

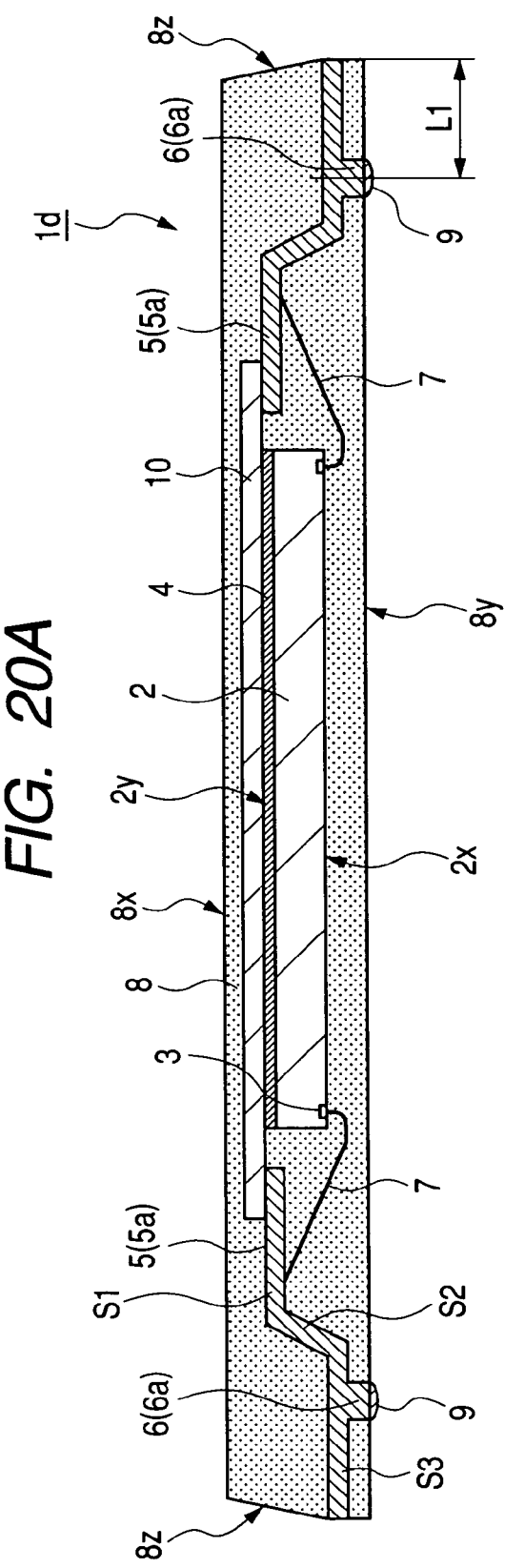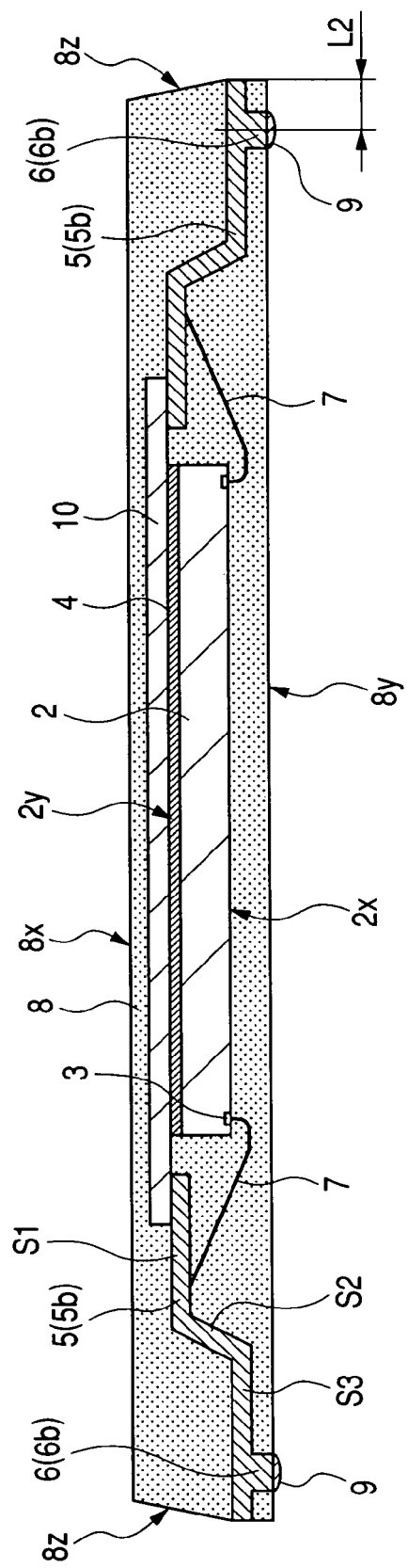

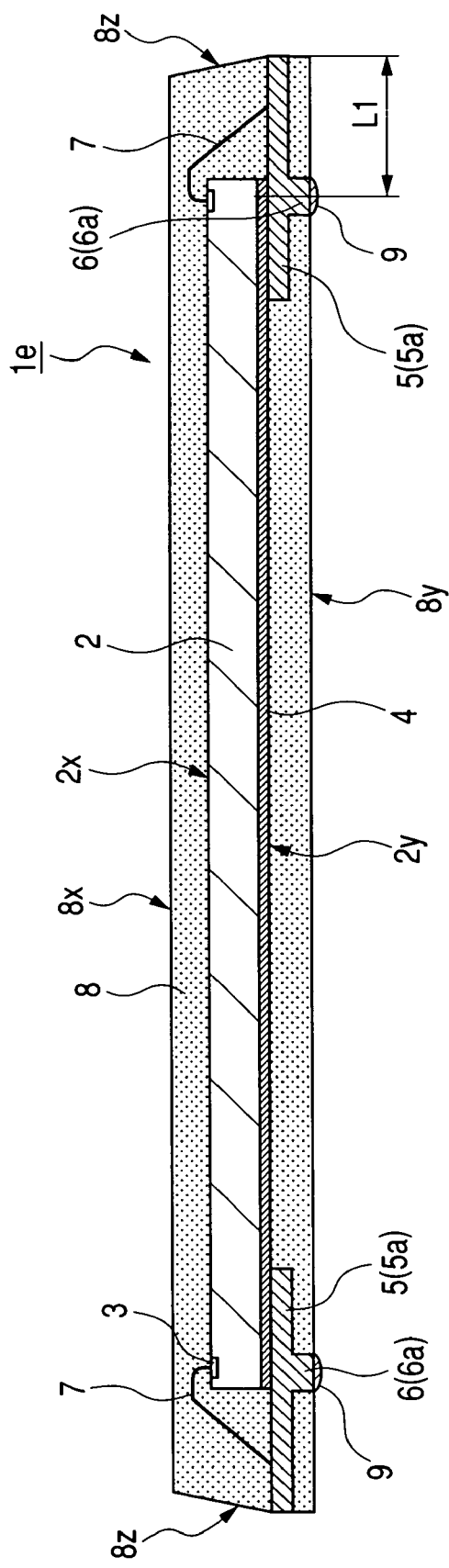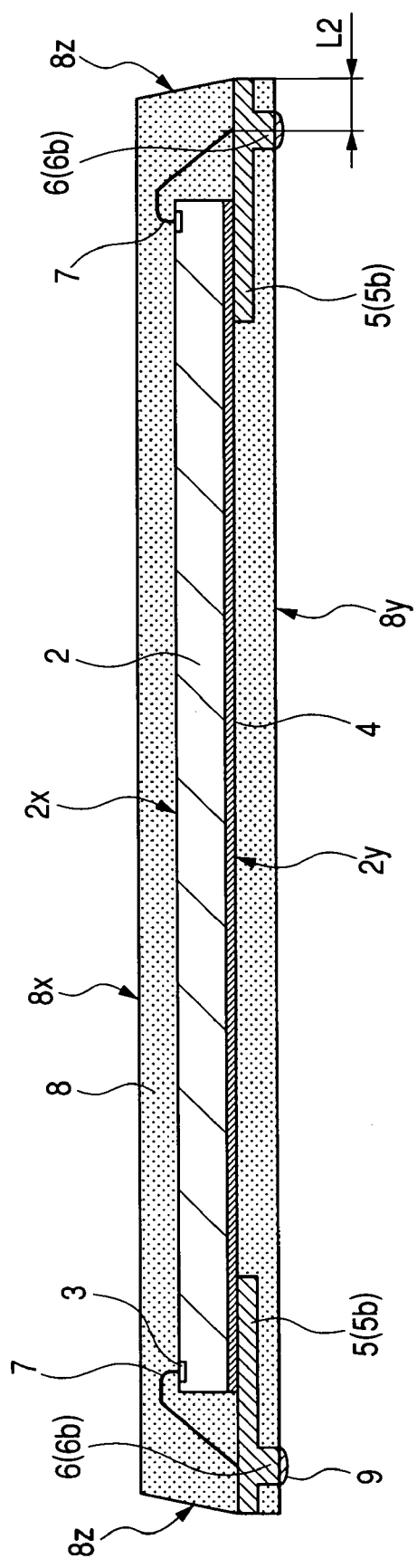

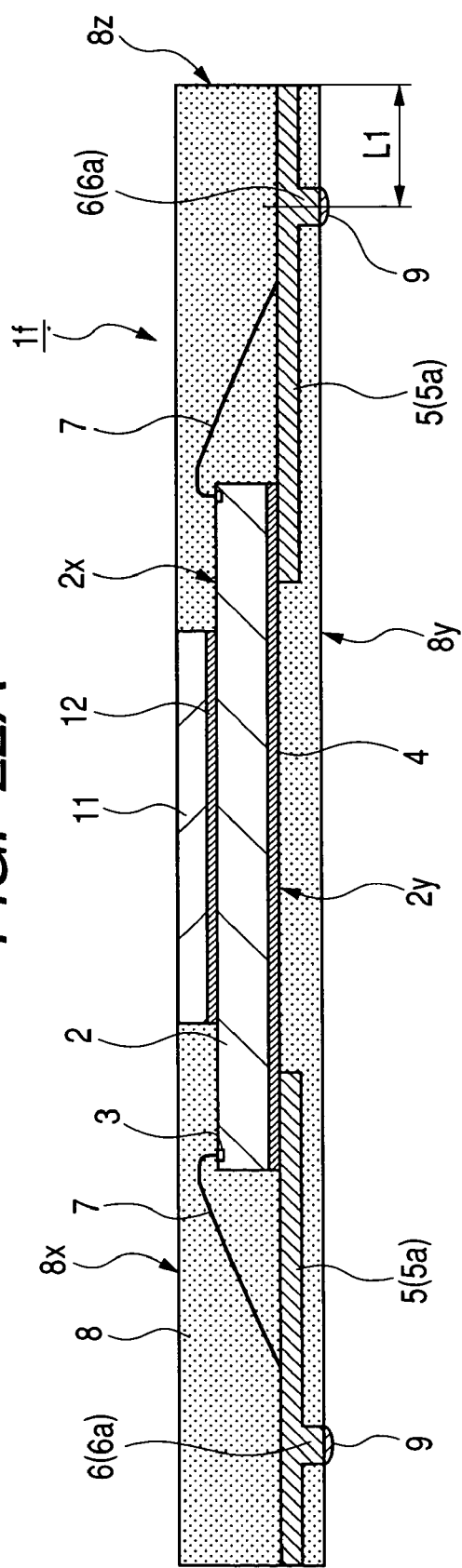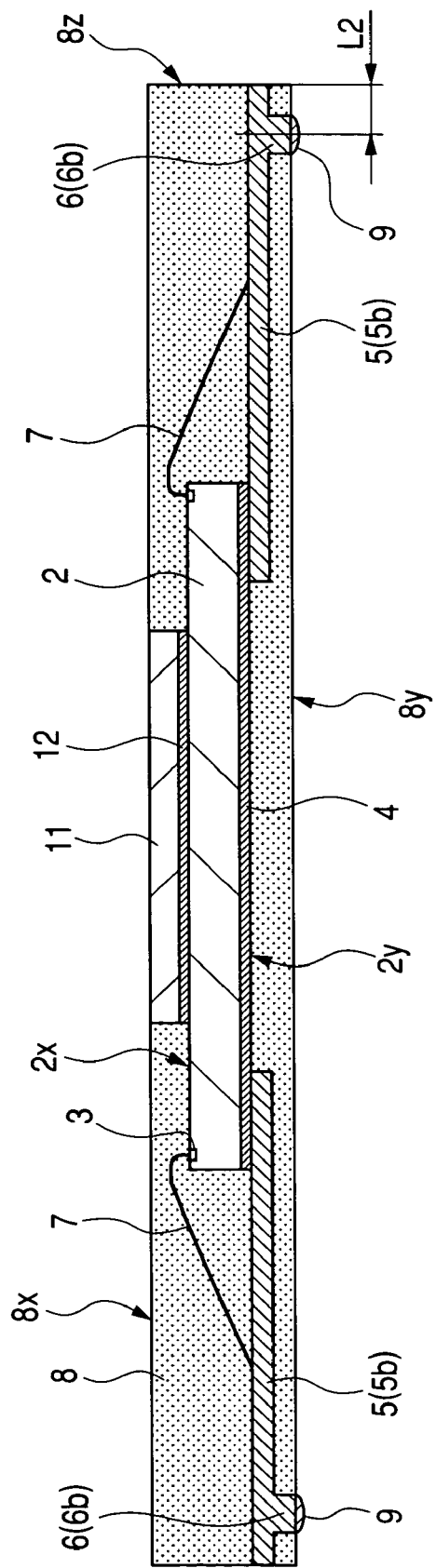

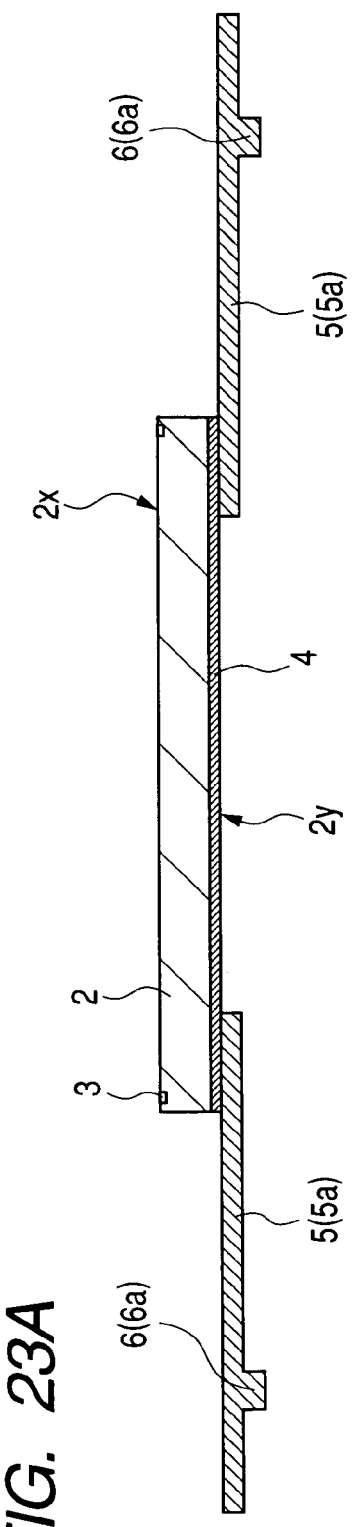
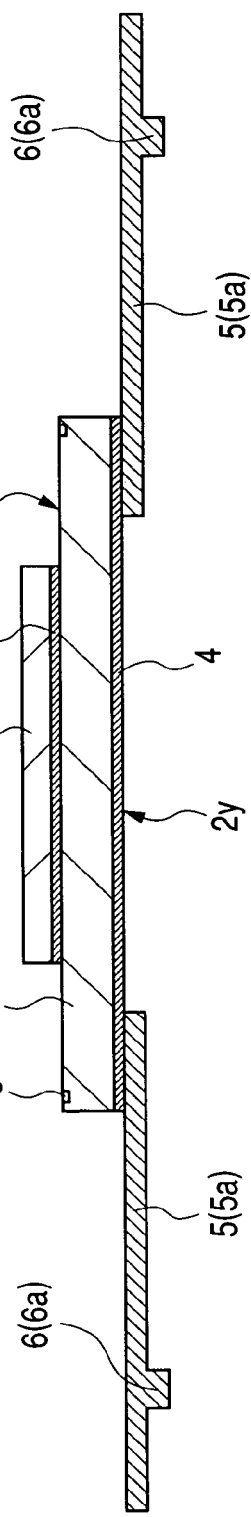
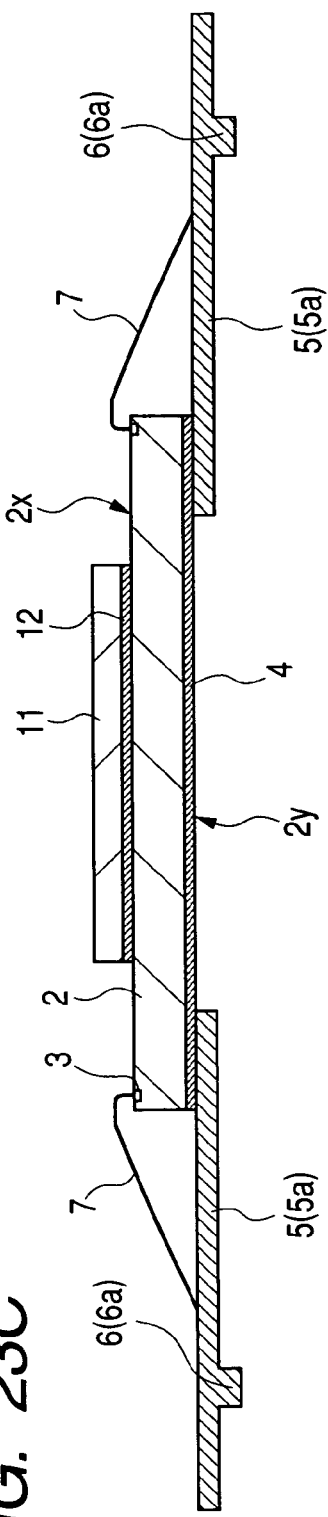

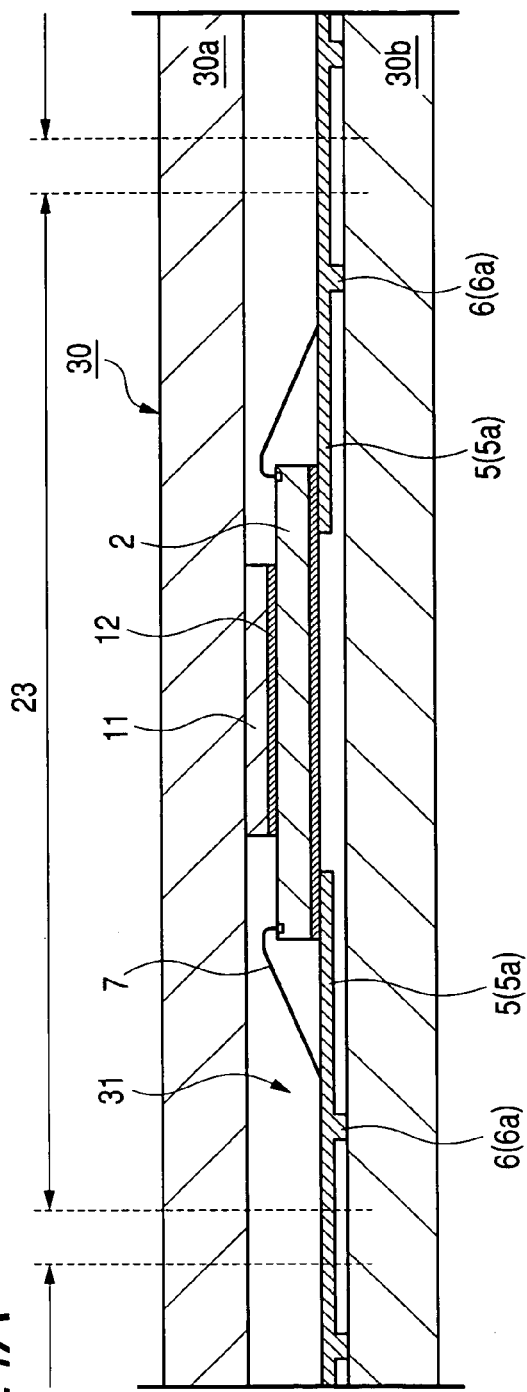
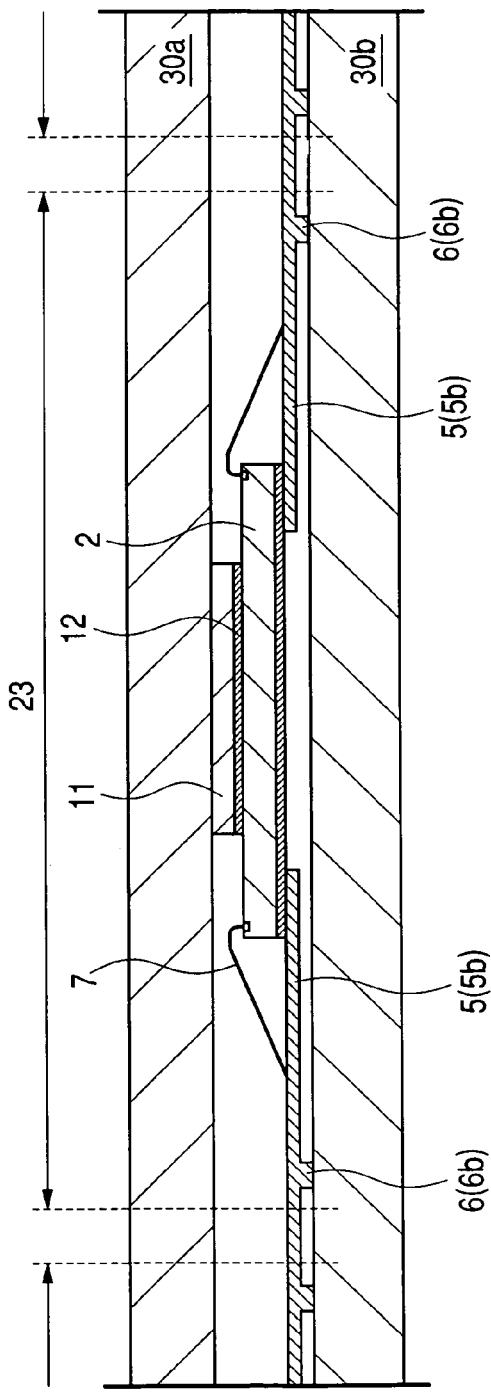
FIG. 24A
FIG. 24B

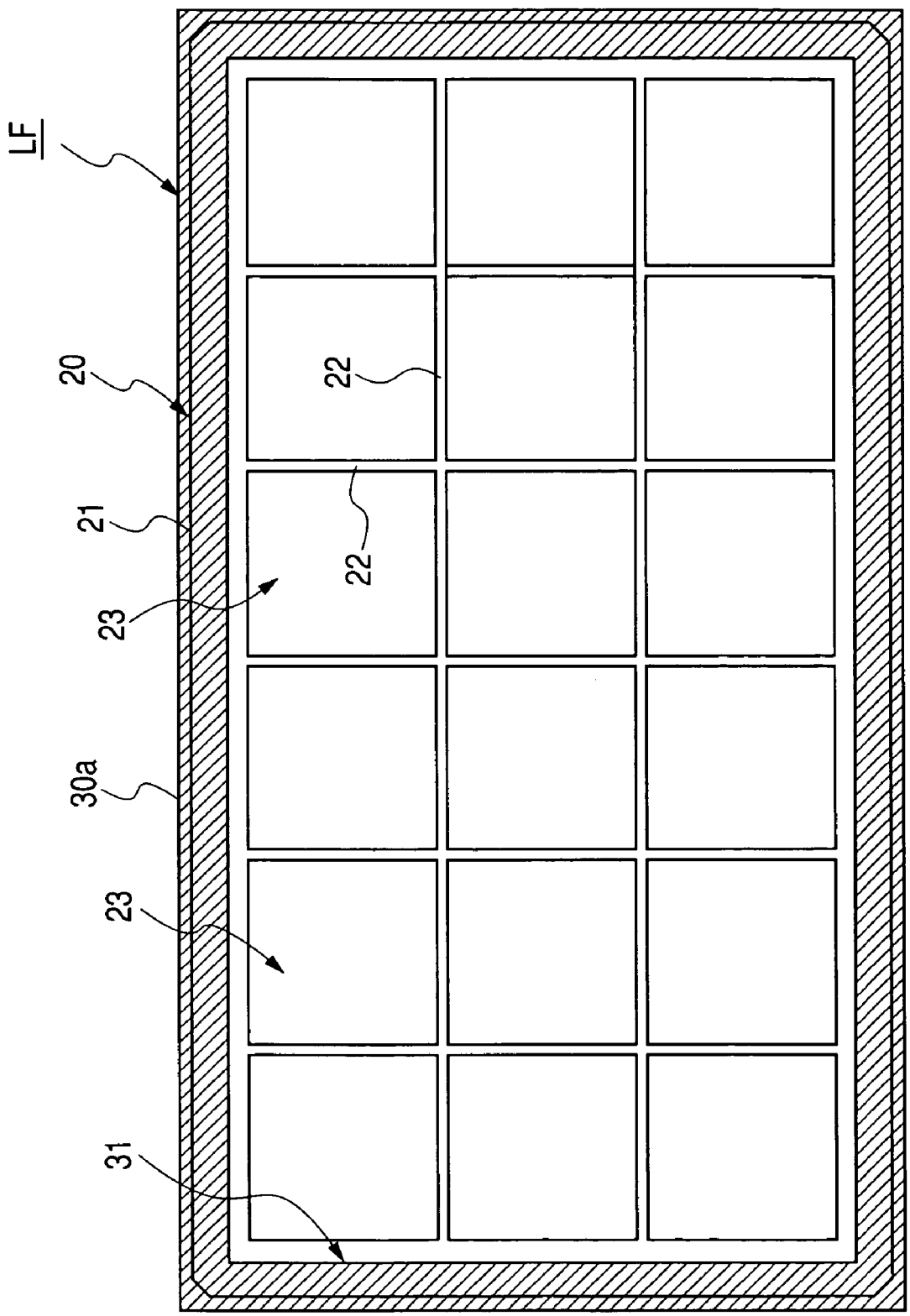

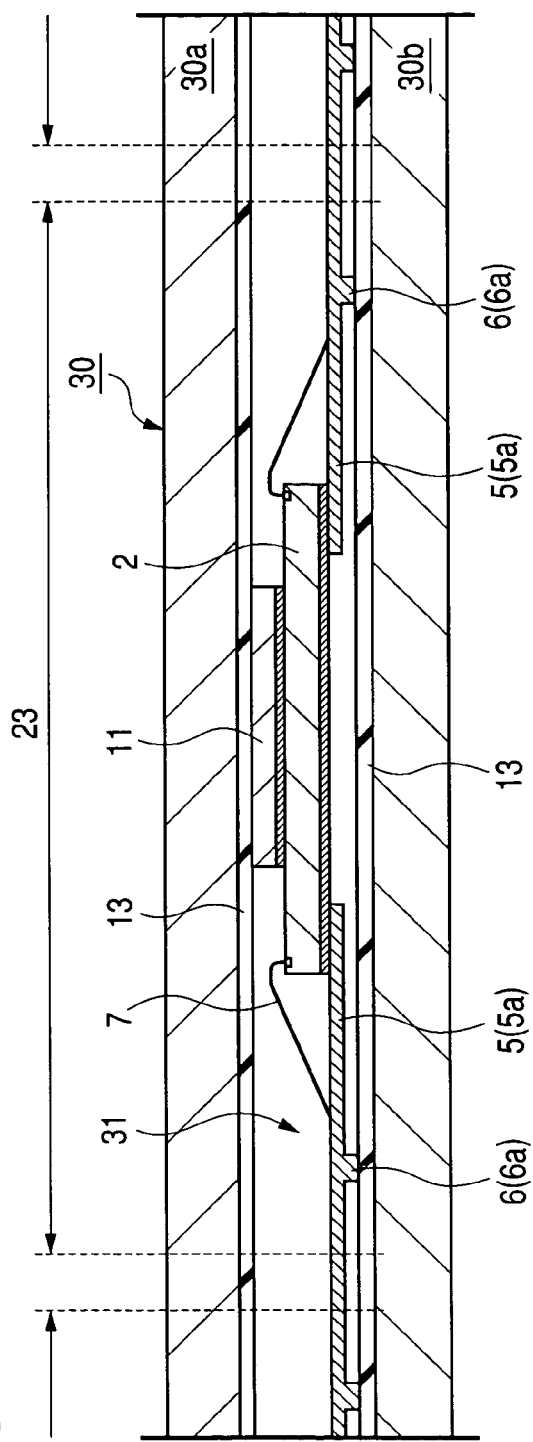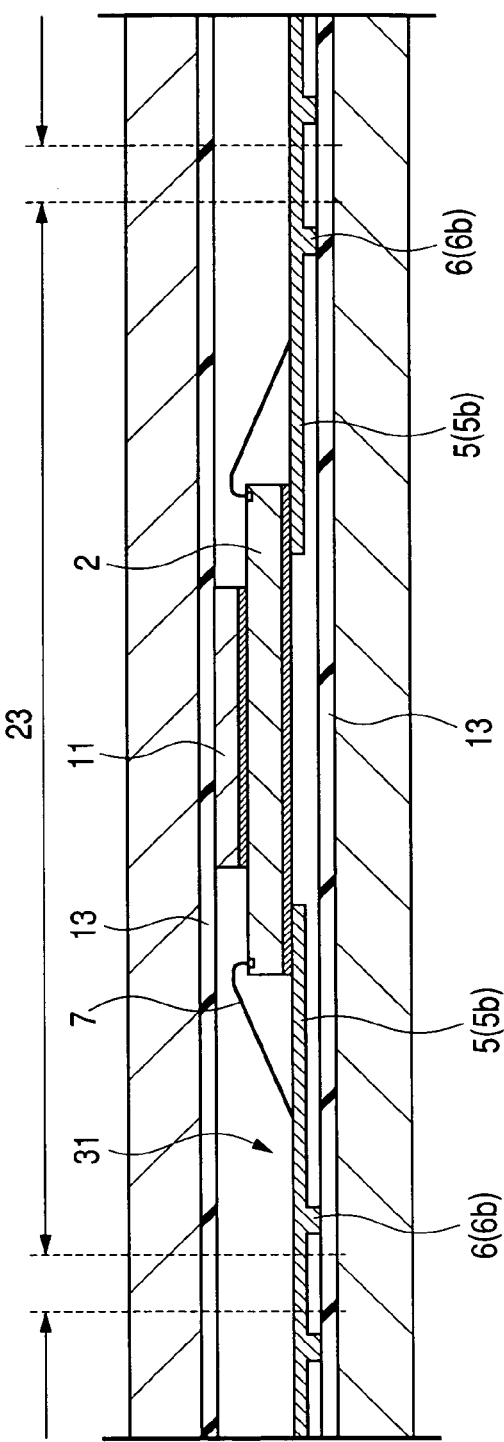

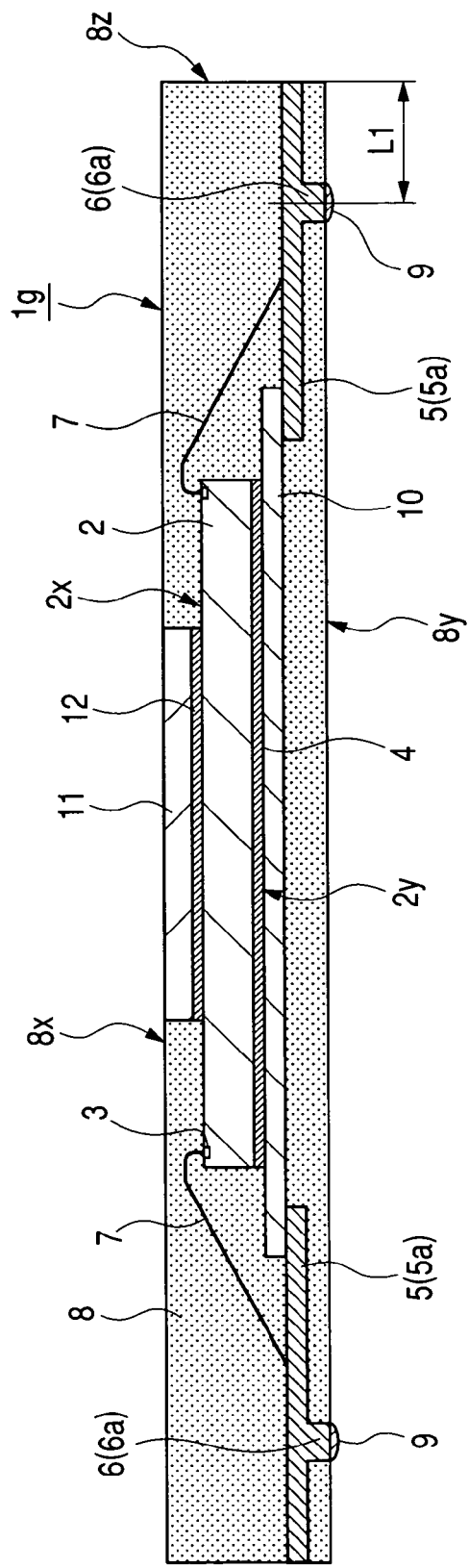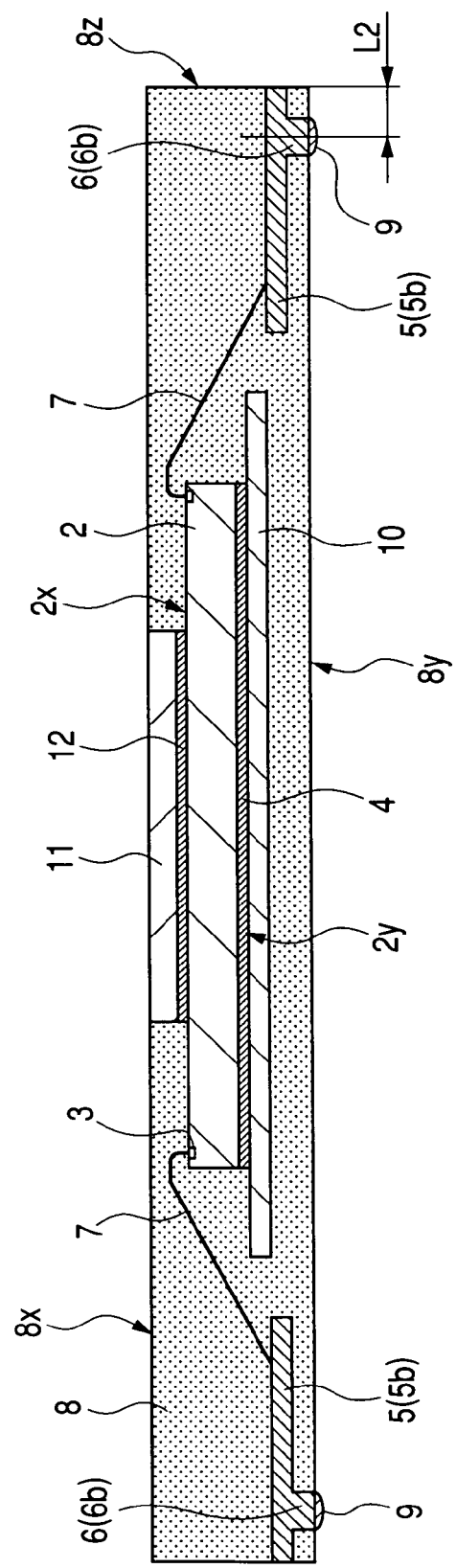

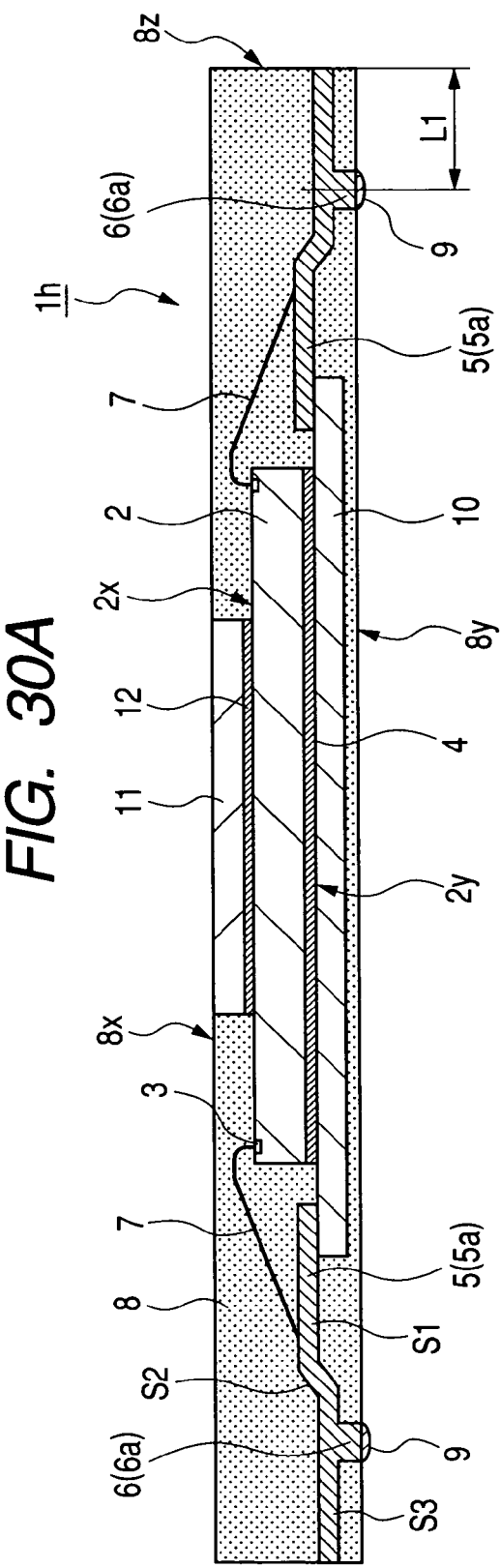
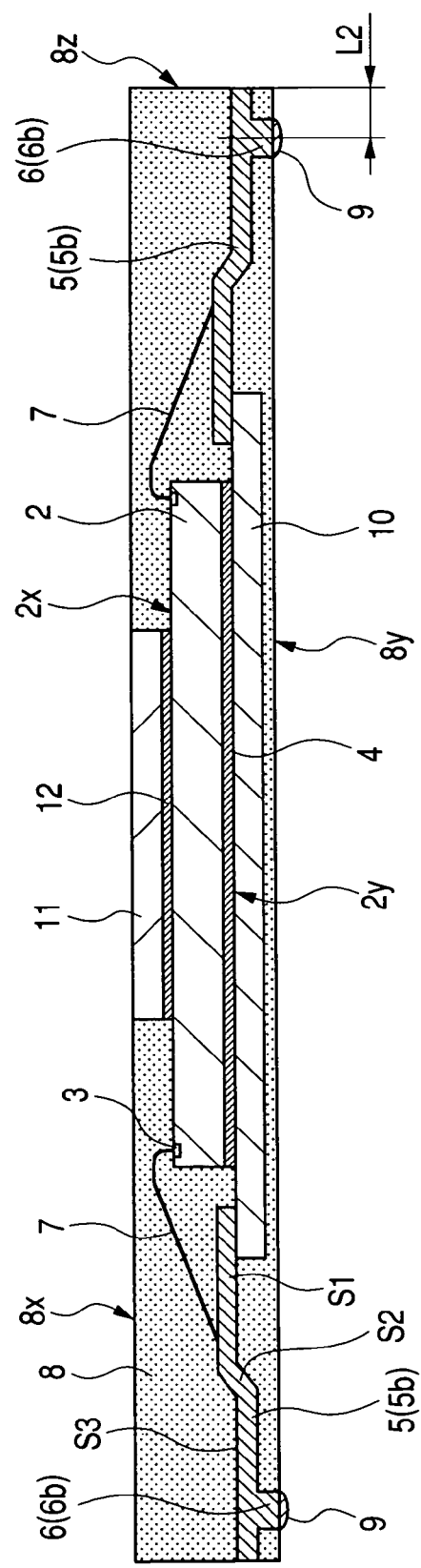

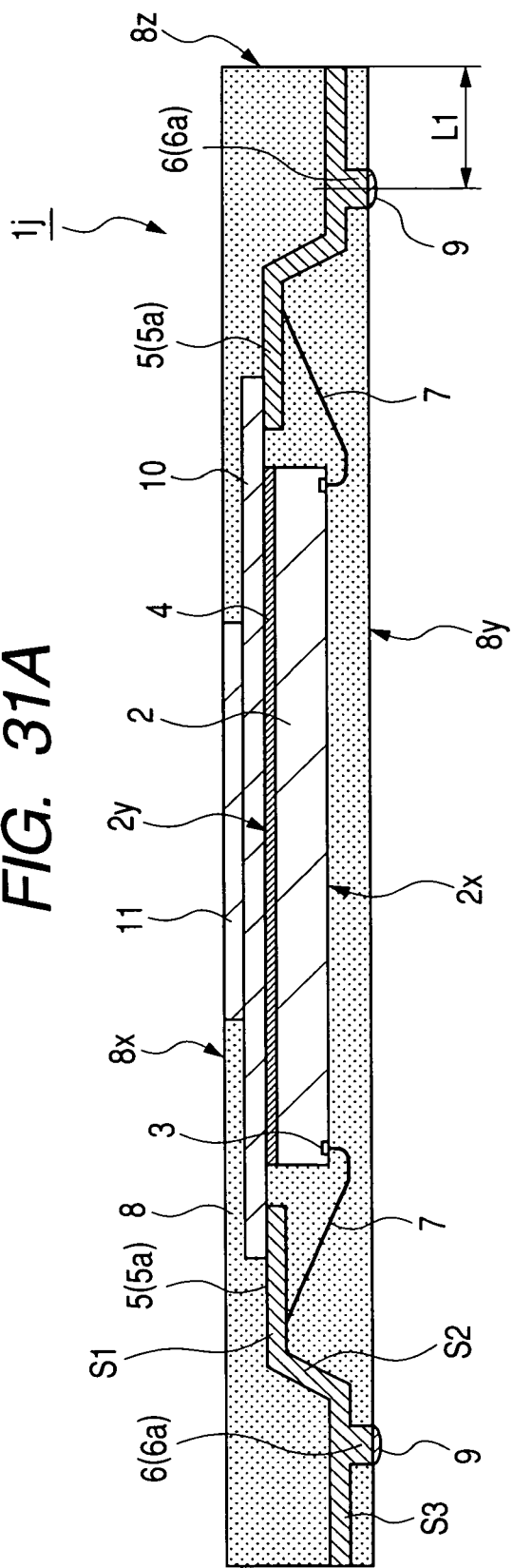
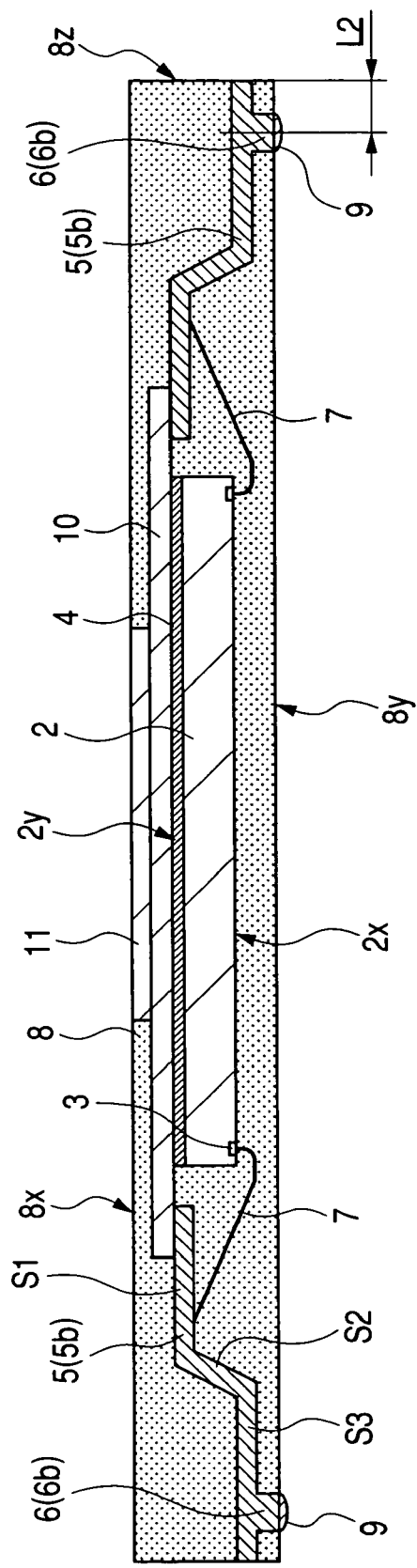

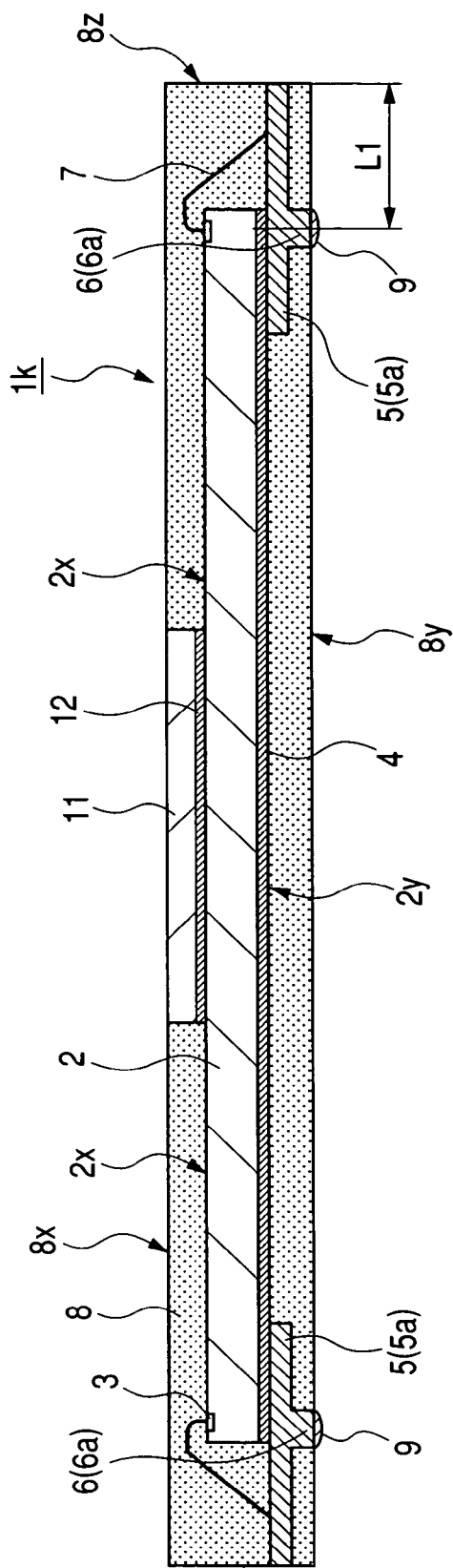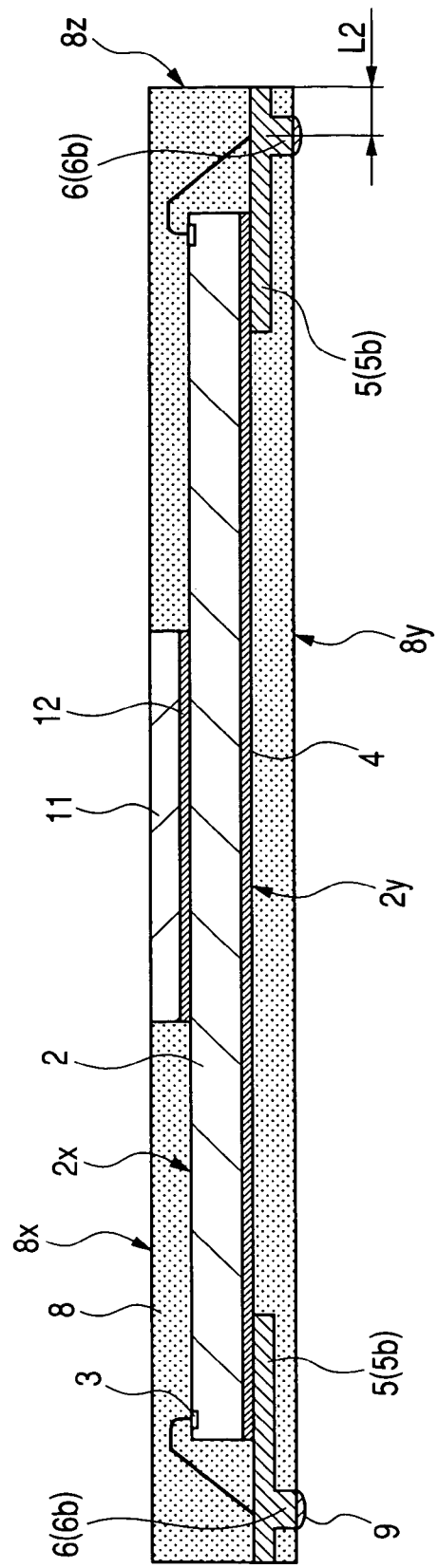

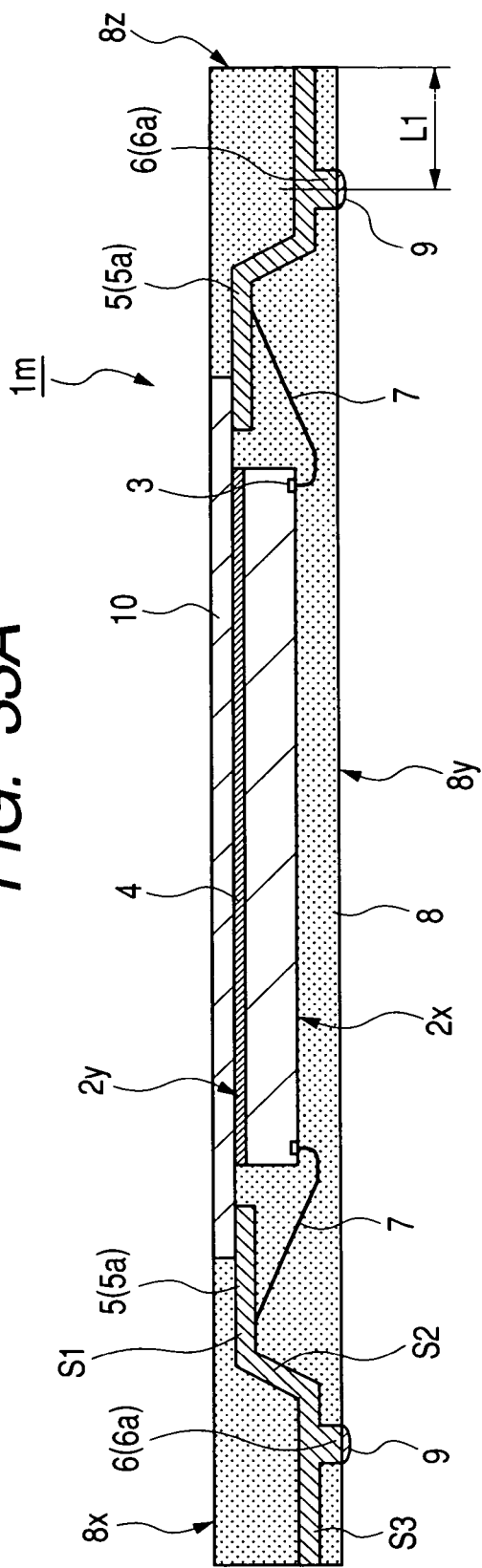
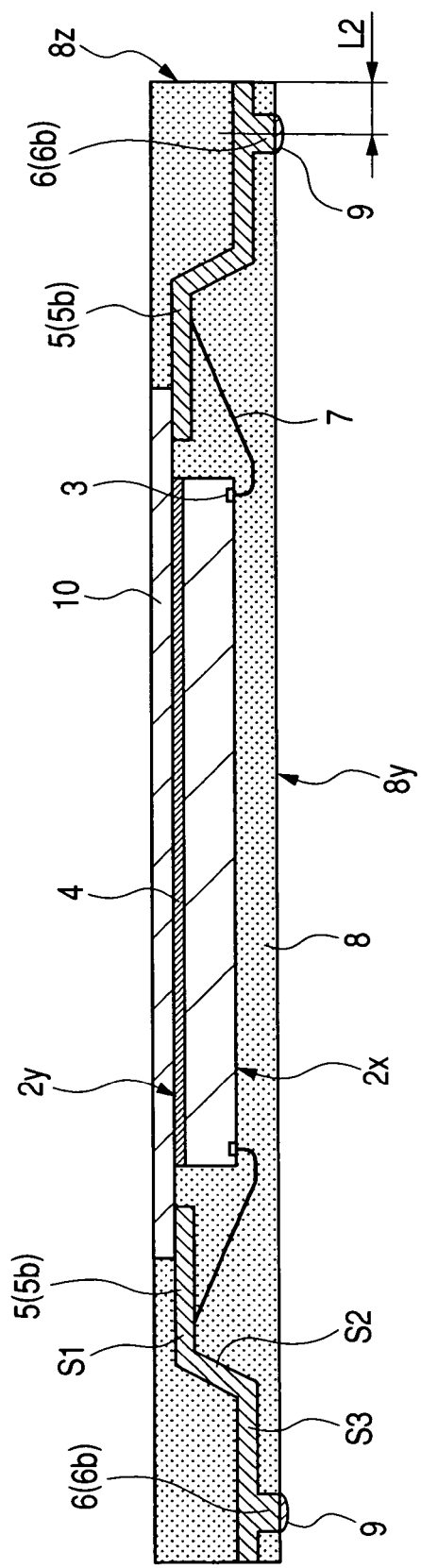
FIG. 33A
FIG. 33B

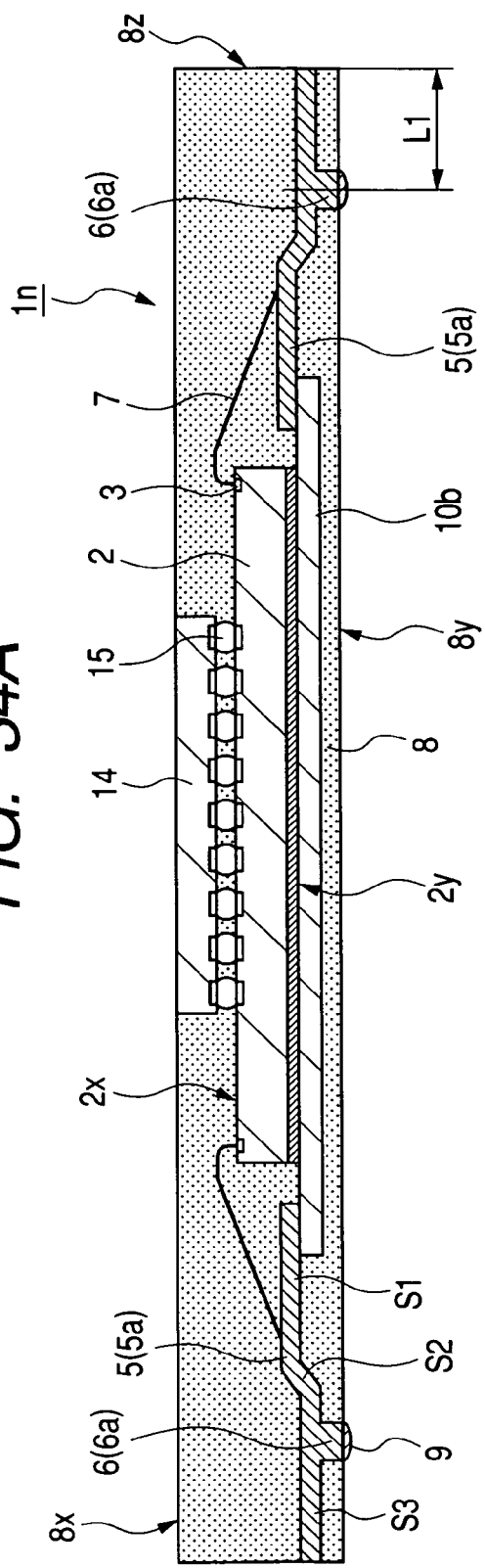
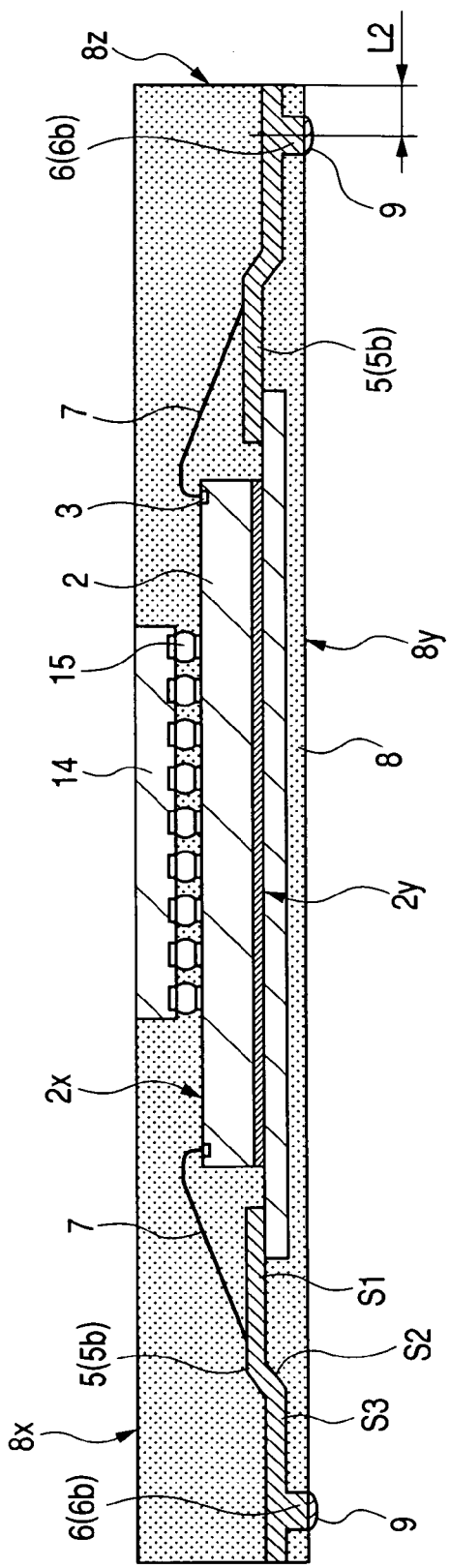

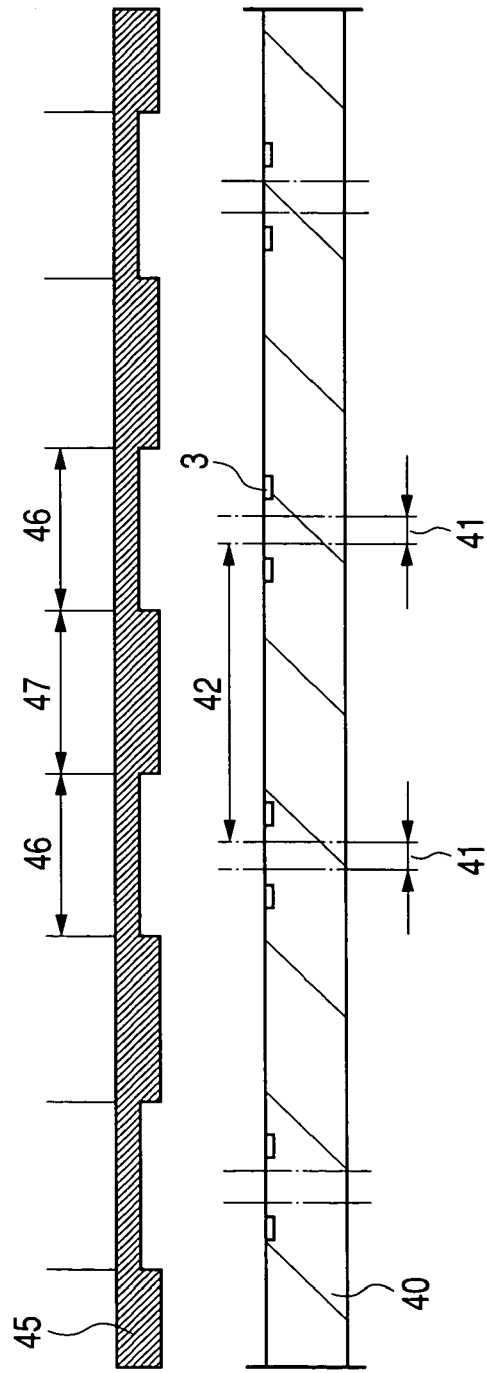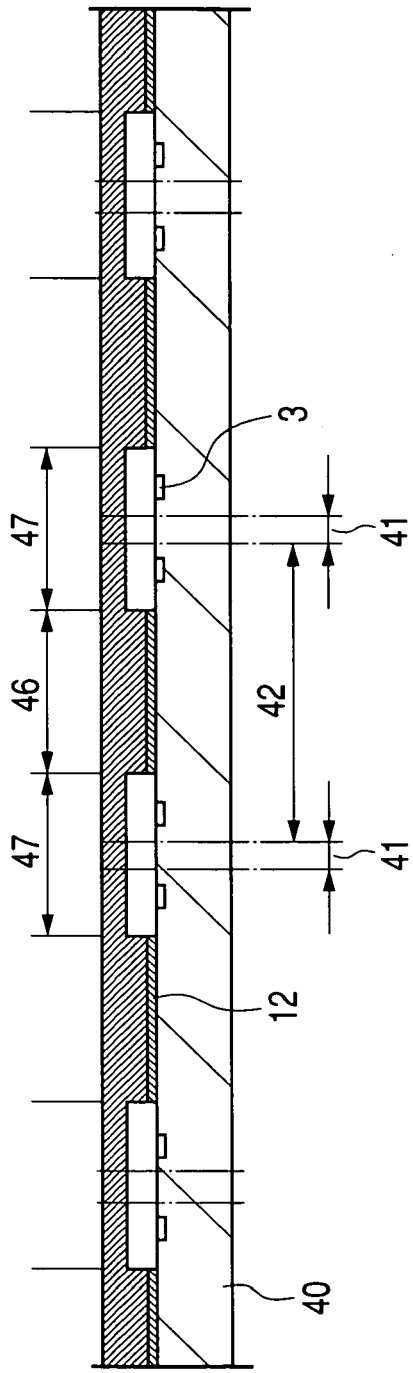

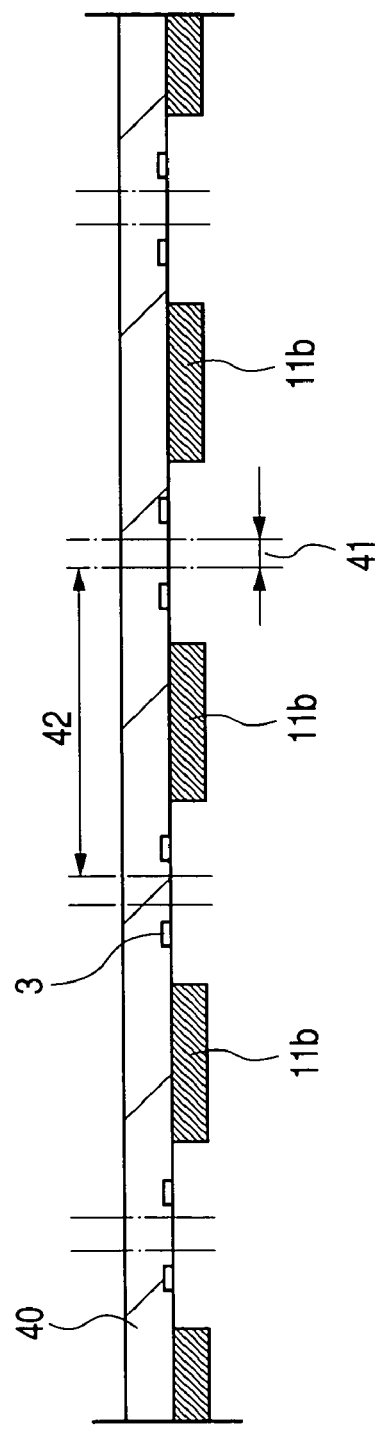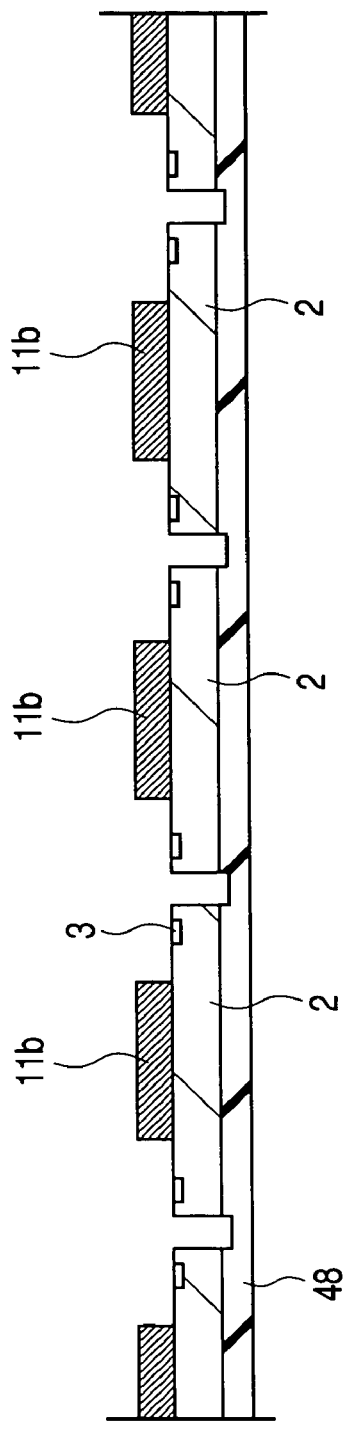

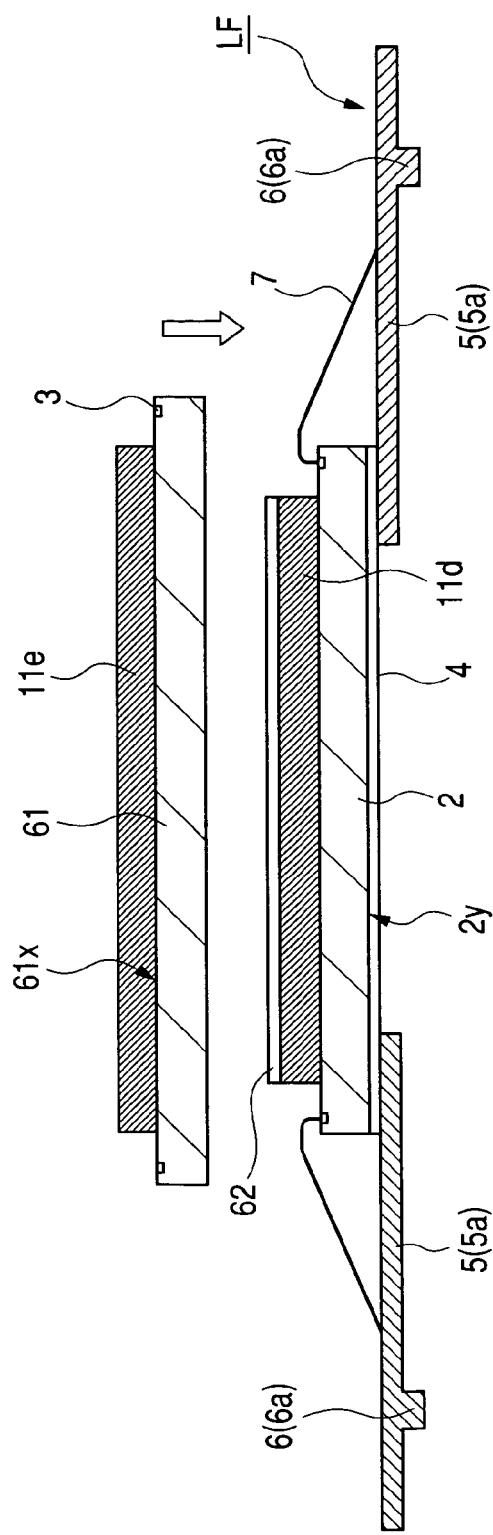
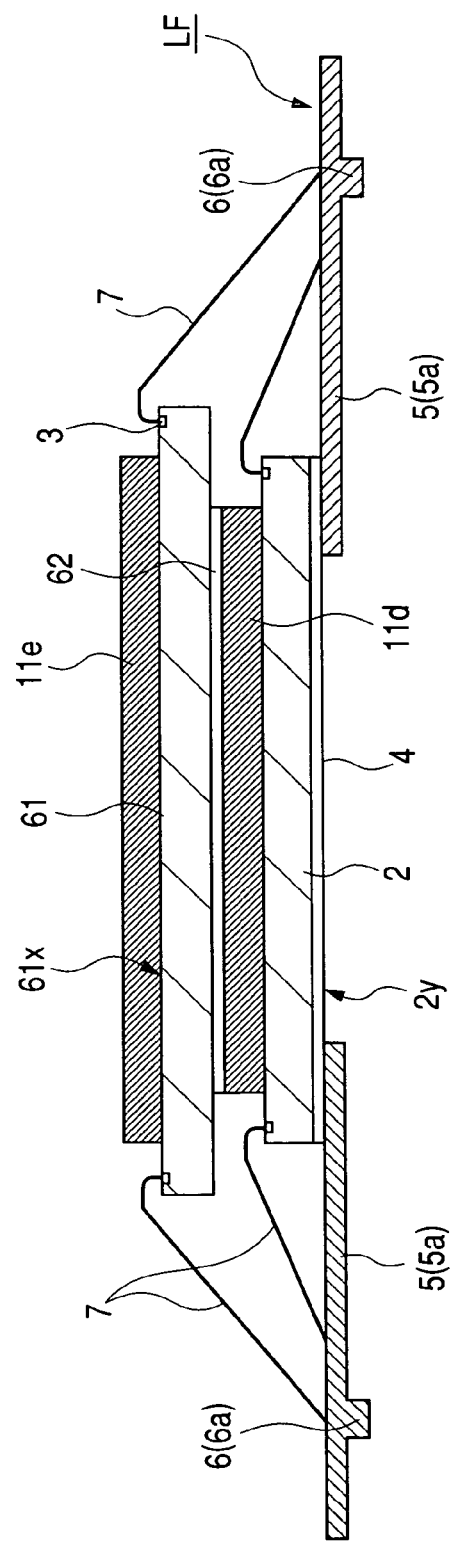

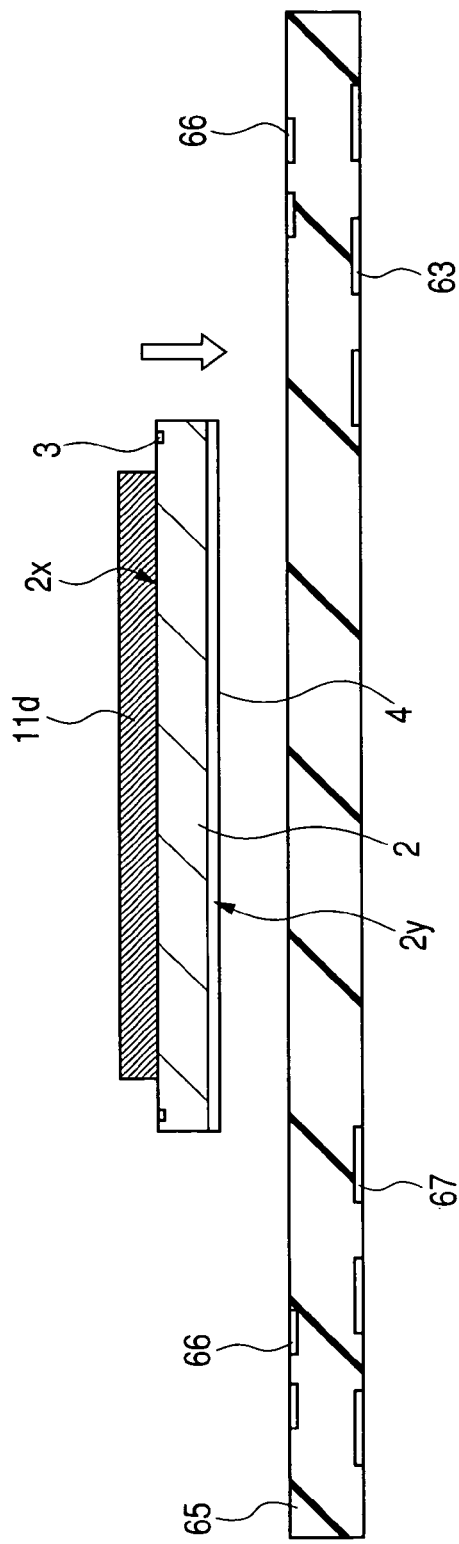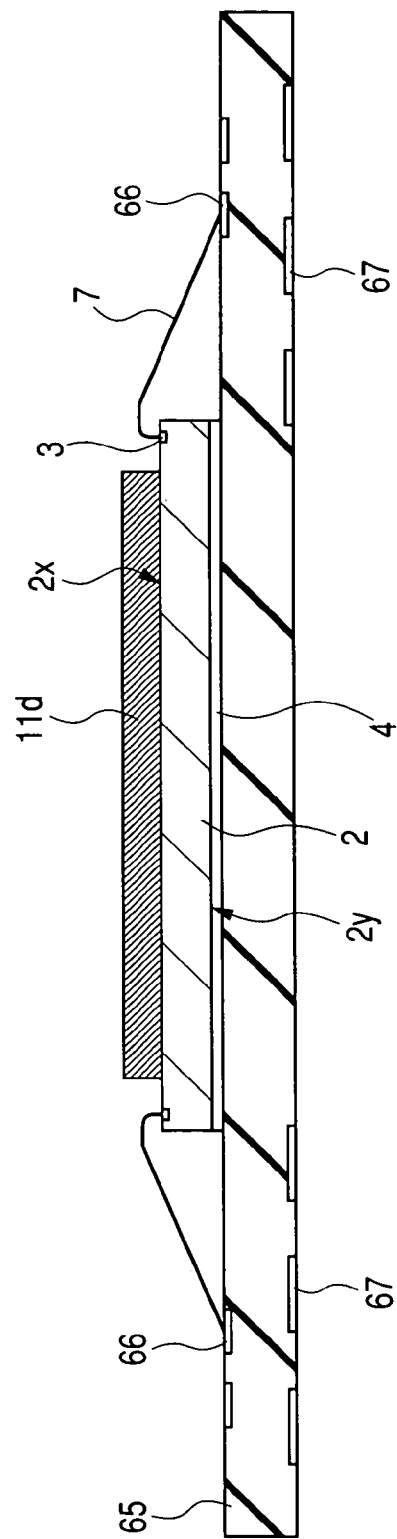

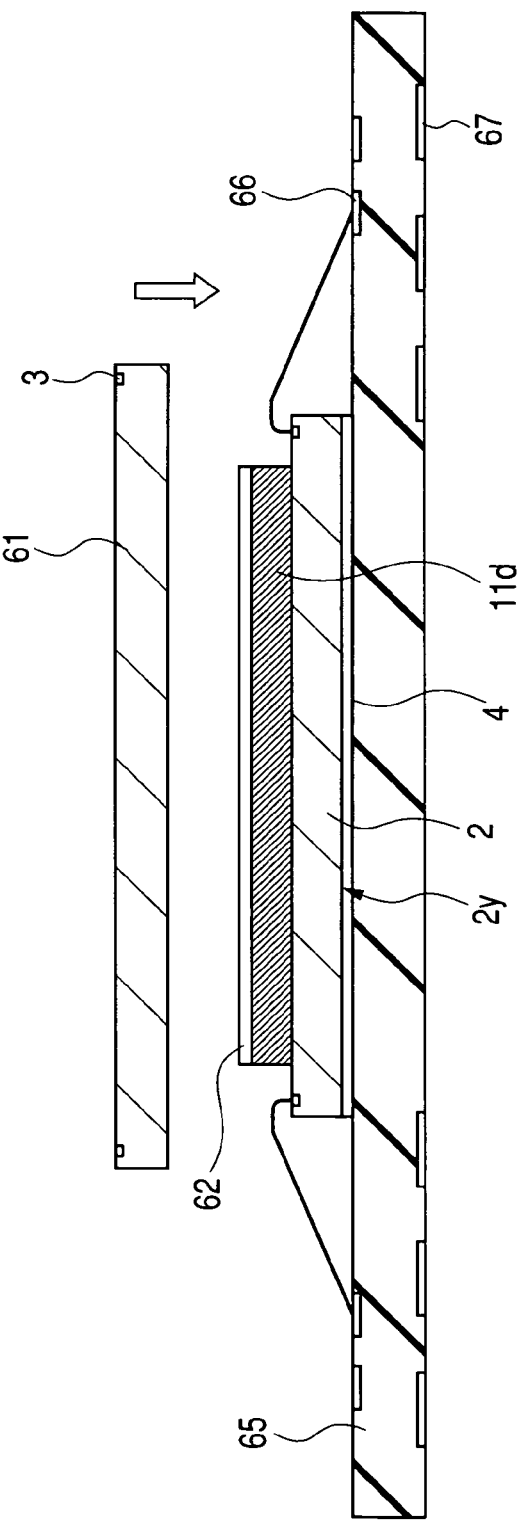
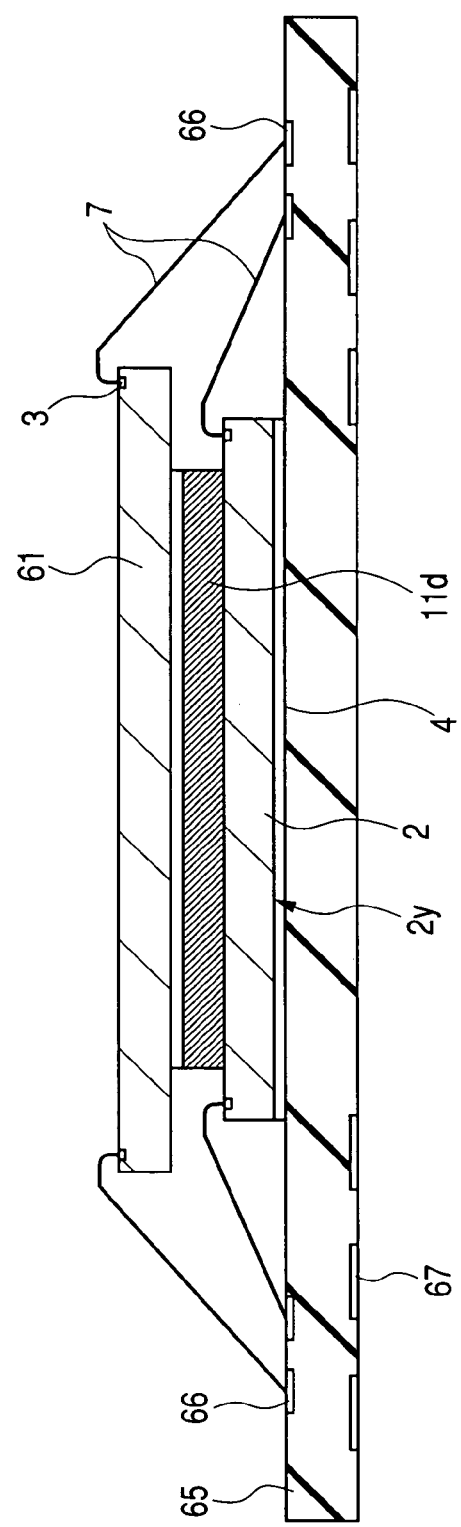

SEMICONDUCTOR DEVICE

CLAIM OF PRIORITY

The present application claims priority from Japanese patent application JP 2003-141911, filed on May 20, 2003, the contents of which is hereby incorporated by reference into this application.

BACKGROUND OF THE INVENTION

The present invention relates to a semiconductor device. Particularly, the present invention is concerned with a technique that is applicable to a semiconductor device having external terminals formed by exposing leads partially from a back surface (a component side) of a resin sealing member.

As to semiconductor devices wherein a semiconductor chip with an integrated circuit formed thereon is sealed with resin, those of various package structures have been proposed and produced on a commercial basis. As one example, there is a semiconductor device called a QFN (Quad Flat-pack Non-Leaded Package) type. This QFN type semiconductor device has a package structure wherein leads connected electrically to electrodes on a semiconductor chip are exposed as external terminals from a back surface of a resin sealing member. Therefore, the plane size of the semiconductor device can be reduced in comparison with, for example, a semiconductor device called a QFP (Quad Flat-pack Package) type having a package structure wherein leads connected electrically to electrodes on a semiconductor chip are projected from side faces of a resin sealing member and are bent in a predetermined shape.

In the manufacture of a QFN type semiconductor device, a lead frame is used. The lead frame is fabricated by punching a metallic sheet with a precision press or by etching a metallic sheet to form predetermined patterns. The lead frame has plural product-forming areas partitioned by a frame body, which includes an outer frame and inner frames. In each product-forming area, there are a chip mounting portion (tab, die pad) for mounting a semiconductor chip thereon and plural leads having front end portions (end portions on one side) facing around the chip mounting portion. The chip mounting portion is supported by suspension leads extending from the frame body of the lead frame. End portions (front end portions) on one side and opposite end portions of the leads are supported by the frame body of the lead frame.

In the manufacture of a QFN type semiconductor device with use of such a lead frame, a semiconductor chip is fixed to the chip mounting portion of the lead frame, then electrodes on the semiconductor chip and the leads are electrically connected together through electrically conductive wires; and, thereafter, the semiconductor chip, wires, support member, and suspension leads are sealed with resin to form a resin sealing member, and, subsequently, unnecessary portions of the lead frame are cut off.

The resin sealing member in the QFN type semiconductor device is formed in the following manner by a transfer molding method which is suitable for mass production. The lead frame is positioned between an upper die half and a lower die half of a molding die so that a semiconductor chip, leads, a chip mounting portion, suspension leads, and bonding wires are arranged in the interior of each cavity in the molding die, followed by injection of a thermosetting resin into the cavity of the molding die.

An example of the QFN type semiconductor device is disclosed in Japanese Unexamined Patent Publication No. 2001-244399 (Patent Literature 1). In this publication, as methods for forming a resin sealing member, there are disclosed an individual type transfer molding method, wherein a lead frame having plural product-forming areas is used and semiconductor chips mounted in the product-forming areas are sealed with resin product-forming area by product-forming area, and a block molding type transfer molding method, wherein a lead frame having plural product-forming areas is used and semiconductor chips mounted in the product-forming areas are sealed with resin all together. Further, in the above-referenced publication, as a package structure, there is disclosed a so-called small tab structure wherein the plane size of the chip mounting area is set to be smaller than that of the semiconductor chip.

[Patent Literature 1]

Japanese Unexamined Patent Publication No. 2001-244399

SUMMARY OF THE INVENTION

Having made studies of the QFN type semiconductor device, the present inventors have found the following problems.

(1) The package structure, wherein leads are exposed from the back side of a resin sealing member to form external terminals, is obtained by positioning a lead frame within a molding die so that the leads come into contact with an inner surface of a cavity of a molding die, and, thereafter, resin is injected into the cavity of the molding die. However, the front end portions of the leads are not supported anywhere and are free, so that the leads are apt to be displaced by the flow of resin injected into the cavity. Since this lead displacement during molding causes the adhesion between the cavity and the leads to be deteriorated, there easily occurs an inconvenience in that the exposed portions of the leads serving as back electrodes (external terminals) of the resin sealing member are covered with resin flash. This inconvenience based on the presence of resin flash lowers the reliability at the time of soldering the semiconductor device onto a wiring substrate. In addition, a process for removing the resin flash is needed, thus resulting in an increase in the manufacturing cost. Such disadvantages, based on the presence of resin flash, occur more easily in the following case.

In the QFN type semiconductor device, it is necessary to increase the number of terminals (attain a multi-pin structure) as the integrated circuit mounted on a semiconductor chip becomes higher in both function and performance. Since a multi-pin structure causes an increase in the plane size (package size) of the resin sealing member, it is necessary to attain a multi-pin structure without changing the package size, insofar as this is possible. For attaining a multi-pin structure without changing the package size, it is necessary to microsize the leads. As a result, however, the external terminals are also microsized. The external terminals are required to have a predetermined area for ensuring the mounting reliability, and, therefore, they cannot be made so small. Thus, in the case where a multi-pin structure is to be attained without changing the package size, it is impossible to greatly increase the number of terminals, and, hence, it is impossible to greatly increase the number of pins.

For ensuring a predetermined area of external terminals and attaining a multi-pin structure, it is effective to enlarge the widths of terminal portions (portions used as external terminals) of leads selectively and to arrange lead terminal portions in a zigzag fashion along the arranged direction of leads. In this case, however, in the molding process, terminal portions positioned on the semiconductor chip side leave a clamp portion of a molding die which clamps the opposite end sides of the leads vertically, so that the adhesion between an inner surface of a cavity in the molding die and the terminal portions of the leads is deteriorated. Further, since the front end portions of the leads are free, the leads are apt to be displaced by the flow of resin injected into the cavity. In this case, therefore, the inconvenience that the lead terminal portions are covered with resin flash becomes more likely to occur.

(2) A small-tab structure can attain a rationalization of the productivity and a reduction of cost because plural types of semiconductor chips different in plane size can be mounted. However, for mounting several types of semiconductor chips that are different in plane size, it is necessary that the chip-side ends of the leads is cut short in conformity to the contour of a semiconductor chip which is the largest in plane size. Particularly, at the time of mounting a small semiconductor chip, the bonding wires become long, and there is a fear that the reliability may be deteriorated due to wire shift.

In the foregoing Patent Literature 1, there is no concrete description about means for attaining a reduction in the thickness of the entire semiconductor package, nor is there any concrete description about means for attaining a reduction in the cost of the semiconductor package.

It is an object of the present invention to provide a technique which can improve the mounting reliability of a semiconductor device.

It is another object of the present invention to provide a technique which can attain a reduction in the thickness of a semiconductor device.

It is a further object of the present invention to provide a technique which can attain a reduction in the cost of a semiconductor device.

The above and other objects and novel features of the present invention will become apparent from the following description and the accompanying drawings.

The following is a brief description of typical examples of the invention, as disclosed herein.

(1) A semiconductor device having external terminals formed by exposing leads partially from a back surface of a resin sealing member, wherein: end portions on one side of the leads are fixed to a back side of a semiconductor chip, and portions of the leads positioned outside the semiconductor chip are connected with electrodes formed on the semiconductor chip through wires.

(2) In the example (1), the external terminals comprise first external terminals arranged along side faces of the resin sealing member and second external terminals arranged inside the first external terminals and each disposed between adjacent ones of said first external terminals.

(3) In the example (2), the leads comprise plural first leads, end portions on one side of which are positioned outside the semiconductor chip, and plural second leads, each disposed between adjacent ones of said first leads, and end portions on one side of which are fixed to the back side of the semiconductor chip, wherein the plural first leads include the first external terminals, respectively, and the plural second leads include the second external terminals, respectively.

(4) In the example (1), the semiconductor device further comprises a member (spacer) fixed to an upper surface of the semiconductor chip and exposed partially from an upper surface of the resin sealing member.

(5) A semiconductor device having external terminals formed by exposing leads partially from a back surface of a resin sealing member, wherein: end portions on one side of the leads are fixed to an insulating base, a semiconductor chip is fixed onto the insulating base, and portions of the leads positioned outside the insulating base are connected with electrodes formed on the semiconductor chip through wires.

(6) In the example (5), the external terminals comprise first external terminals arranged along side faces of the resin sealing member and second external terminals arranged inside the first external terminals and each disposed between adjacent ones of said first external terminals.

(7) In the example (6), the leads comprise plural first leads, end portions on one side of which are positioned outside the insulating base, and plural second leads, each disposed between adjacent ones of said first leads, and end portions on one side of which are fixed to the insulating base, wherein the plural first leads include the first external terminals, respectively, and the plural second leads include the second external terminals, respectively.

(8) In the example (5), the semiconductor device further comprises a member (spacer) fixed to an upper surface of the semiconductor chip and exposed partially from an upper surface of the resin sealing member.

(9) A method of manufacturing a semiconductor device having external terminals formed by exposing leads partially from a back surface of a resin sealing member, the method comprising the steps of:
(a) fixing end portions on one side of the leads to a back surface of a semiconductor chip;
(b) connecting portions of the leads positioned outside the semiconductor chip with electrodes formed on the semiconductor chip through wires;
(c) forming a member (spacer) on an upper surface of the semiconductor chip; and
(d) sealing the semiconductor chip, the leads and the wires with a resin sealing member,
the resin sealing member being formed by a transfer molding method involving injection of resin into a cavity of a molding die, and the resin sealing member being formed by injecting the resin in a state in which a part of the member (spacer) is in contact with an inner surface of the cavity of the molding die.

(10) In the example (9), the semiconductor chip is one of plural semiconductor chips obtained by dicing a semiconductor wafer, and the member (spacer) is formed on each of the plural semiconductor chips in a state of the semiconductor wafer prior to the dicing of the semiconductor wafer.

(11) In the example (10), the member (spacer) is formed of a silicon piece.

(12) In the example (11), the silicon piece is one of plural silicon pieces obtained by dicing a silicon wafer, and the method further comprises the steps of affixing the silicon wafer onto the semiconductor wafer prior to the dicing of the silicon wafer, and subsequently dicing the silicon wafer.

(13) In the example (10), the member (spacer) is formed by an insulating layer, and the insulating layer is formed by printing.

(14) In the example (13), the insulating layer is a polyimide layer.

(15) A method of manufacturing a semiconductor device having external terminals formed by exposing leads partially from a back surface of a resin sealing member, the method comprising the steps of:
(a) fixing end portions on one side of the leads to an insulating base;

(b) fixing a semiconductor chip onto the insulating base;
(c) connecting portions of the leads positioned outside the semiconductor chip with electrodes formed on the semiconductor chip through plural wires;
(d) forming a member (spacer) on an upper surface of the semiconductor chip; and
(e) sealing the semiconductor chip, the insulating base, the leads and the wires with a resin sealing member, the resin sealing member being formed by a transfer molding method involving injection of resin into a cavity of a molding die, and the resin sealing member being formed by injecting the resin in a state in which a part of the member (spacer) is in contact with an inner surface of the cavity of the molding die.

(16) A method of manufacturing a semiconductor chip having plural semiconductor chips on a wiring substrate, the method comprising the steps of:
(a) providing first and second semiconductor chips each having an integrated circuit and plural electrodes;
(b) mounting the first semiconductor chip onto a main surface of the wiring substrate;
(c) stacking the second semiconductor chip onto the first semiconductor chip through a spacer;
(d) connecting electrodes formed on each of the first and second semiconductor chips with plural terminals arranged on the main surface of the wiring substrate through plural wires; and
(e) sealing the first and second semiconductor chips and the wires with a resin sealing member on the main surface of the wiring substrate, the first semiconductor chip being one of plural semiconductor chips obtained by dicing a semiconductor wafer, the spacer being formed on each of the plural semiconductor chips in a state of the semiconductor wafer prior to the dicing of the semiconductor wafer, and the step (b) including a step of mounting the first semiconductor chip with the spacer formed thereon onto the main surface of the wiring substrate.

(17) In the example (16), the method further comprises a step of grinding and spin etching a back surface of the semiconductor wafer to reduce a thickness of the semiconductor wafer, and the spacer is mounted onto the semiconductor wafer after the step of reducing the thickness of the semiconductor wafer.

(18) A method of manufacturing a semiconductor device having plural semiconductor chips mounted on a chip mounting portion of a lead frame, the method comprising the steps of:
(a) providing first and second semiconductor chips each having an integrated circuit and plural electrodes;
(b) mounting the first semiconductor chip onto the chip mounting portion;
(c) stacking the second semiconductor chip onto the first semiconductor chip through a spacer;
(d) connecting electrodes formed on each of the first and second semiconductor chips with plural leads of the lead frame through wires; and
(e) sealing the chip mounting portion, portions of the plural leads, the first and second semiconductor chips and the wires with a resin sealing member, the first semiconductor chip being one of plural semiconductor chips obtained by dicing a semiconductor wafer, the spacer being formed on each of the plural semiconductor chips in a state of the semiconductor wafer prior to the dicing of the semiconductor wafer, the step (b) including a step of mounting the first semiconductor chip with the spacer formed thereon onto the chip mounting portion.

(19) In the example (18), the method further comprises a step of grinding and spin etching a back surface of the semiconductor wafer to reduce a thickness of the semiconductor wafer, and the spacer is mounted onto the semiconductor wafer after the step of reducing the thickness of the semiconductor wafer.

BRIEF DESCRIPTION OF THE DRAWINGS

FIGS. 7A and 7B are diagrammatic sectional views showing an internal structure of the semiconductor device, of which FIG. 7A is a sectional view taken on line a—a (first leads) and FIG. 7B is a sectional view taken on line b—b (second leads) in FIG. 3;

FIG. 8 is a diagrammatic plan view showing the whole of a lead frame used in manufacturing the semiconductor device;

FIGS. 10A and 10B are diagrammatic sectional views showing a chip mounting step in a manufacturing process for the semiconductor device, of which FIG. 10A is a sectional view taken along first leads and FIG. 10B is a sectional view taken along second leads;

FIGS. 11A and 11B are diagrammatic sectional views showing a wire bonding step in the manufacturing process for the semiconductor device, of which FIG. 11A is a sectional view taken along first leads and FIG. 11B is a sectional view taken along second leads;

FIGS. 12A and 12B are diagrammatic sectional views showing a positioned state of a lead frame within a molding die in a molding step in the manufacturing process for the semiconductor device, of which FIG. 12A is a sectional view taken along first leads and FIG. 12B is a sectional view taken along second leads;

FIGS. 14A and 14B are diagrammatic sectional views showing an injected state of resin into a cavity of the molding die in the molding step in the manufacturing process for the semiconductor device, of which FIG. 14A is a sectional view taken along first leads and FIG. 14B is a sectional view taken along second leads;

FIG. 15 is a diagrammatic plan view of the lead frame after the molding step in the manufacture of the semiconductor device;

FIGS. 16A and 16B are diagrammatic sectional views showing a semiconductor layer forming step in the manufacture of the semiconductor device, of which FIG. 16A is a sectional view taken along first leads and FIG. 16B is a sectional view taken along second leads;

FIGS. 17A and 17B are diagrammatic sectional views showing an internal structure of a semiconductor device according to a modification of the first embodiment, of which FIG. 17A is a sectional view taken along first leads and FIG. 17B is a sectional view taken along second leads;

FIGS. 18A and 18B are diagrammatic sectional views showing an internal structure of a semiconductor device according to a second embodiment of the present invention, of which FIG. 18A is a sectional view taken along first leads and FIG. 18B is a sectional view taken along second leads;

FIGS. 19A and 19B are diagrammatic sectional views showing an internal structure of a semiconductor device according to a third embodiment of the present invention, of which FIG. 19A is a sectional view taken along first leads and FIG. 19B is a sectional view taken along second leads;

FIGS. 20A and 20B are diagrammatic sectional views showing an internal structure of a semiconductor device according to a fourth embodiment of the present invention, of which FIG. 20A is a sectional view taken along first leads and FIG. 20B is a sectional view taken along second leads;

FIGS. 21A and 21B are diagrammatic sectional views showing an internal structure of a semiconductor device according to a fifth embodiment of the present invention, of which FIG. 21A is a sectional view taken along first leads and FIG. 21B is a sectional view taken along second leads;

FIGS. 22A and 22B are diagrammatic sectional views showing an internal structure of a semiconductor device according to a sixth embodiment of the present invention, of which FIG. 22A is a sectional view taken along line a—a (first leads) and FIG. 22B is a sectional view taken along line b—b (second leads);

FIGS. 23A, 23B and 23C are diagrammatic sectional views showing a manufacturing process for the semiconductor device of the sixth embodiment, of which FIG. 23A shows a chip mounting step, FIG. 23B shows a spacer mounting step, and FIG. 23C shows a wire bonding step;

FIGS. 24A and 24B are diagrammatic sectional views showing a positioned state of a lead frame within a molding die in a molding step in the manufacturing process for the semiconductor device of the sixth embodiment, of which FIG. 24A is a sectional view taken along first leads and FIG. 24B is a sectional view taken along second leads;

FIG. 25 is a diagrammatic plan view showing a positioned state of the lead frame within the molding die in the molding step in the manufacturing process for the semiconductor device of the sixth embodiment;

FIGS. 28A and 28B are diagrammatic sectional views showing a positioned state of a lead frame within a molding die in a molding step in a manufacturing process for a semiconductor device according to a modification of the sixth embodiment, of which FIG. 28A is a sectional view taken along first leads and FIG. 28B is a sectional view taken along second leads;

FIGS. 29A and 29B are diagrammatic sectional views showing an internal structure of a semiconductor device according to a seventh embodiment of the present invention, of which FIG. 29A is a sectional view taken along first leads and FIG. 29B is a sectional view taken along second leads;

FIGS. 30A and 30B are diagrammatic sectional views showing an internal structure of a semiconductor device according to an eighth embodiment of the present invention, of which FIG. 30A is a sectional view taken along first leads and FIG. 30B is a sectional view taken along second leads;

FIGS. 31A and 31B are diagrammatic sectional views showing an internal structure of a semiconductor device according to a ninth embodiment of the present invention, of which FIG. 31A is a sectional view taken along first leads and FIG. 31B is a sectional view taken along second leads;

FIGS. 32A and 32B are diagrammatic sectional views showing an internal structure of a semiconductor device according to a tenth embodiment of the present invention, of which FIG. 32A is a sectional view taken along first leads and FIG. 32B is a sectional view taken along second leads;

FIGS. 33A and 33B are diagrammatic sectional views showing an internal structure of a semiconductor device according to an eleventh embodiment of the present invention, of which FIG. 33A is a sectional view taken along first leads and FIG. 33B is a sectional view taken along second leads;

FIGS. 34A and 34B are diagrammatic sectional views showing an internal structure of a semiconductor device according to a twelfth embodiment of the present invention, of which FIG. 34A is a sectional view taken along first leads and FIG. 34B is a sectional view taken along second leads;

FIGS. 38A and 38B are diagrammatic sectional views showing manufacturing steps in the manufacture of the semiconductor chip of the thirteenth embodiment;

FIGS. 42A and 42B are diagrammatic sectional views showing manufacturing steps in the manufacture of the semiconductor chip of the fourteenth embodiment;

FIGS. 45A and 45B are diagrammatic sectional views showing manufacturing steps in the manufacture of the semiconductor device of the sixteenth embodiment, of which FIG. 45A shows a chip mounting step and FIG. 45B shows a wire bonding step;

FIGS. 46A and 46B are diagrammatic sectional views showing manufacturing steps in the manufacture of the semiconductor chip of the sixteenth embodiment, of which FIG. 46A shows a chip mounting step and FIG. 46B shows a wire bonding step;

FIGS. 48A and 48B are diagrammatic sectional views showing manufacturing steps in the manufacture of the semiconductor device of the seventeenth embodiment, of which FIG. 48A shows a chip mounting step and FIG. 48B shows a wire bonding step; and FIGS. 49A and 49B are diagrammatic sectional views showing manufacturing steps in the manufacture of the semiconductor device of the seventeenth embodiment, of which FIG. 49A shows a chip mounting step and FIG. 49B shows a wire bonding step.

DETAILED DESCRIPTION OF PREFERRED EMBODIMENTS

Figure 1:
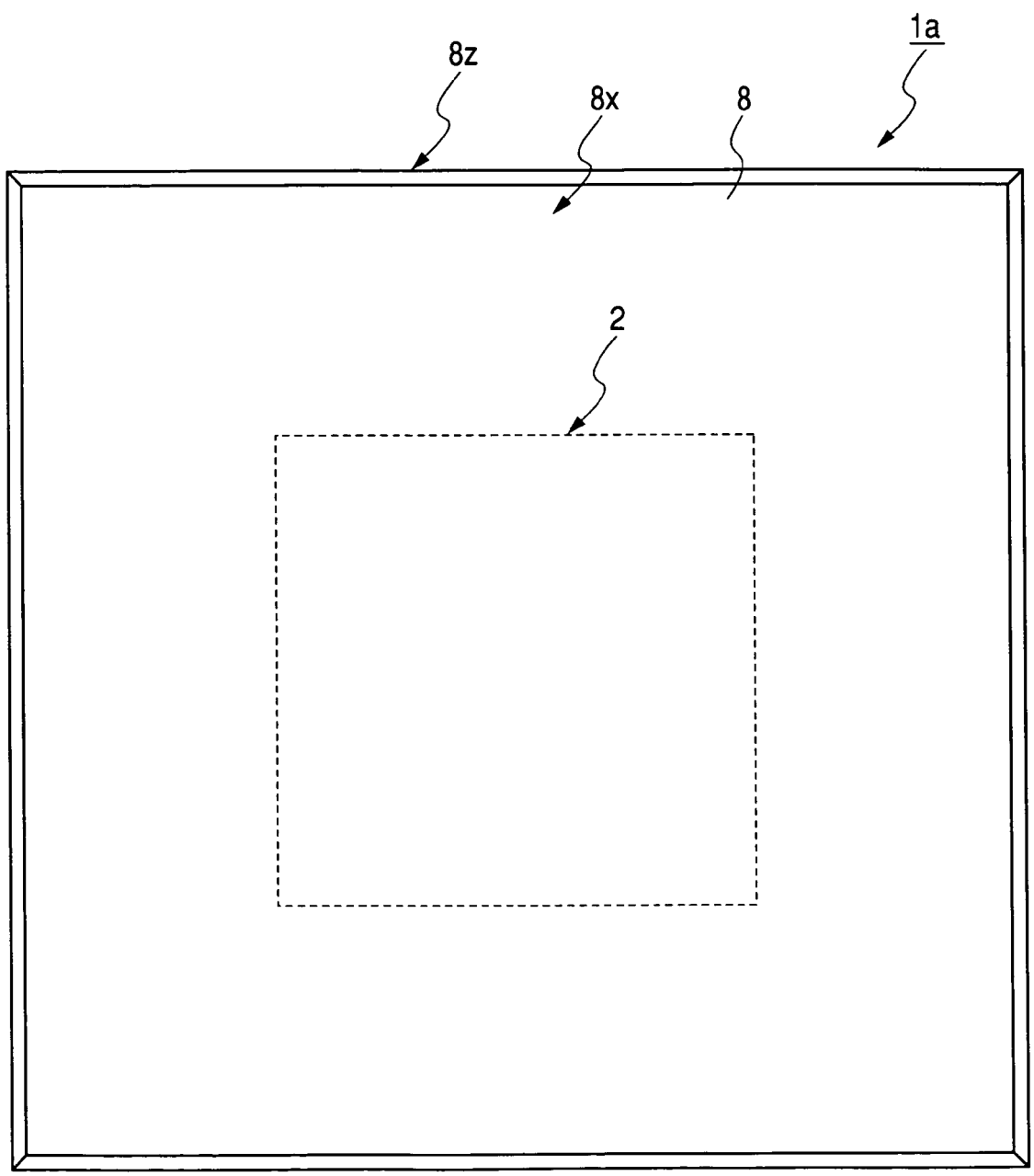
FIG. 1 is a diagrammatic plan view (top view) showing the appearance of a semiconductor device according to a first embodiment of the present invention.

Embodiments of the present invention will be described in detail hereunder with reference to the accompanying drawings. In all of the drawings, portions having the same functions are identified by the same reference numerals, and repeated explanations thereof will be omitted.

First Embodiment

In connection with this first embodiment, the description will be directed to an example in which the present invention is applied to a QFN type semiconductor device.

Figure 2:
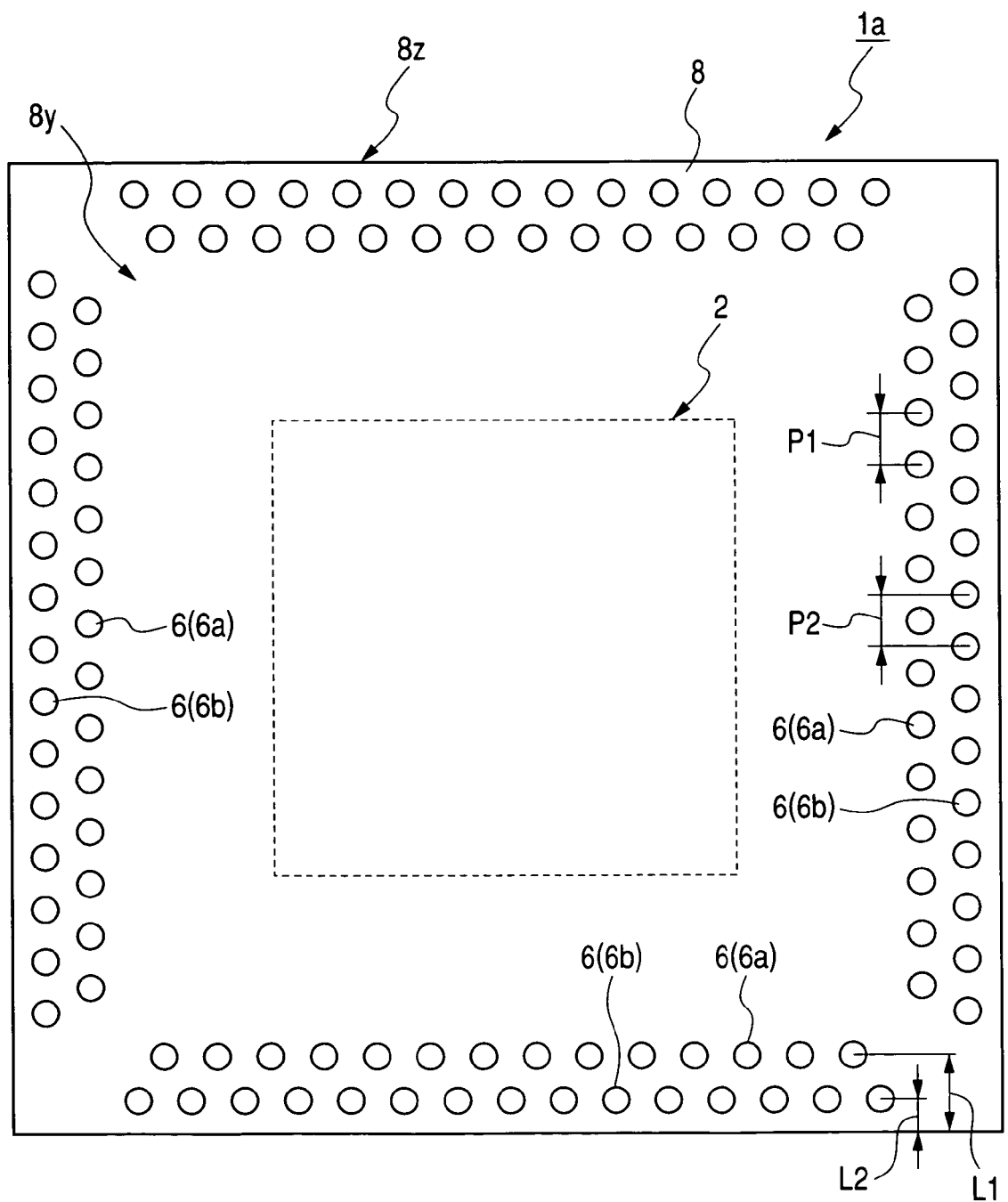
FIG. 2 is a diagrammatic bottom view (underside view) showing the appearance of the semiconductor device.
Figure 3:
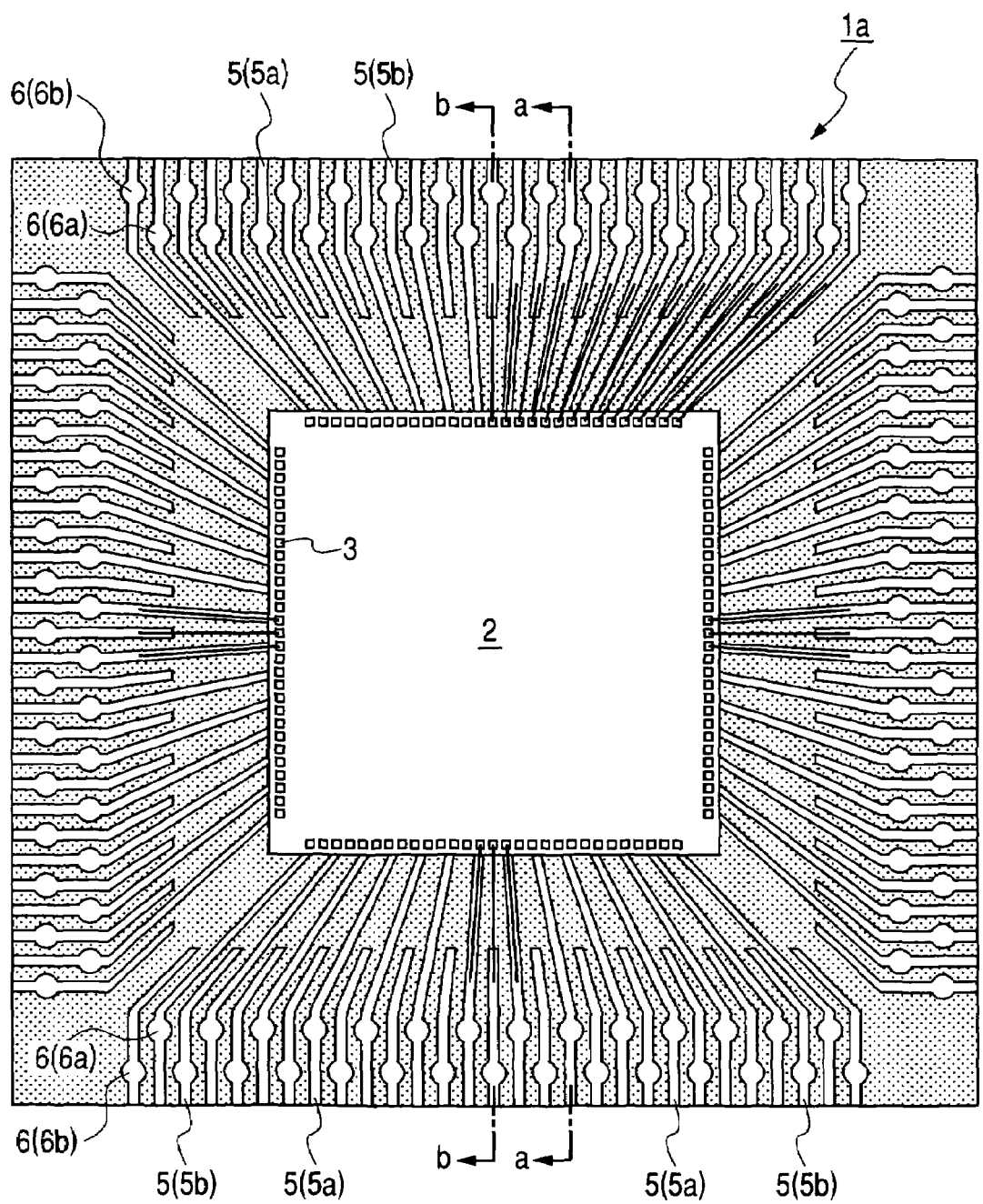
FIG. 3 is a diagrammatic plan view (top view) showing an internal structure of the semiconductor device.
Figure 4:
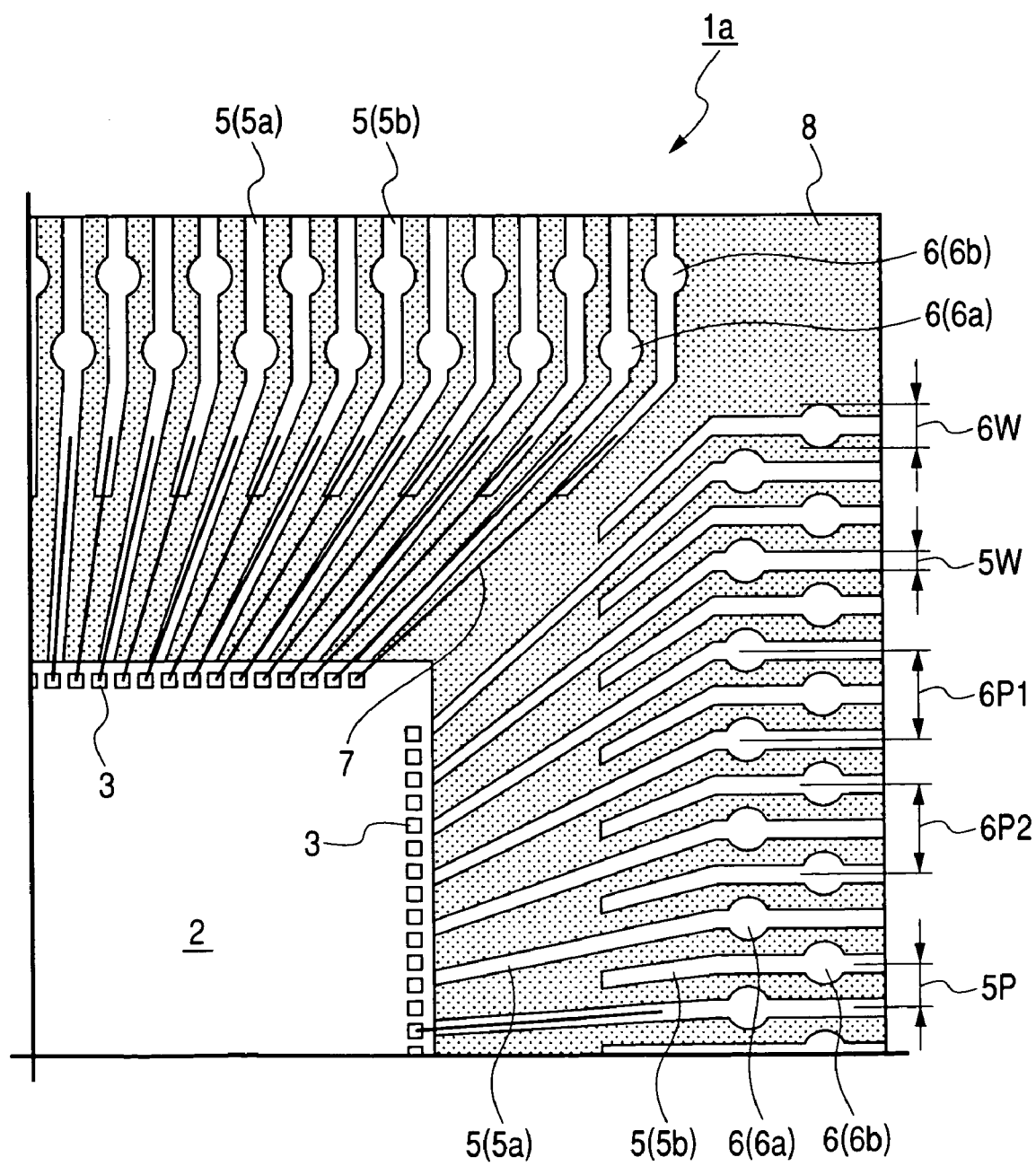
FIG. 4 is a diagrammatic plan view corresponding to a partially enlarged view of FIG. 3.
Figure 5:
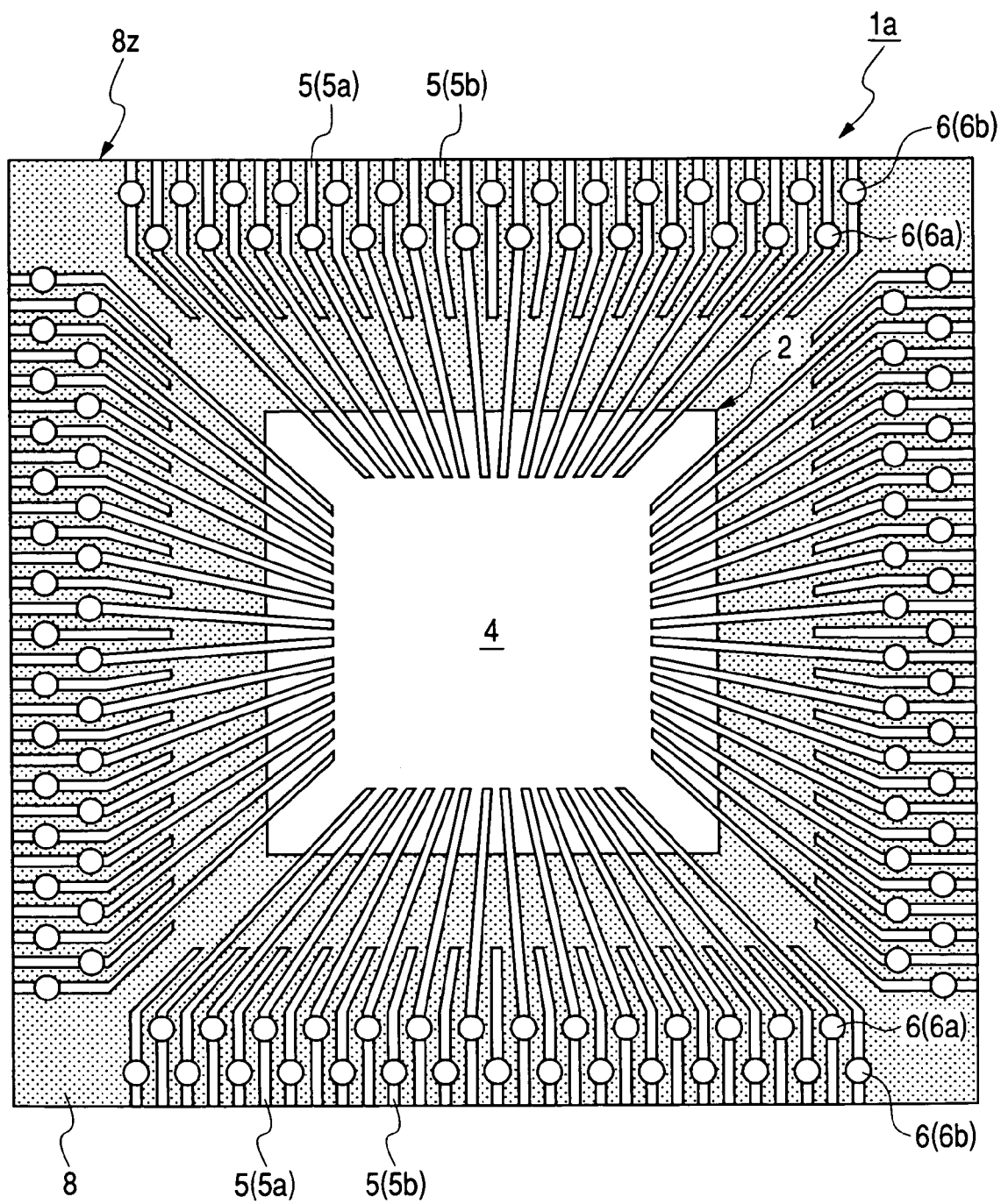
FIG. 5 is a diagrammatic bottom view (underside view) showing an internal structure of the semiconductor device.
Figure 6:
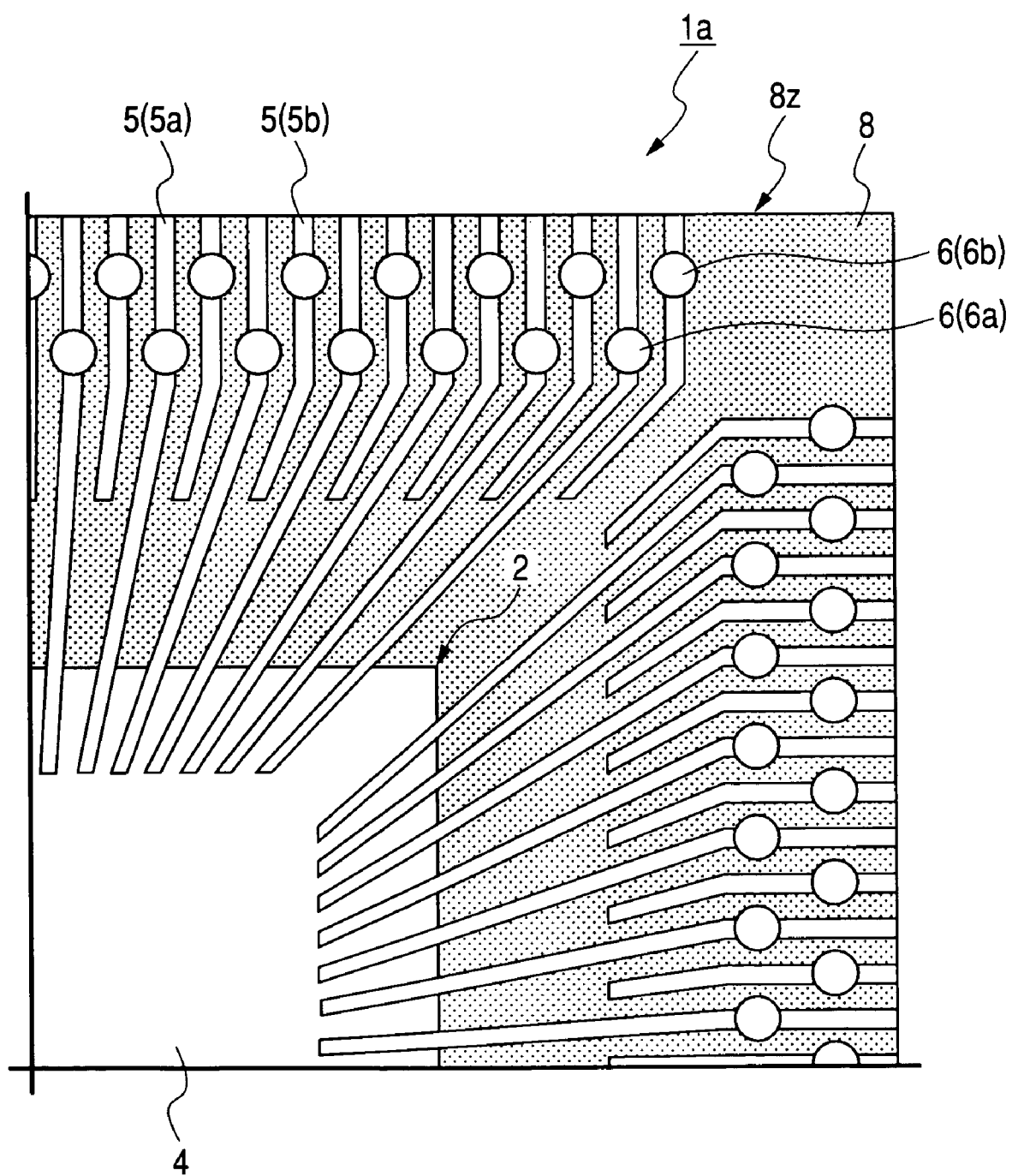
FIG. 6 is a diagrammatic bottom view corresponding to a partially enlarged view of FIG. 5.

FIG. 1 is a plan view (top view) showing the appearance of a semiconductor device according to the first embodiment of the present invention; FIG. 2 is a bottom view (underside view) showing the appearance of the semiconductor device; FIG. 3 is a plan view (top view) showing an internal structure of the semiconductor device; FIG. 4 is a plan view corresponding to a partially enlarged view of FIG. 3; FIG. 5 is a bottom view (underside view) showing an internal structure of the semiconductor device; FIG. 6 is a bottom view corresponding to a partially enlarged view of FIG. 5; FIG. 7A is a sectional view taken along line a—a (first leads) in FIG. 3; and FIG. 7B is a sectional view taken along line b—b in FIG. 3.

In FIGS. 3 and 4, wires which will be described later are partially omitted to make the drawings easier to understand.

As shown in FIGS. 1 to 6 and FIGS. 7A and 7B, the semiconductor device of this first embodiment, indicated at 1a, consists of a package structure having a semiconductor chip 2, first to fourth lead groups, each consisting of plural leads 5, plural bonding wires 7 and a resin sealing member 8.

The semiconductor chip 2, the plural leads 5 in the first to fourth lead groups and the plural bonding wires 7 are sealed with the resin sealing member 8.

As shown in FIG. 3, the shape of the semiconductor chip 2 as seen in the plane intersecting its thickness direction is a quadrangular shape. In this embodiment, it is a square. For example, the semiconductor chip 2 consists of a semiconductor substrate, plural transistor elements formed on a main surface of the semiconductor substrate, a multi-layer interconnection comprising plural stages of insulating layers and wiring layers on the main surface of the semiconductor substrate, and a surface protecting film (a final protecting layer) formed so as to cover the multi-layer inter connection. For example, the insulating layers are formed by silicon oxide films and the wiring layers are formed by metallic films, such as films of aluminum (Al), aluminum alloy, copper (Cu), or copper alloy. The surface protecting film is formed, for example, of a multi-layer film which consists of a stack of an inorganic insulating film, such as silicon oxide film or silicon nitride film, and an organic insulating film.

As shown in FIGS. 3 and 7A, 7B, the semiconductor chip 2 has a main surface (a circuit-forming surface) 2x and a back surface 2y which are positioned opposite to each other, with an integrated circuit being formed on the main surface 2x of the semiconductor chip 2. The integrated circuit is mainly composed of transistor elements formed on the main surface of the semiconductor substrate and wiring lines formed in the multi-layer interconnection.

Plural bonding pads (electrodes) 3 are formed on the main surface 2x of the semiconductor chip 2. The plural bonding pads 3 are arranged along the four sides of the semiconductor chip 2. The plural bonding pads 3 are formed on the top wiring layer in the multi-layer interconnection of the semiconductor chip 2 and are exposed through bonding apertures which are formed in the surface protecting film of the semiconductor chip 2 at positions corresponding to the bonding pads 3.

As shown in FIGS. 1 to 3, the shape of the resin sealing member 8 in a direction intersecting the thickness direction of the resin sealing member is quadrangular. In this embodiment, it is a square. As shown in FIGS. 1, 2, 7A and 7B, the resin sealing member 8 has a main surface (upper surface) 8x and a back surface (lower surface, mounting surface) 8y, which are positioned opposite to each other, and the plane size (contour size) of the semiconductor chip 2 is larger than that of the resin sealing member 8.

For the purpose of diminishing stress, the resin sealing member 8 is formed, for example, using a biphenyl-based thermosetting resin with a phenolic curing agent, silicone rubber and a filler incorporated therein. The resin sealing member 8 is formed by a transfer molding method which is suitable for mass production. According to the transfer molding method, a molding die equipped with pots, runners, resin injecting gates and cavities is used, and a thermosetting resin is injected from the pots into the cavities through the runners and resin injecting gates to form resin sealing members.

For manufacturing a resin-sealed type semiconductor device, there usually is adopted an individual type transfer molding method wherein a lead frame having plural product-forming areas is used, and semiconductor chips mounted in the product-forming areas, respectively, are sealed with resin, product-forming area by product-forming area, or a block molding type transfer molding method is employed wherein a lead frame having plural product-forming areas is used, and semiconductor chips mounted on the product-forming areas respectively are sealed with resin all together. The individual type transfer molding method is adopted for manufacturing the semiconductor device 1a of this first embodiment.

As shown in FIGS. 3 and 4, the first to fourth lead groups are arranged at positions corresponding to the four sides of the resin sealing member 8, and the plural leads 5 in each lead group are arranged along each side of the resin sealing member. The plural leads 5 in each lead group extend from each side face 8z of the resin sealing member 8 to the semiconductor chip 2.

The plural bonding pads 3 formed on the semiconductor chip 2 are electrically connected, respectively, to the plural leads 5 in the first to fourth lead groups. In this first embodiment, the electrical connection between the bonding pads 3 on the semiconductor chip 2 and the leads 5 is made through bonding wires 7. The ends on one side of the bonding wires 7 are connected to the bonding pads 3 on the semiconductor chip 2, while the opposite ends thereof be connected to the leads 5 in the area outside (around) the semiconductor chip 2. For example, gold (Au) wires are used as the bonding wires 7. As an example of a method for connecting the wires 7, there is a nail head bonding (ball bonding) method which uses thermosonic wire bonding.

As shown in FIGS. 3 to 6 and FIGS. 7A, 7B, the plural leads 5 in each lead group includes plural leads 5a and plural leads 5b having terminal portions 6, respectively, on one end (close to the semiconductor chip 2) and on the opposite end (close to the side faces 8z of the resin sealing member 8). Terminal portions 6b of the leads 5b are arranged near the side faces 8z (peripheral edges) of the resin sealing member 8, while terminal portions 6a of the leads 5a are arranged inside the terminal portions 6b of the leads 5b; in other words, the terminal portions 6a are positioned away from the side faces 8z (peripheral edges) of the resin sealing member 8 relative to the terminal portions 6a of the leads 5a. That is, as shown in FIGS. 7A and 7B, the distance L1 from each side face 8z (peripheral edge) of the resin sealing member 8 to each of the terminal portions 6a spaced inwards from the side face is longer than the distance L2 from each side face 8z (peripheral edge) of the resin sealing member 8 to each of the terminal portions 6b spaced inwards from the side face.

As shown in FIGS. 7A and 7B, the terminal portions 6 (6a, 6b) are formed integrally with the leads 5 (5a, 5b). The thickness of the other portion of each lead 5, exclusive of the corresponding terminal portion 6, is smaller than that of the terminal portion 6 (the thickness of the terminal portion 6>the thickness of the other portion). As shown in FIG. 4, the width 6W of each of the terminal portions 6 (6a, 6b) is larger than the width 5W of each lead 5 at a terminal end portion on the side opposite to an end side.

As shown in FIGS. 3 and 4, the plural leads 5 in each lead group have a construction wherein leads 5a and 5b are arranged alternately and repeatedly in one direction (along the corresponding side of the resin sealing member 8) so as to be adjacent to each other.

As shown in FIGS. 2 and 7A, 7B, the terminal portions 6 (6a, 6b) of the leads 5 (5a, 5b) are exposed from the back surface 8y of the resin sealing member 8 and are used as external terminals. A solder layer 9 is formed on the tip of each terminal portion 6, for example, by plating or printing. The semiconductor device 1a of this first embodiment is packaged by soldering these connections (5a, 5b) to electrodes (foot print, lands, pads) formed on a wiring substrate.

In each lead group, the terminal portions 6 of the plural leads 5 are arranged in zigzag fashion in two rows along the corresponding side of the resin sealing member 8, as shown in FIGS. 2 to 6. The first row closest to the side of the resin sealing member 8 is made up of terminal portions 5b, while the second row positioned inside the first row is made up of terminal portions 5a. As shown in FIGS. 2 and 4, the layout pitch 6P2 of the first row of terminal portions 6b and the layout pitch 6P1 of the second row of terminal portions 6a are wider than a layout pitch 5P between opposite ends of adjacent leads 5.

In this first embodiment, the layout pitch 6P2 of terminal portions 6b and the layout pitch 6P1 of terminal portions 6a are, say, 650 μm or so, while the layout pitch 5P between opposite end portions of adjacent leads 5 is, for example, 400 μm or so. The width 6W of each terminal portion 6 (6a, 6b) is, for example, 300 μm or so. The width 5W on the opposite end portion of each lead 5 (5a, 5b) is, for example, 200 μm or so. The distance L1 of each terminal portion 6a spaced inwards from each side face 8z (peripheral edge) of the resin sealing member 8 is 800 μm or so and the distance L2 of each terminal portion 6b spaced inwards from each side face 8z (peripheral edge) of the resin sealing member 8 is, for example, 250 μm or so. The thickness of each terminal portion 6 (6a, 6b) is, for example, 125 to 150 μm or so and the thickness of the other portion of each lead 5 exclusive of the corresponding terminal portion 6 is, for example, 65 to 75 μm or so.

In the semiconductor device 1a of this first embodiment, as described above, there are leads 5b and 5a. The leads 5b have terminal portions 6b that are exposed from the back surface 8y of the resin sealing member 8 and are used as external terminals. The leads 5a have terminal portions 6a that are exposed from the back side 8y of the resin sealing member 8 and are used as external terminals. The terminal portions 6a are positioned inside the terminal portions 6b, the leads 5a and 5b being arranged alternately repeatedly along the sides of the resin sealing member 8. Further, the width 6W of each terminal portion 6 (6a, 6b) is larger than the width 5W of the opposite end portion of each lead 5 (5a, 5b).

According to such a package structure, even if the leads 5 (5a, 5b) are microsized, it is possible to ensure a required area of each terminal portion 6 (6a, 6b) that is necessary for attaining a high reliability in packaging, and, hence, it is possible to attain a multi-pin structure without changing the package size.

As shown in FIGS. 5, 6 and 7A, 7B, end portions on one side of the leads 5a are fixedly bonded to the back surface 2y of the semiconductor chip 2 through an adhesive 4. The opposite end portions of the leads 5a terminate in the side faces 8z (peripheral edges) of the resin sealing member 8. End portions on one side of the leads 5b terminate outside (around) the semiconductor chip 2, while the opposite end portions thereof terminate in the side faces 8z (peripheral edges) of the resin sealing member 8. That is, the semiconductor device 1a of this first embodiment 1 has a package structure in which the end portions on one side of the leads 5a, whose terminal portions 6a are positioned inside the terminal portions 6b of the leads 5b, are fixedly bonded to the back surface 2y of the semiconductor chip 2 through the adhesive 4. As the adhesive 4, there is an insulating polyimide resin film including adhesive layers on both sides of a resin layer. For example, the insulating resin film is formed so as to cover the back side 2y of the semiconductor chip 2.

Next, with reference to FIGS. 8 and 9, a description will be given of a lead frame that may be used in manufacturing the semiconductor device 1a.

Figure 9:
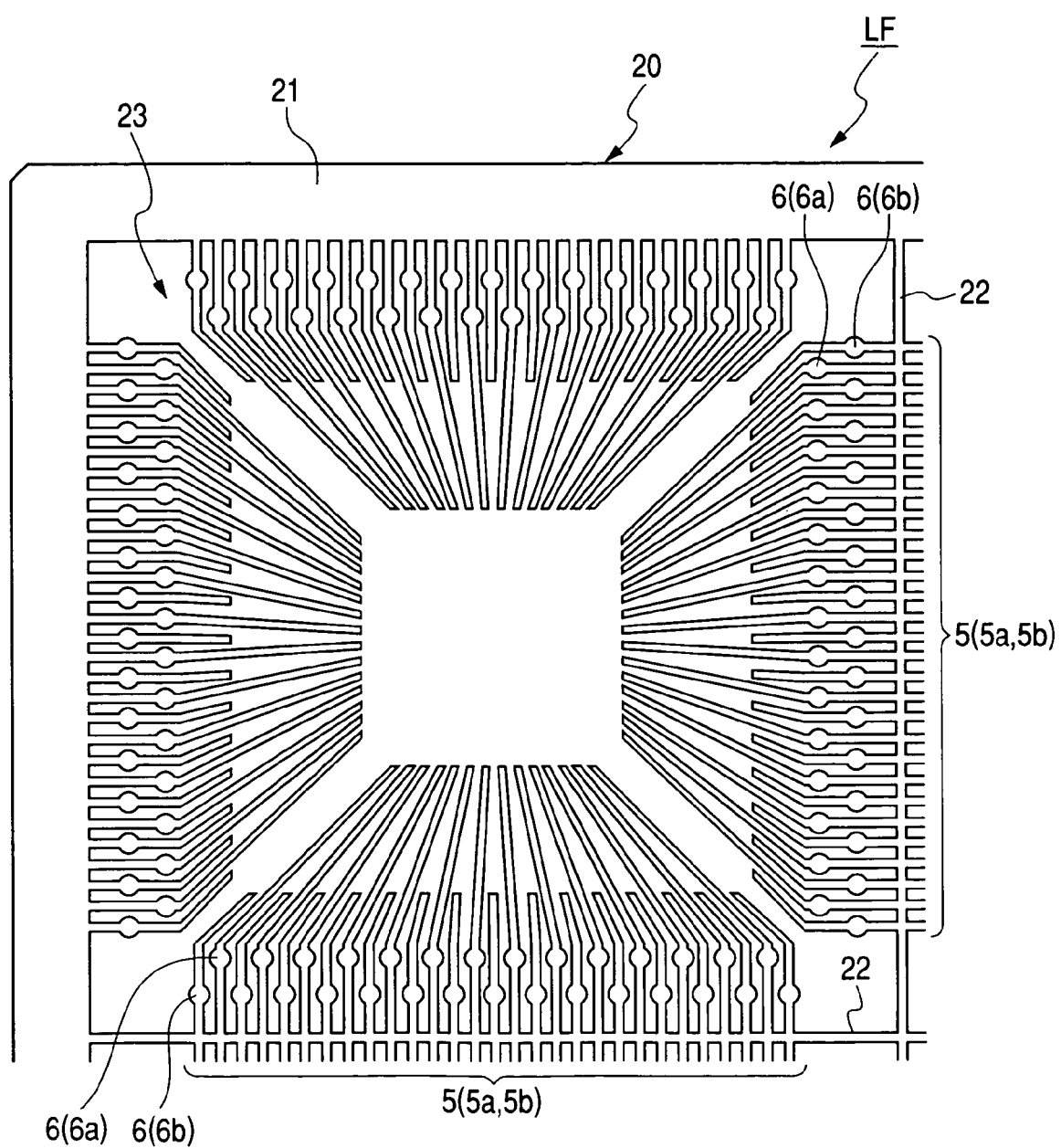
FIG. 9 is a diagrammatic plan view corresponding to a partially enlarged view of FIG. 8.

FIG. 8 is a plan view showing the whole of a lead frame used in manufacturing the semiconductor device 1a of this first embodiment, and FIG. 9 is a plan view corresponding to a partially enlarged view of FIG. 8.

As shown in FIG. 9, the lead frame, indicated at LF, consists of a multi-frame structure, wherein plural product-forming areas (device-forming areas) 23 that are partitioned by a frame body (support member) 20, which includes an outer frame portion 21 and an inner frame portion 22, are arranged in a matrix shape. In each of the product-forming areas 23, there are first to fourth lead groups, each consisting of plural leads 5, as shown in FIG. 9. The plane shape of each product-forming area 23 is quadrangular. The first to fourth lead groups are arranged at positions corresponding to four portions of the frame body 20 which surround each of the product-forming areas 23. The plural leads 5 in each lead group include plural leads 5a and 5b. The leads 5a and 5b are arranged alternately and repeatedly in one direction so as to be adjacent to each other. The plural leads 5 in each lead group are connected to corresponding portions (outer frame portion 21 and inner frame portions 22) of the frame body 20. For enhancing the bondability to bonding wires, each of the plural leads 5 in each lead group has a plating layer consisting mainly of silver (Ag) at a portion thereof to be connected to a corresponding bonding wire.

For fabricating the lead frame LF, first there is a metallic sheet formed of, for example, copper (Cu), copper alloy, or iron (Fe)-nickel (Ni) alloy and having a thickness of about 125 to 150 µm, and one side of the metallic sheet is coated with a photoresist film at positions where leads 5 are to be formed. Likewise, both sides of the metallic sheet are coated with a photoresist film at positions where terminal portions 6 are to be formed. Then, in this state, the metallic sheet is etched using a chemical solution to thin the metallic sheet to about half (65 to 75 µm) (half etching) in the areas where one side is coated with the photoresist film. By etching the metallic sheet in such a manner, the metallic sheet areas where both sides are not coated with the photoresist film disappear completely, while leads 5 having a thickness of about 65 to 75 µm are formed in the areas where one side is coated with the photoresist film. Further, as to the metallic sheet areas where both sides are coated with the photoresist film, since they are not etched with the chemical solution, projecting terminal portions 6 are formed which have the same thickness (125 to 150 µm) as that before the etching. Next, the photoresist film is removed, and, thereafter, a plating layer is formed on wire connecting faces on end sides of the leads 5, whereby the lead frame LF shown in FIGS. 8 and 9 is completed.

Next, with reference to FIGS. 12A, 12B and 13, a description will be given below about a molding die to be used in manufacturing the semiconductor device 1a.

FIGS. 12A and 12B are sectional views showing a positioned state of a molding die in a molding step during manufacture of the semiconductor device, of which FIG. 12A is a sectional view taken along first leads and FIG. 12B is a sectional view taken along second leads.

Figure 13:
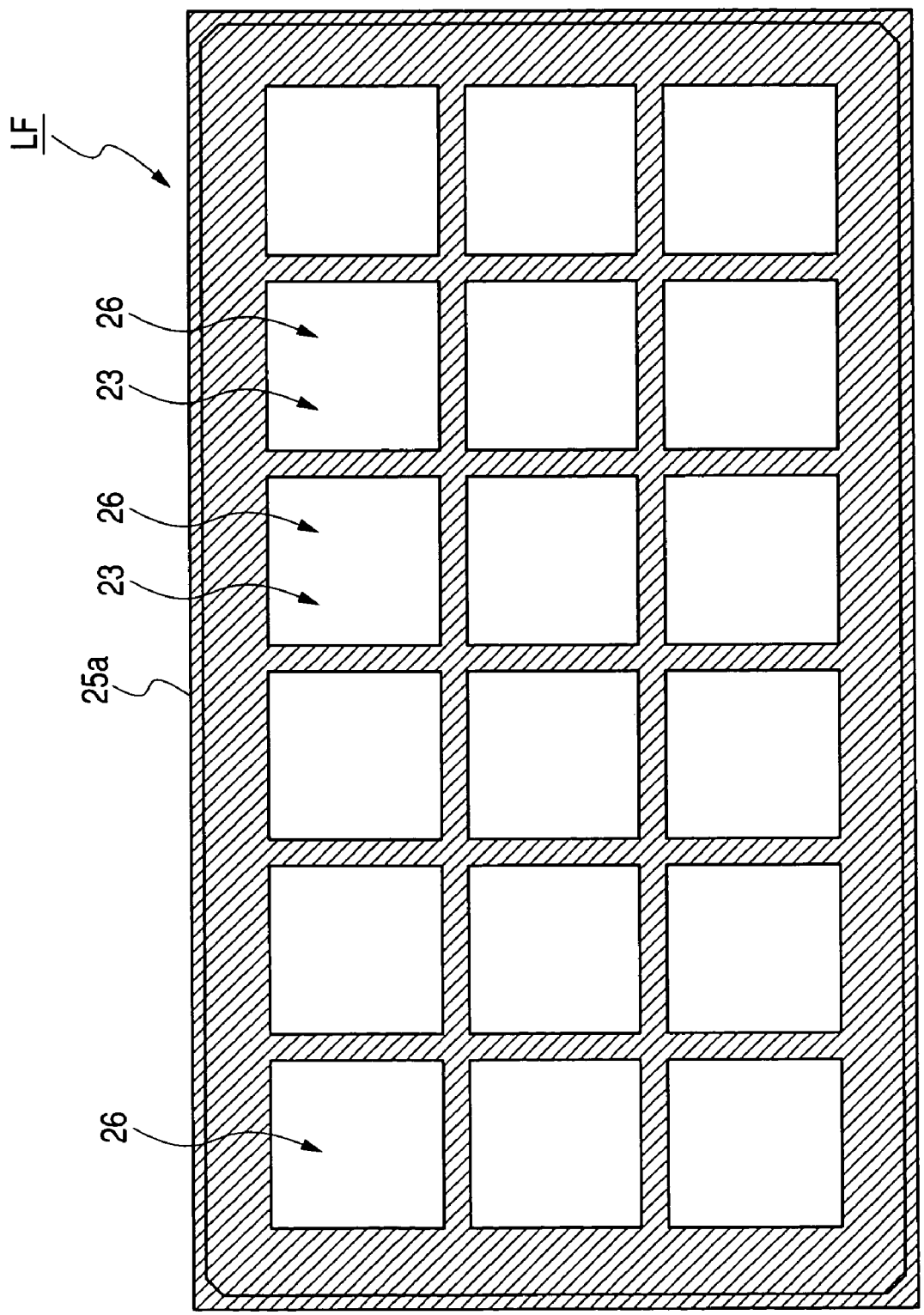
FIG. 13 is a diagrammatic plan view showing a positioned state of the lead frame within the molding die in the molding step in the manufacturing process for the semiconductor device.

FIG. 13 is a plan view showing a positioned state of the lead frame within the molding die in the molding step.

A molding die 25 has a construction such as shown in FIGS. 12A, 12B and 13, though no limitation is made thereto, wherein the molding die 25 has an upper die half 25a and a lower die half 25b, which are vertically divided from each other, and which further have pots, cull portions, runners, resin injecting gates, cavities 26 and air vents. In the molding die 25, the lead frame LF is positioned between a mating surface of the upper die half 25a and that of the lower die half 25b. The cavities 26 into which resin is to be injected are defined by the upper and lower die halves 25a, 25b when the mating surfaces of both die halves are brought into face to face contact with each other. In this embodiment, the cavities 26 in the molding die 25 are defined, for example, by concave portions formed in the upper and lower mold halves 25a, 25b, respectively, though no limitation is made thereto. The cavities 26 are formed in a plural number correspondingly to the plural product-forming areas 23 of the lead frame LF.

Next, with reference to FIGS. 10A to 16B, a description will be given below about how to manufacture the semiconductor device 1a.

FIGS. 10A and 10B are sectional views showing a chip mounting step in the manufacturing process for the semiconductor device, of which FIG. 10A is a sectional view taken along first leads and FIG. 10B is a sectional view taken along second leads; FIGS. 11A and 11B are sectional views showing a wire bonding step in the manufacturing process for the semiconductor device, of which FIG. 11A is a sectional view taken along first leads and FIG. 11B is a sectional view taken along second leads; FIGS. 14A and 14B are sectional views showing a resin injected state into each cavity of the molding die in the molding step during manufacture of the semiconductor device, of which FIG. 14A is a sectional view taken along first leads and FIG. 14B is a sectional view taken along second leads; FIG. 15 is a plan view of the lead frame after the molding step during manufacture of the semiconductor device; and FIGS. 16A and 16B are sectional views showing a solder layer forming step during manufacture of the semiconductor device, of which FIG. 16A is a sectional view taken along first leads and FIG. 16B is a sectional view taken along second leads.

First, the lead frame LF shown in FIGS. 8 and 9 is provided, and, thereafter, as shown in FIGS. 10A and 10B, semiconductor chips 2 are fixedly bonded to the lead frame LF. The bonding and fixing of both the lead frame LF and the semiconductor chips 2 are conducted by bonding and fixing end portions on one side of leads 5 to the back surfaces 2y of the semiconductor chips 2 through an adhesive 4. In this step, the bonding and fixing of the semiconductor chips 2 are performed with the lead frame LF loaded onto a heat stage 27a, but since projecting terminal portions 6 are positioned on the back surface of the lead frame LF, it is preferable that concave portions 28 are formed in the heat stage 27a at positions corresponding to the terminals 6. With the concave portions 28, it is possible to support the lead frame LF stably, and, hence, it is possible to prevent deformation of the leads 5 at the time of mounting the semiconductor chips 2 or to prevent a positional deviation of the chips.

Next, as shown in FIGS. 11A and 11B, plural bonding pads 3 arranged on the main surfaces 2x of the semiconductor chips 2 and plural leads 5 are electrically connected together through plural bonding wires 7. This step is also carried out with the lead frame LF loaded onto a heat stage 27b. Thus, it is preferable that concave portions 28 be formed in the heat stage 27b at positions corresponding to the terminal portions 6. With the concave portions 28, it is possible to prevent deformation of the leads 5 in wire bonding or to prevent a positional deviation of the bonding wires 7.

Then, as shown in FIGS. 12A, 12B and FIG. 13, the lead frame LF is positioned between the upper and lower die halves 25a, 25b of the molding die 25.

The positioning of the lead frame LF is performed in a state in which the semiconductor chip 2, leads 5 and bonding wires 7 in each of the product-forming areas 23 are positioned in the interior of each of the cavities 26.

Further, the positioning of the lead frame LF is conducted in a state in which the opposite end portions of the leads 5 (5a, 5b) are vertically sandwiched between the mating surfaces of the upper and lower die halves 25a, 25b and the terminal portions 6 (6a, 6b) of the leads 5 (5a, 5b) are in contact with inner surfaces of the cavities 26.

Next, as shown in FIGS. 14A, 14B, with the lead frame LF positioned as indicated above, for example, a thermosetting resin is injected from the pots in the molding die 25 into the cavities 26 through cull portions, runners and resin injecting gates to form resin sealing members 8. The semiconductor chips 2, plural leads 5 and plural bonding wires 7 are sealed with the resin sealing members 8.

In this step, the terminal portions 6 of the leads 5 are exposed from the back surfaces 8y of the resin sealing members 8 to form packages.

Next, the lead frame LF is taken out from the molding die 25. In manufacturing the semiconductor device 1a of this first embodiment, an individual type transfer molding method is adopted wherein the lead frame LF having plural product-forming areas 23 is used and sealing with resin is performed individually for each of the semiconductor chips mounted in the product-forming areas 23.

Therefore, as shown in FIG. 15, the resin sealing members 8 are each formed individually for each of the product-forming areas 23 of the lead frame LF.

Then, as shown in FIGS. 16A, 16B, a solder layer 9 is formed, for example, by plating or printing on the surface of each of the terminal portions 6 exposed from the back surface 8y of each of the resin sealing members 8; and, thereafter, a mark, such as product name, is printed on the main surface 8x of each of the resin sealing members 8, followed by a cutting step of separating the leads 5 from the frame body 20 and a cutting step of separating unnecessary portions of the lead frame LF from the lead frame, whereby the semiconductor device 1a of this first embodiment is nearly completed.

In the molding step during manufacture of the semiconductor device 1a, as shown in FIGS. 12A, 12B, ends on one side of the leads 5a are bonded and fixed to the back surface 2y of the semiconductor chip 2. If resin is injected into the cavity 26 in such a state, it is possible to suppress displacement of the leads 5a which is caused by the flow of resin injected into the cavity 26. Consequently, it is possible to suppress deterioration of the adhesion between the inner surface of the cavity 26 and the terminal portions 6a of the leads 5a; and, hence, it is possible to prevent the occurrence of an inconvenience in which the terminal portions 6a of the leads 5a serving as back electrodes (external terminals) of the resin sealing member 8 are covered with resin flash.

On the other hand, positioning of the lead frame LF is performed in a state in which the opposite end portions of the leads (5a, 5b) are vertically sandwiched between the mating surfaces of the upper and lower die halves 25a, 25b and the terminal portions 6 (6a, 6b) of the leads 5 (5a, 5b) are in contact with the inner surface of each cavity 26. In this way, with the resilience of the metallic sheet which constitutes the lead frame LF, a force is created so that the terminal portions 6 of the leads 5 are urged toward the inner surface of the cavity 26. As a result, the terminal portions 6 of the leads 5 come into close contact with the inner surface of the cavity 26. However, this urging force becomes weaker as the distance from the clamp portions (peripheral edges of each of the cavities 26) of the molding die 25, which holds the opposite ends of the leads 5 grippingly, becomes longer. Therefore, the terminal portions 6a that are spaced a larger distance from the clamp portions of the molding die than the terminal portions 6b are weaker in providing the urging force against the inner surface of each cavity 26. That is, the terminal portions 5a that are farther from the clamp portions of the molding die 25 than the terminal portions 5b are deteriorated with respect to adhesion to the cavity 26 and the inconvenience of the terminal portions 6a being covered with resin flash is likely to occur.

On the other hand, in this first embodiment, the end portions on one side of the leads 5a are bonded and fixed to the back surface 2y of the semiconductor chip 2. According to this construction, it is possible to suppress a lowering of the urging force of the terminal portions 6a acting on the inner surface of the cavity 26. Consequently, it is possible to suppress deterioration of the adhesion between the inner surface of the cavity 26 and the terminal portions 6a of the leads 5a, and, hence, it is possible to suppress the occurrence of the inconvenience that the terminal portions 6a of the leads 5a, serving as back electrodes (external terminals) of the resin sealing member 8, are covered with resin flash.

Therefore, by bonding and fixing end portions on one side of the leads 5 to the back surface 2y of the semiconductor chip 2, it is possible to suppress the occurrence of resin flash caused by the flow of resin and to suppress the occurrence of resin flash caused by a long distance from the clamp portions of the molding die 25. As a result, it is possible to improve the reliability at the time of soldering the semiconductor device to the wiring substrate. Moreover, since the resin flash removing step becomes unnecessary, a semiconductor device having a high mounting reliability can be manufactured at a low cost.

According to the method wherein end portions on one side of the leads 5a are fixed to the back surface 2y of the semiconductor chip 2, several types of semiconductor chips which are different in plane size can be mounted on the lead frame LF, and, therefore, it is possible to attain rationalization of the productivity and a reduction of the cost. For mounting several types of semiconductor chips which are different in plane size, the front ends of the leads need not be cut short to match the contour of the semiconductor chip which is the largest in plane size, and, therefore, it is possible to select the length of bonding wires 7 in accordance with the chip contour, whereby wire shift caused by the flow of resin injected into the cavity 26 can be suppressed.

In this first embodiment, end portions on one side of the leads 5b are not bonded and fixed to the back surface of the semiconductor chip, but terminate outside the semiconductor chip. It is preferable to fix all the leads to the back surface of the semiconductor chip 2, but in the case where the number of leads is large, it is difficult to fix all the leads to the back surface 2y of the semiconductor chip 2. This is because it is necessary that the layout pitch at end portions on one side of the leads are narrower than that at the opposite ends of the leads, and because a limit is encountered in machining the leads. Accordingly, where the number of leads is large, it is preferable that the leads 5a having terminal portions 6a which are worst with regard to resin flash occurrence are selected and fixed to the back surface of the semiconductor chip 2 as in this first embodiment.

Modification

FIGS. 17A and 17B are sectional views showing an internal structure of a semiconductor device according to a modification of the first embodiment, of which FIG. 17A is a sectional view taken along first leads and FIG. 17B is a sectional view taken along second leads.

In the above-described first embodiment, reference has been made to an example in which end portions on one side of the leads 5a, having terminals portions 6a positioned inside (the semiconductor chip 2 side) the terminal portions 6b of the leads 5b, are fixed to the back surface of the semiconductor chip 2. However, as to the leads 5b, like the leads 5a, their end portions on one side may be bonded and fixed to the back surface 2y of the semiconductor chip 2, as shown in FIGS. 17A and 17B. In this case, also at the terminal portions 6b positioned outside the terminal portions 6a, it is possible to suppress the occurrence of any inconvenience caused by resin flash.

Second Embodiment

FIGS. 18A and 18B are sectional views showing an internal structure of a semiconductor device according to a second embodiment of the present invention, of which FIG. 18A is a sectional view taken along first leads and FIG. 18B is a sectional view taken along second leads.

As shown in FIGS. 18A, 18B, a semiconductor device 1b of this second embodiment basically has the same configuration as the first embodiment and is different in the following configuration.

The semiconductor device 1b of this second embodiment has a package structure wherein the semiconductor device has a base (support base) 10 for supporting the semiconductor chip 2, the semiconductor chip 2 being bonded and fixed to a main surface of the base 10 through the adhesive 4, and end portions on one side of leads 5 (5a, 5b) are bonded and fixed through an adhesive to a back side of the base 10 opposite to the main surface. As the base 10, it is preferable to use an insulating base, such as a resin tape, for example, taking the dielectric characteristic for both the semiconductor chip 2 and the leads 5a into account. When a heat dissipating characteristic is taken into account, a metallic base formed of a metallic material that has a high thermal conductivity may be used. However, in the case of using an electrically conductive metallic base, it is necessary to use an insulating adhesive for bonding between the base 10 and the leads 5a and for bonding between the base 10 and the semiconductor chip 2.

Such a package structure is obtained by using a lead frame with the base 10 bonded and fixed to end portions on one side of the leads 5 in the manufacturing process or by bonding and fixing the base 10 to end portions on one side of the leads 5 and subsequently bonding and fixing the semiconductor chip 2 to the base 10.

Also, in such a package structure, the same effects are obtained as in the first embodiment.

Third Embodiment

FIGS. 19A and 19B are sectional views showing an internal structure of a semiconductor device according to a third embodiment of the present invention, of which FIG. 19A is a sectional view taken along first leads and FIG. 19B is a sectional view taken along second leads.

As shown in FIGS. 19A, 19B, a semiconductor device 1c of this third embodiment basically has the same configuration as the second embodiment and is different in the following configuration.

The semiconductor device 1c of this third embodiment has a package structure wherein end portions on one side of leads 5 (5a, 5b) are bonded and fixed to the main surface (the surface to which the semiconductor chip 2 is fixed, i.e., the chip-fixed surface) of the base 10 at positions around (outside) the semiconductor chip 2. The leads 5 each have a first portion S1, a second portion S2 bent from the first portion S1 to the back surface 8y of the resin sealing member 8, and a third portion S3 extending from the second portion S2 toward a side face 8z of the resin sealing member 8. The first portion S1 is bonded and fixed to the main surface of the base 10, and a terminal portion 6 is formed in the third portion S3. In other words, the leads 5 are each constituted so that the first portion S1 bonded and fixed to the main surface of the base 10 is positioned on the main surface side of the resin sealing member 8 relative to the third portion S3 having the terminal portion 6. Such leads 5 can be formed by punching or etching a metallic sheet to form predetermined patterns and by subsequent bending.

Such a package structure also affords the same effects as those obtained in the first embodiment.

In addition, since the rigidity of the leads 5 becomes high, the force of pushing the terminal portions 6 of the leads 5 against the inner surface of each cavity in the molding die is enhanced.

Moreover, since the thickness on the front end side of each of the leads 5 is absorbed by the thickness of the semiconductor chip 2, it is possible to attain a reduction in thickness of the semiconductor device as compared with the case where end portions on one side of the leads 5 are bonded and fixed to the back surface (the side opposite to the side where the semiconductor chip 2 is fixed) of the base 10, as in the second embodiment.

Further, in each of the leads 5, since the first portion S1 bonded and fixed to the main surface of the base 10 is positioned on the main surface side of the resin sealing member 8 with respect to the third portion S3 having the terminal portion 6, the base 10 can be thickened without thickening the semiconductor device.

Additionally, the base 10 can be exposed from the back surface of the resin sealing member 8, though this is not shown.

Fourth Embodiment

FIGS. 20A and 20B are sectional views showing an internal structure of a semiconductor device according to a fourth embodiment of the present invention, of which FIG. 20A is a sectional view taken along first leads and FIG. 20B is a sectional view taken along second leads.

As shown in FIGS. 20A, 20B, a semiconductor device 1d of this fourth embodiment basically has the same configuration as the third embodiment and is different in the following configuration.

The semiconductor device 1d of this fourth embodiment has a package structure wherein the back surface 2y of the semiconductor chip 2 is bonded and fixed through the adhesive 4 to the back surface of the base 10 opposite to the base main surface and the first portions S1 of leads 5 are bonded and fixed through an adhesive to the back surface of the base 10 at positions around the semiconductor chip 2. The semiconductor chip 2 is sealed with resin in a state in which its main surface 2x is positioned on the back surface 8y of the resin sealing member 8.

Such a package structure also affords the same effects as those obtained in the third embodiment.

Fifth Embodiment

FIGS. 21A and 21B are sectional views showing an internal structure of a semiconductor device according to this fifth embodiment, of which FIG. 21A is a sectional view taken along first leads and FIG. 21B is a sectional view taken along second leads.

As shown in FIGS. 21A, 21B, a semiconductor device 1e of this fifth embodiment basically has the same configuration as the foregoing modification of the first embodiment and is different in the following configuration.

In the semiconductor device 1e of this fifth embodiment has a package structure wherein terminal portions 5a are arranged below the semiconductor chip 2 and terminal portions 5b are arranged around the semiconductor chip 2. Such a package structure is applicable to the case where the number of leads is relatively small or the case where a large-sized semiconductor chip is mounted.

Also, in such a package structure, terminal portions 6 of leads 5 are pushed firmly against the inner surface of each cavity in the molding die, so that the same effects as those obtained in the first embodiment are obtained here.

Sixth Embodiment

In the first embodiment, reference has been made to an example of manufacturing a semiconductor device in accordance with an individual type transfer molding method, but in this sixth embodiment, reference will be made to an example of manufacturing a semiconductor device in accordance with a block molding type transfer molding method.

FIGS. 22A and 22B are sectional views showing an internal structure of a semiconductor device according to this sixth embodiment, of which FIG. 22A is a sectional view taken along first leads and FIG. 22B is a sectional view taken along second leads.

As shown in FIGS. 22A, 22B, a semiconductor device 1*f* of this sixth embodiment basically has the same configuration as the first embodiment and is different in the following configuration.

Each resin sealing member 8 formed in this sixth embodiment has a main surface 8*x* and a back surface 8*y*, both being almost the same in contour size. Side faces 8*z* of the resin sealing member 8 are substantially perpendicular to the main surface 8*x* and the back surface 8*y*. Plural leads 5, including leads 5*a* and 5*b*, are bonded and fixed at ends on one side thereof to the back surface 2*y* of the semiconductor chip 2 through an adhesive 4. A spacer 11 is bonded and fixed to the main surface 2*x* of the semiconductor chip 2 through an adhesive 12. The spacer 11, on the side opposite to the side bonded and fixed to the main surface 2*x* of the semiconductor chip 2, is exposed from the main surface (upper surface) 8*x* of the resin sealing member 8.

In manufacturing the semiconductor device 1*f* of this sixth embodiment, a block molding type transfer molding method is adopted. According to this method, as will be described in detail later, the semiconductor device 1*f* is manufactured by forming a resin sealing member which seals with resin all of the semiconductor chips mounted, respectively, in plural product-forming areas of a lead frame and by subsequently dividing (dicing) the lead frame and the resin sealing member into individual product-forming areas of the lead frame.

The following description is now provided about how to manufacture the semiconductor device 1*f* with reference to FIGS. 23A to 27.

Figure 26:
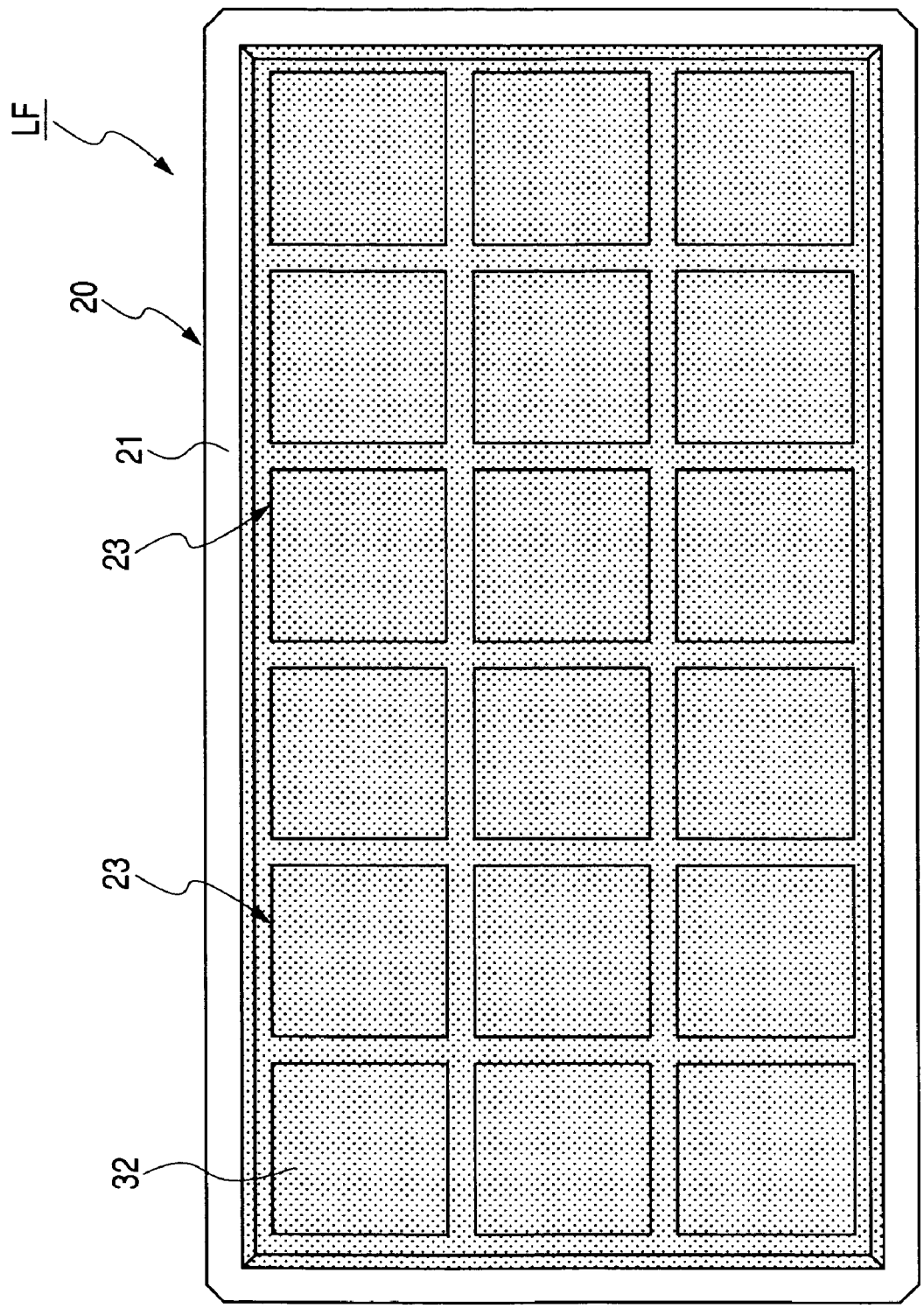
FIG. 26 is a diagrammatic plan view of the lead frame after the molding step in the manufacture of the semiconductor device of the sixth embodiment.
Figure 27:
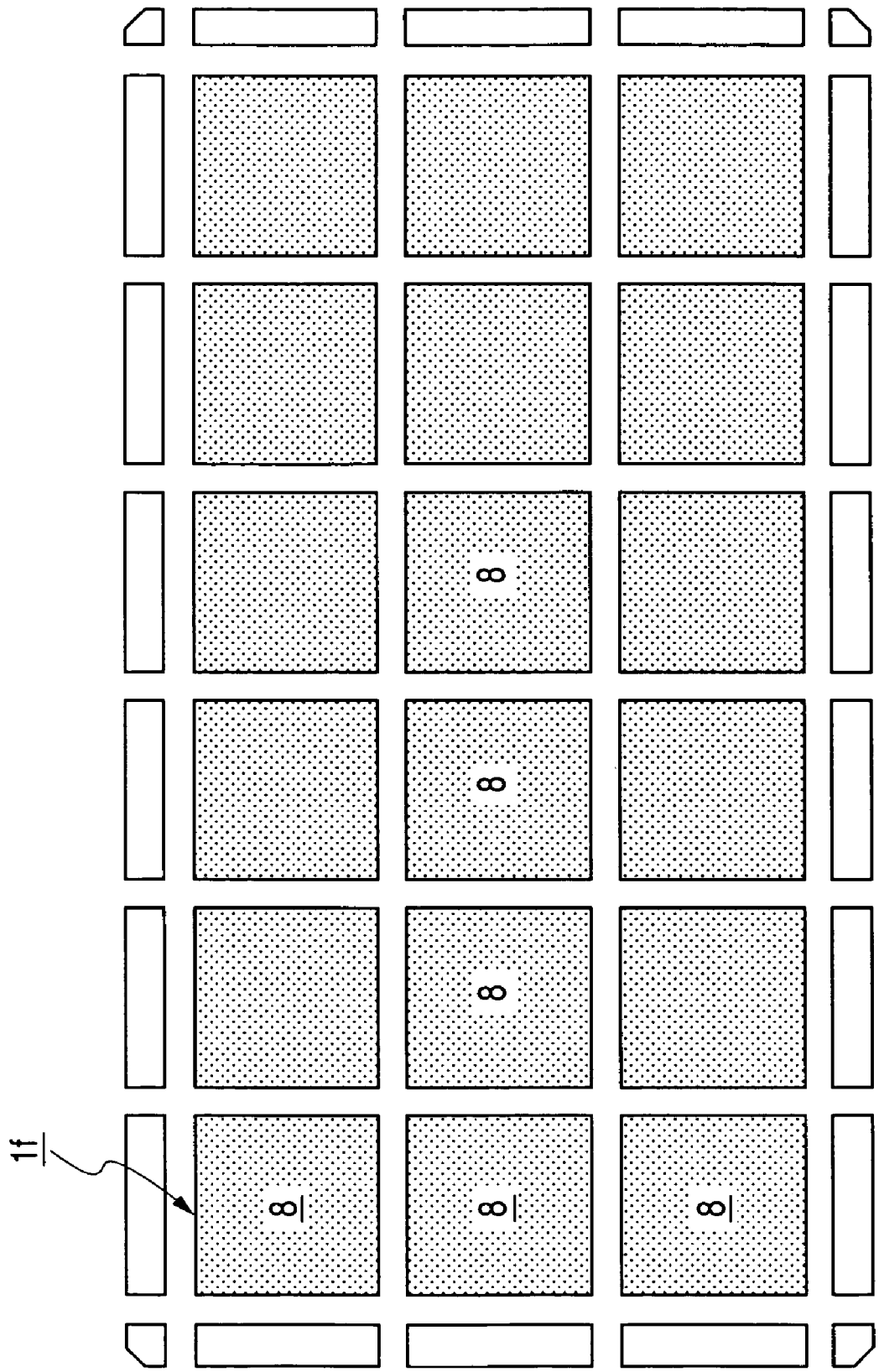
FIG. 27 is a diagrammatic plan view showing individual resin sealing members obtained by dicing in the manufacture of the semiconductor device of the sixth embodiment.

FIGS. 23A, 23B and 23C are sectional views showing a manufacturing process for the semiconductor device of the sixth embodiment, of which FIG. 23A shows a chip mounting step, FIG. 23B shows a spacer mounting step, and FIG. 23C shows a wire bonding step. FIGS. 24A and 24B are sectional views showing a positioned state of a lead frame within a molding die in a molding step during manufacture of the semiconductor device of the sixth embodiment, of which FIG. 24A is a sectional view taken along first leads and FIG. 24B is a sectional view taken along second leads. FIG. 25 is a plan view showing a positioned state of the lead frame within the molding die in the molding step during manufacture of the semiconductor device of the sixth embodiment. FIG. 26 is a plan view of the lead frame after the molding step in the manufacture of the semiconductor device of the sixth embodiment. FIG. 27 is a plan view showing a state in which a resin sealing member has been divided product-forming area by product-forming area in the manufacture of the semiconductor device of the sixth embodiment.

First, the lead frame LF shown in FIGS. 8 and 9 is provided. Thereafter, semiconductor chips 2 are bonded and fixed to the lead frame LF, as shown in FIG. 23A. The bonding and fixing between the lead frame LF and the semiconductor chips 2 are performed by bonding and fixing ends on one side of leads 5 to back sides 2*y* of the semiconductor chips 2 through an adhesive 4.

Next, as shown in FIG. 23B, a spacer 11 is bonded and fixed to a main surface 2*x* of each of the semiconductor chips 2 through an adhesive 12.

Then, a shown in FIG. 23C, plural bonding pads 3 arranged on the main surface 2*x* of the semiconductor chip 2 and plural leads 5 are connected together electrically through plural bonding wires 7.

Next, as shown in FIGS. 24A, 24B and FIG. 25, the lead frame LF is positioned between an upper die half 30*a* and a lower die half 30*b* of a molding die 30.

The positioning of the lead frame LF is performed in a state in which plural product-forming areas 23 are positioned within one cavity 31, that is, semiconductor chips 2 mounted respectively in the product-forming areas 23, as well as leads 5 and bonding wires 7, are positioned within one cavity 31.

Further, the positioning of the lead frame LF is performed in a state in which terminal portions 6 of the leads 5 are in contact with an inner surface portion of the cavity 31 opposed to the terminal portions 6 and an upper surface of the spacer 11 is in contact with an inner surface portion of the cavity 31 opposed to the upper surface.

As the spacer 11, it is preferable to select a spacer having a thickness which permits a slight deflection of leads 5 when the lead frame LF is positioned within the molding die 30. As the spacer 11, it is preferable to select a spacer having a contour size such that side faces are positioned inside the bonding pads 3 on each of the semiconductor chips 2. As the spacer 11, it is preferable to select a spacer made of a material which has a thermal expansion coefficient close to that of the semiconductor chip 2, taking damage of the semiconductor chip 2 caused by a difference in thermal expansion coefficient into account. Further, as the spacer 11, it is preferable to select a spacer that is thicker than the loop height of each bonding wire 7 (height from the main surface 2*x* of the semiconductor chip 2 up to the top of the wire), taking into account a molding defect, such as the bonding wires 7 being exposed from the resin sealing member.

Next, with the lead frame LF positioned as indicated above, for example, a thermosetting resin is injected from pots in the molding die 30 into the cavity 31 through cull portions, runners and resin injecting gates to form a resin sealing member 32. The semiconductor chips 2, plural leads 4 and plural bonding wires 7 in the product-forming areas 23 are sealed with the resin sealing member 32, as shown in FIG. 25.

Then, the lead frame LF is taken out from the molding die 30 and a solder layer 9 is formed, for example, by plating or printing on the surface of each of the terminal portions 6 exposed from the back surface of the resin sealing member 32 in each of the product-forming areas 23. Thereafter, the lead frame LF and the resin sealing member 32 are divided per product-forming area 23 by dicing, for example, to form individual resin sealing members 8. In this way the semiconductor device 1*f* of this sixth embodiment, as shown in FIGS. 22A, 22B, is nearly completed.

In the manufacturing process according to this sixth embodiment, as shown in FIGS. 24A, 24B and 25, at the time of positioning the lead frame LF within the molding die 30, end portions on one side of the leads 5 are fixed to the back side 2y of each of the semiconductor chips 2; the terminal portions 6 formed at the opposite end portions of the leads 5 are in contact with the inner surface portion of the cavity 31 opposed to the terminal portions 6; and the spacer 11 fixed to the main surface 2x of the semiconductor chip 2 is in contact with the inner surface portion of the cavity 31 opposed to the spacer 11, so that displacement of the leads 5 caused by the flow of resin injected into the cavity 31 can be further suppressed in comparison with the first embodiment. Moreover, since the clamping force of the molding die 30 acts as an urging force to push the terminal portions 6 of the leads 5 against the inner surface of the cavity 31, the adhesion between the cavity inner surface and the terminal portions 6 of the leads 5 is improved. In this sixth embodiment, therefore, the inconvenience that the terminal portions 6 of the leads 5 are covered with resin flash can be further suppressed.

Particularly, in the block molding type transfer molding method, an outer frame portion 21 in a frame body 20 of the lead frame LF, which frame portion surrounds the plural product-forming areas 23, is pinched (fixed grippingly) between the upper and lower die halves 30a, 30b of the molding die 30, but most of the inner frame portions 22, each positioned between adjacent product-forming areas 23, are not pinched (fixed grippingly) between the upper and lower die halves of the molding die 30, so that the leads 5 positioned between adjacent product-forming areas 23 are apt to undergo displacement due to the flow of resin injected into the cavity 31, as compared with the leads 5 arranged at peripheral edges of the cavity 31. Thus, the present invention is effectively applicable particularly to the block molding type transfer molding method. Also, in the block molding type transfer molding method adopted in this sixth embodiment, it is possible to suppress the occurrence of resin flash which is apt to occur as the distance from the peripheral edges of the cavity 31 up to the external terminals 6 of the leads 5 becomes longer.

Modification

FIGS. 28A and 28B are sectional views showing a positioned state of a lead frame within a molding die in a molding step during manufacture of a semiconductor device according to a modification of the sixth embodiment, of which FIG. 28A is a sectional view taken along first leads and FIG. 28B is a sectional view taken along second leads.

In the sixth embodiment, reference has been made to an example in which resin is injected into the cavity 31 to form a resin sealing member in a state in which the terminal portions 6 of the leads 5 are in contact with the inner surface portion of the cavity 31 opposed to the terminal portions 6 and the upper surface of the spacer 11 is in contact with the inner surface portion of the cavity 31 opposed to the upper surface. However, the resin sealing member may be formed as shown in FIG. 28. More specifically, resin is injected into the cavity 31 to form a resin sealing member in a state in which a sheet 13 is interposed between the lead frame LF and the lower die half 30b of the molding die 30 and/or between the spacer 11 disposed on the main surface 2x of each of the semiconductor chips 2 and the upper die half 30a of the molding die 30. This method is generally called a sheet molding method. As the sheet 13, it is preferable to select, for example, a resin sheet which can be crushed easily with the clamping force of the molding die 30 and which can withstand a resin heat-curing temperature.

By the cavity of the molding die is meant a space to be filled with resin. Therefore, in a conventional molding method not using the sheet 13, since a cavity is formed mainly by both upper and lower mold halves of a molding die, an inner surface of the cavity means a surface of the molding die. On the other hand, in the case of using the sheet 13 on both the upper and the lower die half side in the sheet molding method, a cavity is formed mainly by the sheet 13, and, therefore, an inner surface of the cavity means a surface of each sheet 13. Further in the case of using the sheet 13 on either the upper or the lower die half side, a cavity is formed mainly by the molding die and the sheet 13, and, therefore, an inner surface of the cavity means a surface of the molding die and that of the sheet 13.

Seventh Embodiment

FIGS. 29A and 29B are sectional views showing an internal structure of a semiconductor device according to a seventh embodiment of the present invention, of which FIG. 29A is a sectional view taken along first leads and FIG. 29B is a sectional view taken along second leads.

As shown in FIGS. 29A, 29B, a semiconductor device 1g of this seventh embodiment basically has the same configuration as that of the second embodiment illustrated in FIG. 18 and is different in the following configuration.

The semiconductor device 1g of this seventh embodiment has a package structure wherein a spacer 11 is bonded and fixed to the main surface 2x of the semiconductor chip 2 through an adhesive 12 and an upper surface of the spacer 11 is exposed from the main surface (upper surface) 8x of the resin sealing member 8. For manufacturing the semiconductor device 1g, a block molding type transfer molding method is adopted, for example.

Such a package structure is obtained by performing the resin-sealing operation in the molding step while keeping the terminal portions 6 of leads 5 in contact with an inner surface portion of the cavity opposed to the terminal portions 6 and keeping the upper surface of the spacer 11 in contact with an inner surface portion of the cavity opposed to the upper surface of the spacer 11.

Such a package structure also affords the same effects as those obtained in the sixth embodiment.

Eighth Embodiment

FIGS. 30A and 30B are sectional views showing an internal structure of a semiconductor device according to an eighth embodiment of the present invention, of which FIG. 30A is a sectional view taken along first leads and FIG. 30B is a sectional view taken along second leads.

As shown in FIGS. 30A, 30B, a semiconductor device 1h of this eighth embodiment basically has the same configuration as that of the third embodiment illustrated in FIG. 19 and is different in the following configuration.

The semiconductor device 1h of this eighth embodiment has a package structure wherein a spacer 11 is bonded and fixed to the main surface 2x of the semiconductor chip 2 through the adhesive 12 and an upper surface of the spacer 11 is exposed from the main surface 8x of the resin sealing member 8. In manufacturing the semiconductor device 1h, a block molding type transfer molding method is adopted, for example.

Such a package structure is obtained by performing the resin-sealing operation in the molding step while keeping the terminal portions 6 of leads 5 in contact with an inner surface portion of the cavity opposed to the terminal portion 6 and keeping the upper surface of the spacer 11 in contact with an inner surface portion of the cavity opposed to the upper surface of the spacer 11.

Such a package structure also affords the same effects as those obtained in the sixth embodiment.

Ninth Embodiment

FIGS. 31A and 31B are sectional views showing an internal structure of a semiconductor device according to a ninth embodiment of the present invention, of which FIG. 31A is a sectional view taken along first leads and FIG. 31B is a sectional view taken along second leads.

As shown in FIGS. 31A, 31B, a semiconductor device 1j of this ninth embodiment basically has the same configuration as that of the fourth embodiment illustrated in FIG. 20 and is different in the following configuration.

The semiconductor device 1j of this eighth embodiment has a package structure wherein a spacer 11 is bonded and fixed to the main surface (the side opposite to the side where the semiconductor chip 2 is fixed) of the base 10 and an upper surface of the spacer 11 is exposed from the main surface (upper surface) 8x of the resin sealing member 8. In manufacturing the semiconductor device 1j, a block molding type transfer molding method is adopted, for example.

Such a package structure is obtained by performing the resin-sealing operation in the molding step while keeping the terminal portions 6 of leads 5 in contact with an inner surface portion of the cavity opposed to the terminal portions 6 and keeping the upper surface of the spacer 11 in contact with an inner surface portion of the cavity opposed to the upper surface of the spacer 11.

Such a package structure also affords the same effects as those obtained in the sixth embodiment.

Tenth Embodiment

FIGS. 32A and 32B are sectional views showing an internal structure of a semiconductor device according to this tenth embodiment, of which FIG. 32A is a sectional view taken along first leads and FIG. 32B is a sectional view taken along second leads.

As shown in FIGS. 32A, 32B, a semiconductor device 1k of this tenth embodiment basically has the same configuration as that of the fifth embodiment illustrated in FIG. 21 and is different in the following configuration.

The semiconductor device 1k of this eighth embodiment has a package structure wherein a spacer 11 is bonded and fixed to the main surface 2x of the semiconductor chip 2 through an adhesive 12 and an upper surface of the spacer 11 is exposed from the main surface 8x of the resin sealing member 8. In manufacturing the semiconductor device 1K, a block molding type transfer molding method is adopted, for example.

Such a package structure is obtained by performing the resin-sealing operation in the molding step while keeping the terminal portions 6 of leads 5 in contact with an inner surface portion of the cavity opposed to the terminal portion 6 and keeping the upper surface of the spacer 11 in contact with an inner surface portion of the cavity opposed to the upper surface of the spacer 11.

Such a package structure also affords the same effects as those obtained in the sixth embodiment.

Eleventh Embodiment

FIGS. 33A and 33B are sectional views showing an internal structure of a semiconductor device according to this eleventh embodiment, of which FIG. 33A is a sectional view taken along first leads and FIG. 33B is a sectional view taken along second leads.

As shown in FIGS. 33A, 33B, a semiconductor device 1m of this eleventh embodiment basically has the same configuration as that of the ninth embodiment illustrated in FIG. 31 and is different in the following configuration.

The semiconductor device 1m of this eleventh embodiment has a package structure using the base 10 as a spacer, in which the upper surface of the base 10 is exposed from the main surface (upper surface) 8x of the resin sealing member 8. A block molding type transfer molding method is adopted for manufacturing the semiconductor device 1m.

Such a package structure is obtained by performing the resin-sealing operation in the molding step while keeping the terminal portions 6 of leads 5 in contact with an inner surface portion of the cavity opposed to the terminal portions 6 and keeping the upper surface of the base 10 in contact with an inner surface portion of the cavity opposed to the base 10.

Such a package structure also affords the same effects as those obtained in the sixth embodiment.

Twelfth Embodiment

FIGS. 34A and 34B are sectional views showing an internal structure of a semiconductor device according to this twelfth embodiment, of which FIG. 34A is a sectional view taken along first leads and FIG. 34B is a sectional view taken along second leads.

As shown in FIGS. 34A, 34B, a semiconductor device 1n of this twelfth embodiment basically has the same configuration as the eighth embodiment illustrated in FIG. 30 and is different in the following configuration.

The semiconductor device 1n of this twelfth embodiment has a package structure using a semiconductor chip 14 as a spacer. According to this package structure, the semiconductor chip 14 is disposed on the main surface 2x of the semiconductor chip 2 and a back surface of the semiconductor chip 14 opposite to a main surface of the same chip is exposed from the main surface 8x of the resin sealing member 8. The semiconductor chip 14 is mounted on the main surface 2x of the semiconductor chip 2 through salient electrodes 15 disposed between the main surface of the semiconductor chip 14 and the main surface 2x of the semiconductor chip 2. For example, a block molding type transfer molding method is adopted for manufacturing the semiconductor device 1n of this twelfth embodiment.

Such a package structure is obtained by performing the resin-sealing operation in the molding step while keeping the terminal portions 6 of leads 5 in contact with an inner surface portion of the cavity opposed to the terminal portions 6 and keeping the back surface of the semiconductor chip 14 in contact with an inner surface portion of the cavity opposed to the back surface.

Also, according to such a package structure, there are obtained the same effects as those obtained in the sixth embodiment.

Thirteenth Embodiment

In connection with this thirteenth embodiment, reference will be made below to a first manufacturing method for a semiconductor chip having a spacer.

Figure 35:
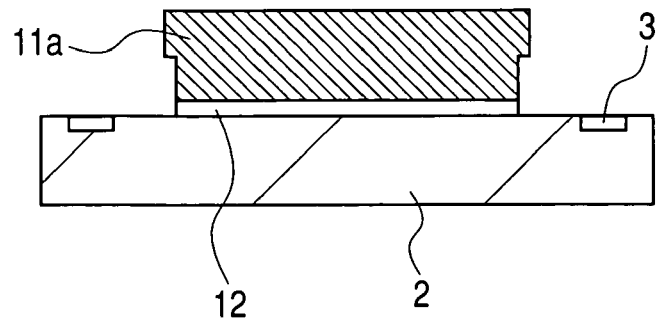
FIG. 35 is a diagrammatic sectional view of a semiconductor chip according to a thirteenth embodiment of the present invention.
Figure 36:
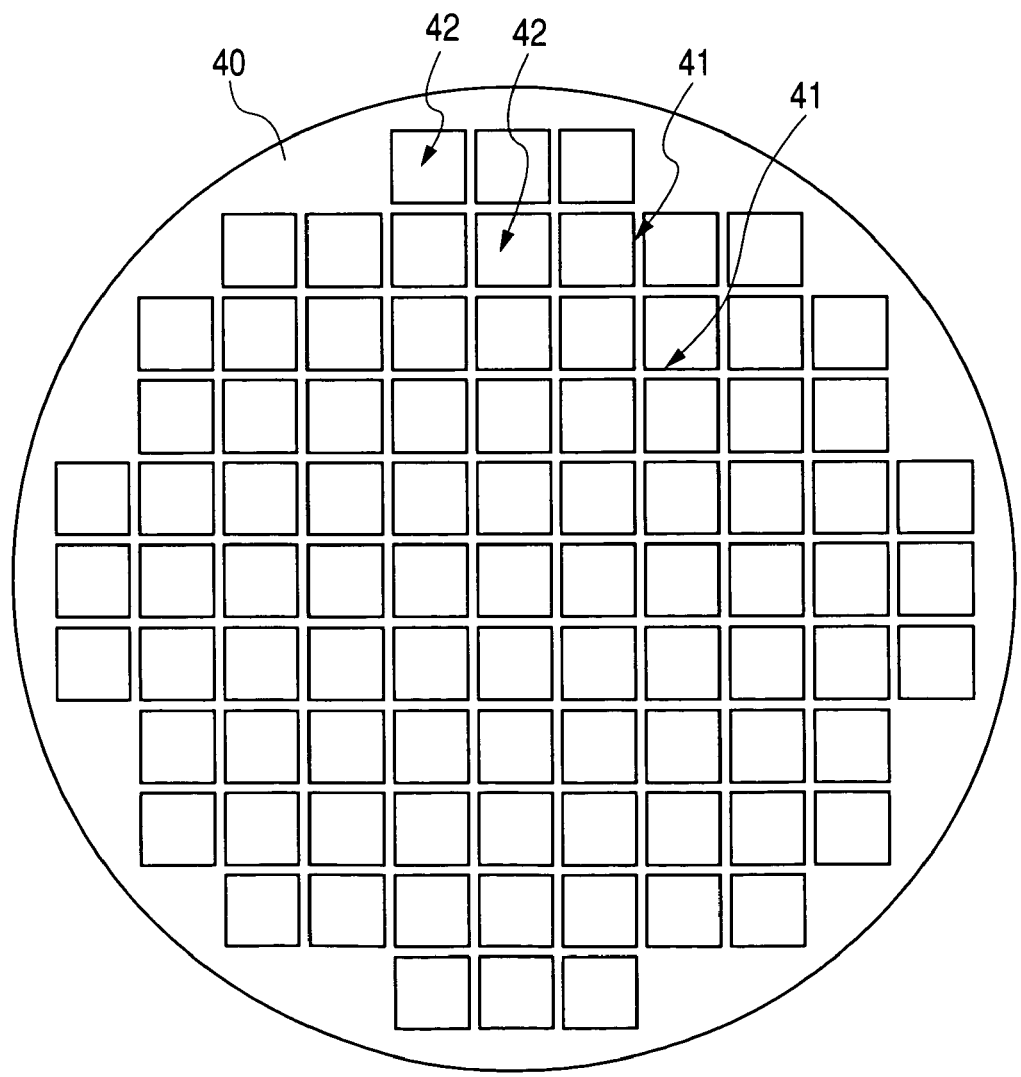
FIG. 36 is a diagrammatic plan view of a semiconductor wafer used in manufacturing the semiconductor chip of the thirteenth embodiment.
Figure 37:
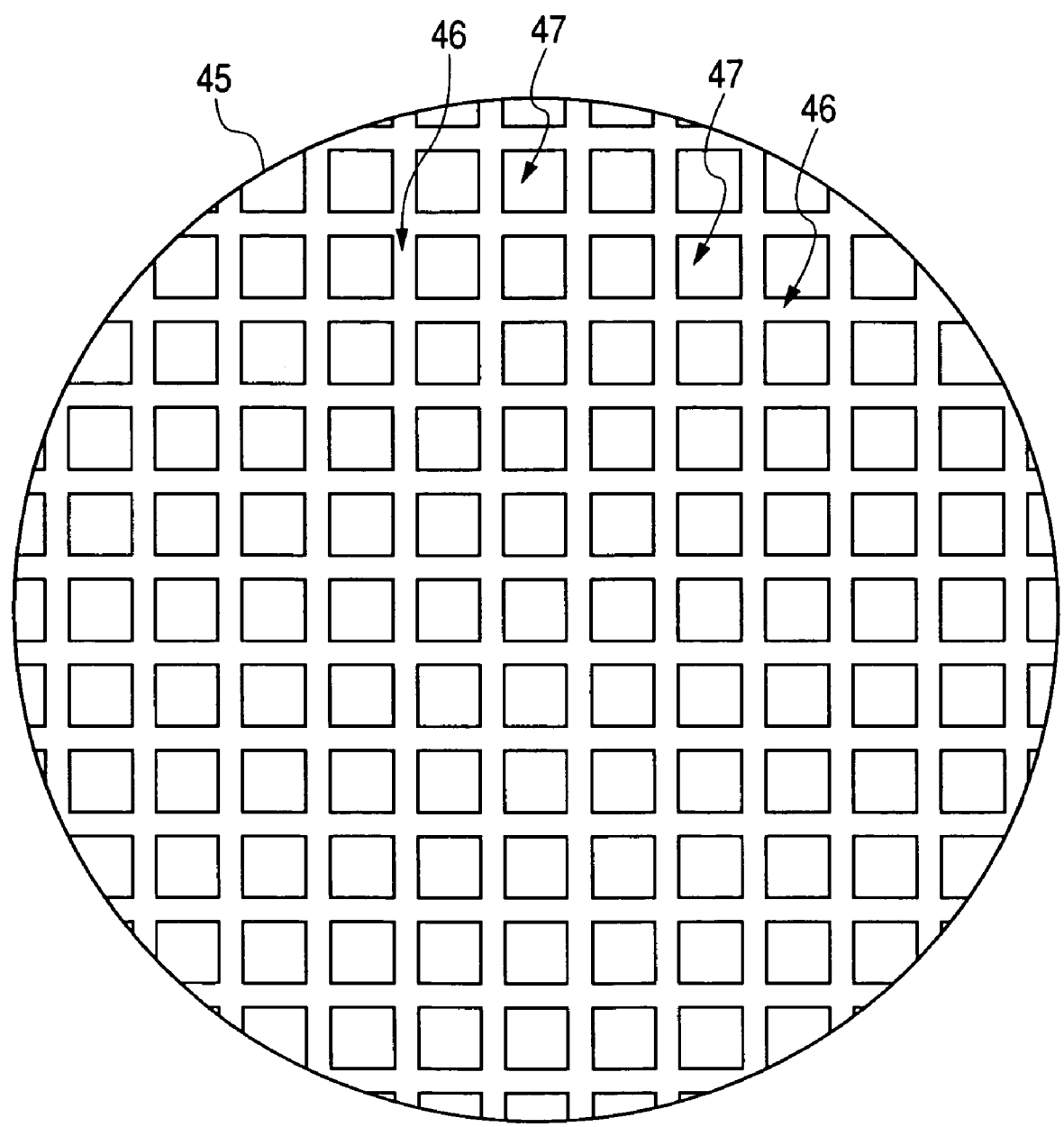
FIG. 37 is a diagrammatic plan view of a wafer for spacers used in manufacturing the semiconductor chip of the thirteenth embodiment.

FIG. 35 is a sectional view showing the construction of the semiconductor chip of this thirteenth embodiment; FIG. 36 is a plan view of a semiconductor wafer used in manufacturing the semiconductor chip of this thirteenth embodiment; FIG. 37 is a plan view of a wafer for spacers used in manufacturing the semiconductor chip of this thirteenth embodiment; and FIGS. 38A, 38B, 39A, 39B and 39C are sectional views showing steps in the manufacture of the semiconductor chip of this thirteenth embodiment.

As shown in FIG. 35, a spacer 11a is bonded and fixed through an adhesive 12 to a main surface 2x of a semiconductor chip 2 of this thirteenth embodiment. As described in connection with the sixth embodiment, the spacer 11a is used for supporting the semiconductor chip 2 on an inner surface of a cavity in a molding die during manufacture of a semiconductor device. As the spacer 11a, since it is to be bonded and fixed to the semiconductor chip 2, it is preferable to select a spacer made of a material whose thermal expansion coefficient is close to that of the semiconductor chip 2, taking into account damage of the semiconductor chip 2 caused by a difference in thermal expansion coefficient. For example, in the case where the semiconductor chip 2 is constituted mainly by a silicon substrate, it is preferable to use a spacer formed of silicon. In this thirteenth embodiment, the semiconductor chip 2 is constituted mainly by a silicon substrate and so is the spacer 11a.

As described in connection with the sixth embodiment, the spacer 11a has a contour size such that the spacer is positioned inside the bonding pads 3 formed on the semiconductor chip 2. Its thickness is larger than the loop height of each bonding wire. A description will be given below about how to manufacture the semiconductor chip 2 provided with the spacer 11a.

First, a semiconductor wafer 40, as shown in FIG. 36, and a wafer 45 for spacers, as shown in FIG. 37, are provided. For example, the wafers 40 and 45 are each constituted by a semiconductor substrate made of a single crystal silicon.

On a main surface of the semiconductor wafer 40, as shown in FIG. 36, plural chip-forming areas 42 partitioned by isolating regions 41 are arranged in a matrix form and an integrated circuit is formed in each of the plural chip-forming areas 42.

On a main surface of the wafer 45 for spacers, as shown in FIG. 37, plural spacer-forming areas 47 partitioned by isolating regions 46 as trench regions are arranged in a matrix form. The plural spacer-forming areas 47 are arranged at positions corresponding to the plural chip-forming areas 42, respectively, when the semiconductor wafer 40 and the wafer 45 for spacers are superimposed one another and are established at their positions. The isolating regions 46 are wider than the isolating regions 41 of the semiconductor wafer 40. The spacer-forming areas 47 are smaller in contour size than the chip-forming areas 42.

Next, as shown in FIG. 38A, the semiconductor wafer 40 and the wafer 45 for spacers are established at positions where the respective main surfaces thereof are in a mutually confronted state. Thereafter, as shown in FIG. 38B, the wafer 45 is bonded and fixed (affixed) to the wafer 40 while interposing an adhesive 12 between each chip-forming area 42 and each spacer-forming area 47.

Then, the plural spacer-forming areas 47 of the wafer 45 for spacers are divided (diced) into individual areas to form spacers 11a, respectively, on the chip-forming areas 42 of the semiconductor wafer 40. The division of the wafer 45 for spacers is conducted, for example, by dicing the isolating regions 46 of the wafer 45. In this case, a depth position of a dicing blade is adjusted so as not to dice the semiconductor wafer 40.

Figure 39A:
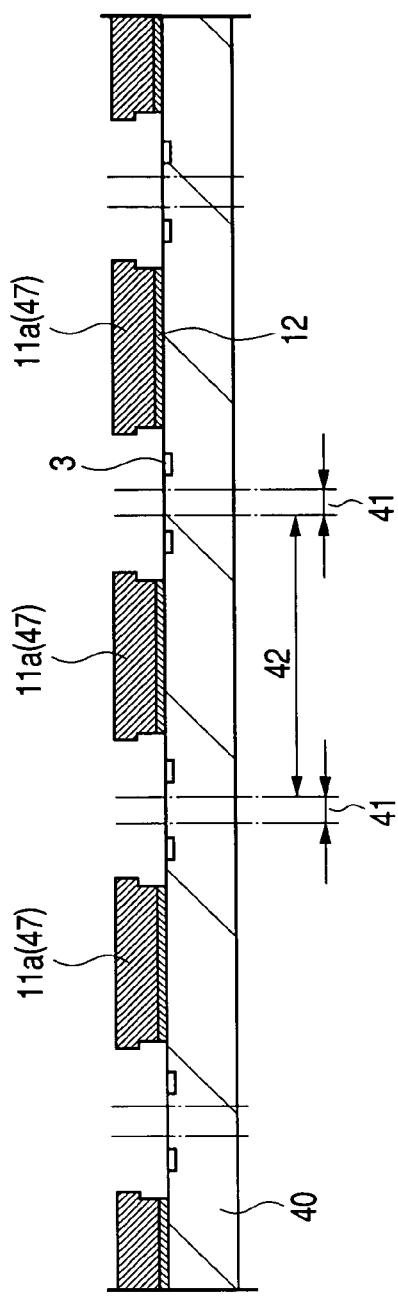
FIGS. 39A, 39B and 39C are diagrammatic sectional views showing manufacturing steps in the manufacture of the semiconductor chip of the thirteenth embodiment.
Figure 39B:
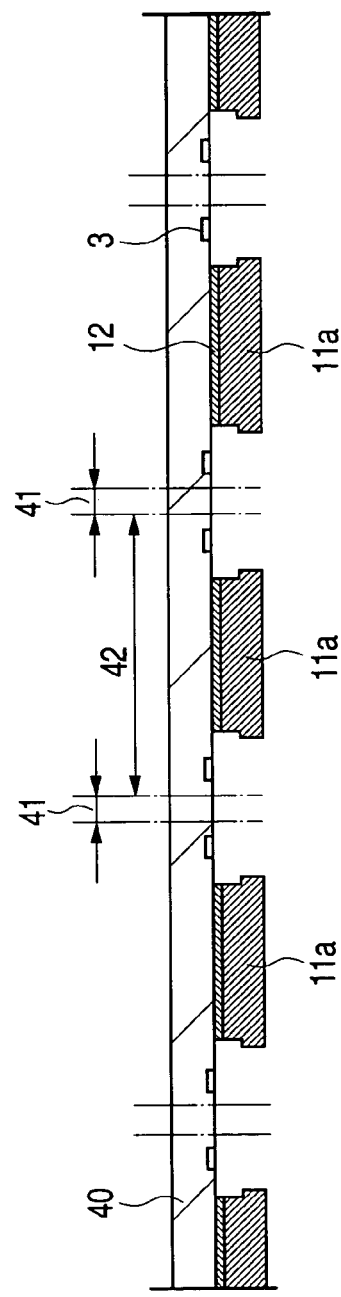

Next, as shown in FIG. 39B, the semiconductor wafer 40 is made thin, for example, by grinding or spin-etching a back surface of the wafer 40.

Figure 39C:
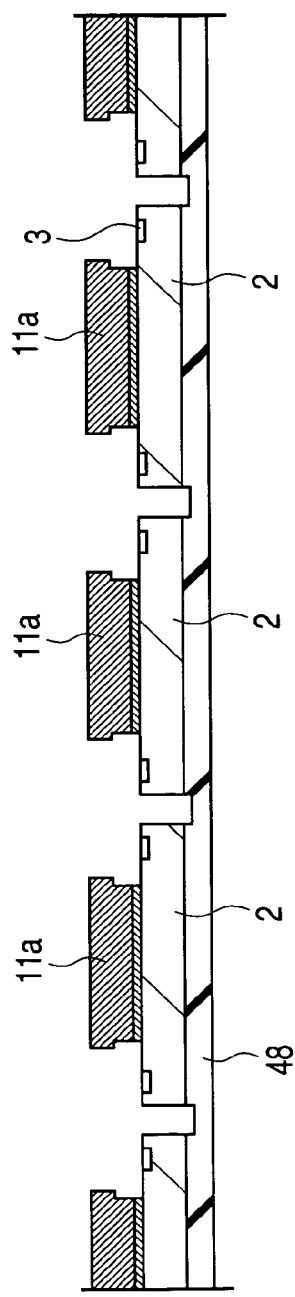

Next, the plural chip-forming areas 42 of the semiconductor wafer 40 are divided (diced) into individual areas to form semiconductor chips 2 each provided with a spacer 11a, as shown in FIG. 39C. For example, the division of the semiconductor wafer 40 is performed by dicing the isolating regions 41 on the semiconductor wafer 40.

With thinning of the semiconductor device, the associated semiconductor chip 2 tends to become thinner. As the semiconductor chip 2 becomes thinner, its mechanical strength is deteriorated, and, therefore, it is apt to be damaged by a shock during conveyance of the chip with a collet or by a shock induced at the time of mounting the chip onto the lead frame.

On the other hand, by forming the spacer 11a in each of the chip-forming areas 42 in the stage of the semiconductor wafer 40, as in this thirteenth embodiment, each of the semiconductor chips 2 formed by dividing the semiconductor wafer 40 is high in mechanical strength in the presence of the spacer 11a. Consequently, it is possible to suppress the occurrence of damage of the semiconductor chip 2 caused by a shock during conveyance of the chip with a collet or by a shock induced at the time of mounting the semiconductor chip 2 on the lead frame.

In the case where the spacer 11 is mounted on each semiconductor chip 2 after the semiconductor chip 2 is mounted on the lead frame LF, as shown in FIGS. 23A, 23B which illustrate the sixth embodiment, that is, after division of the semiconductor wafer into individual semiconductor chips, it is necessary that the spacer is mounted chip by chip. But this mounting work is troublesome and therefore the quality and cost are affected.

On the other hand, in this third embodiment, the spacers 11a are formed in individual chip-forming areas 42 in the stage of the semiconductor wafer 40, and, thus, the spacers 11a can be mounted wafer by wafer, so that the mounting work can be simplified and it is possible to improve the quality and reduce the cost.

Fourteenth Embodiment

In this fourteenth embodiment, reference will be made to a second manufacturing method for a semiconductor chip having a spacer.

FIGS. 40A to 42B are sectional views showing manufacturing steps for the semiconductor chip of this fourteenth embodiment.

Figure 40A:
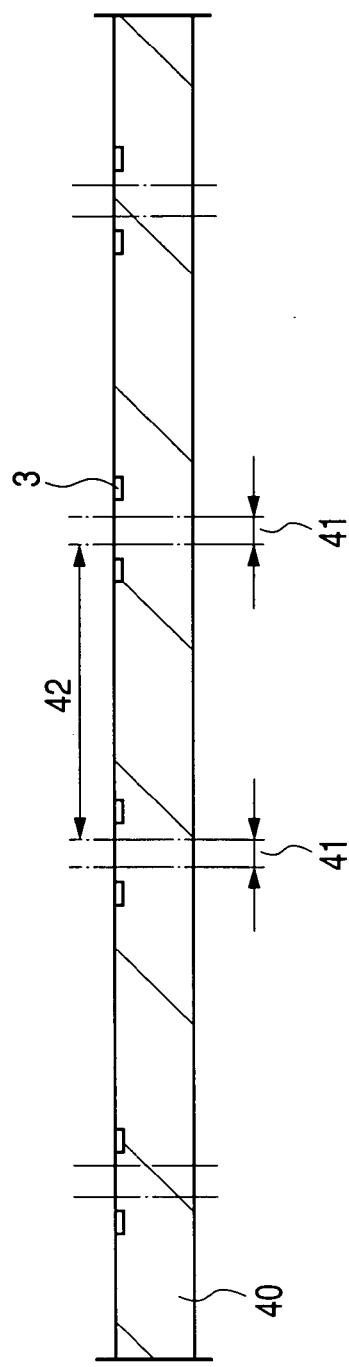
FIGS. 40A, 40B and 40C are diagrammatic sectional views showing manufacturing steps in the manufacture of a semiconductor chip according to a fourteenth embodiment of the present invention.
Figure 40B:
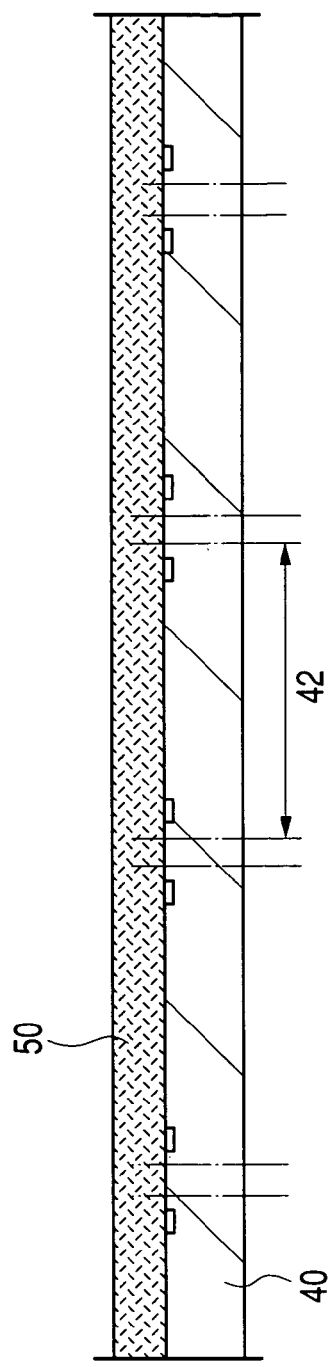
Figure 40C:
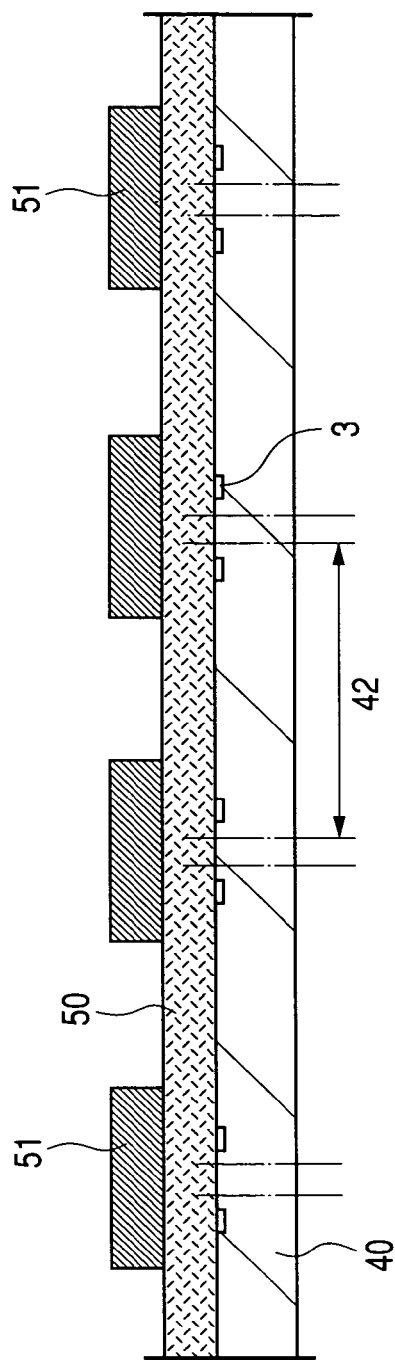

First, as shown in FIG. 40A, a semiconductor wafer 40 is formed; then, as shown in FIG. 40B, a photosensitive resist film 50 is formed on a main surface of the semiconductor wafer 40 by a spin coating method for example; and, thereafter, as shown in FIG. 40C, a mask 51 formed of glass, for example, is disposed on the resist film 50. The mask 51 has plural apertures at locations corresponding to plural chip-forming areas 42 on the semiconductor wafer 40. Like the spacer-forming areas 47 of the wafer 45 for spacers shown in FIG. 37, the plural apertures each have a contour size smaller than each chip-forming area on the semiconductor wafer 40.

Figure 41A:
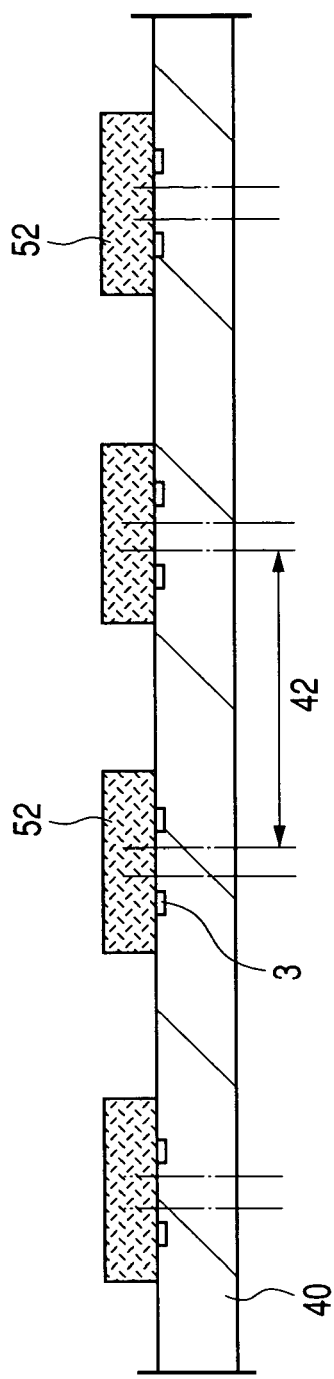
FIGS. 41A, 41B and 41C are diagrammatic sectional views showing manufacturing steps in the manufacture of the semiconductor chip of the fourteenth embodiment.

Next, as shown in FIG. 41A, the resist film 50 is exposed to light through the apertures of the mask 51, followed by development, to form a mask 52 for spacers on the main surface of the semiconductor wafer 40, the mask 52 being formed of the resist film 50.

Figure 41B:
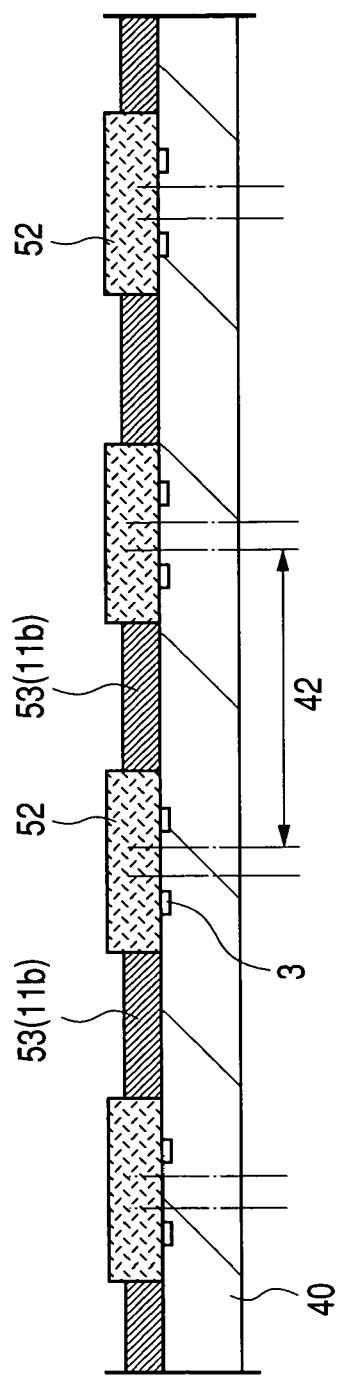
Figure 41C:
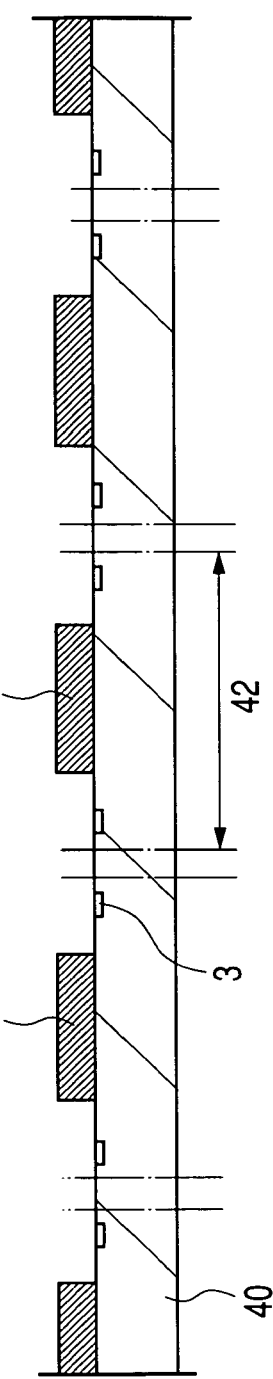

Then, as shown in FIG. 41B, an insulating layer 53 of a polyimide resin, for example, is formed in each aperture of the mask 52 for spacers by a spin coating method, for example; then, it is cured; and, thereafter, the mask 52 for spacers is removed from the main surface of the semiconductor wafer 40. Through these steps, spacers 11b are formed by the insulating layer 53, respectively, on the chip-forming areas of the semiconductor wafer 40.

Subsequently, as shown in FIG. 42A, the semiconductor wafer 40 is made thin in the same way as in the thirteenth embodiment, and, then, the plural chip-forming areas 42 of the semiconductor wafer 40 are divided (diced) into individual areas in the same manner as in the thirteenth embodiment to form semiconductor chips 2 having spacers 11b on their main surfaces, as shown in FIG. 42B.

Also, in this fourteenth embodiment, wherein the semiconductor chips 2 are formed in the above-described manner, there can be obtained the same effects as those obtained in the thirteenth embodiment.

Fifteenth Embodiment

In this fifteenth embodiment, reference will be made to a third manufacturing method for a semiconductor chip having a spacer.

Figure 43A:
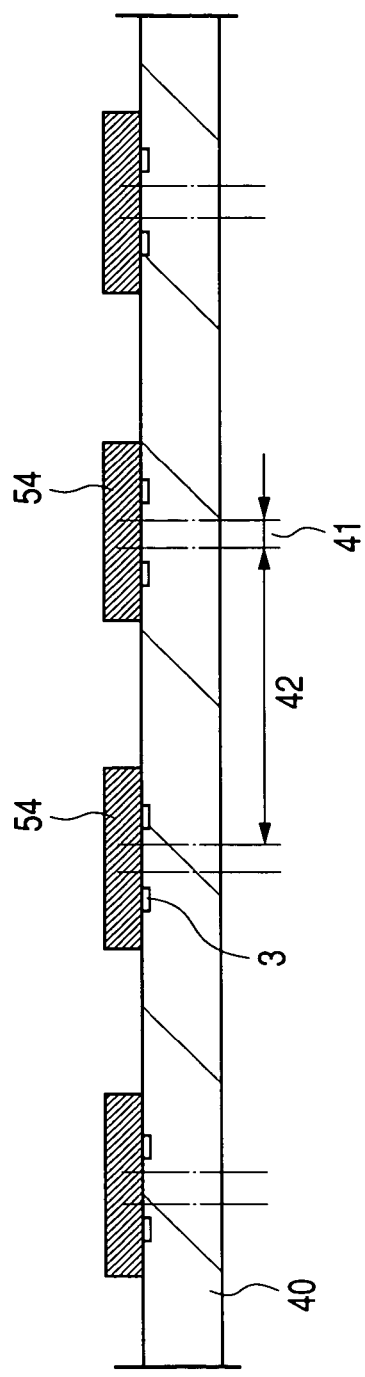
FIGS. 43A, 43B and 43C are diagrammatic diagrams showing manufacturing steps in the manufacture of a semiconductor chip according to a fifteenth embodiment of the present invention.
Figure 43B:
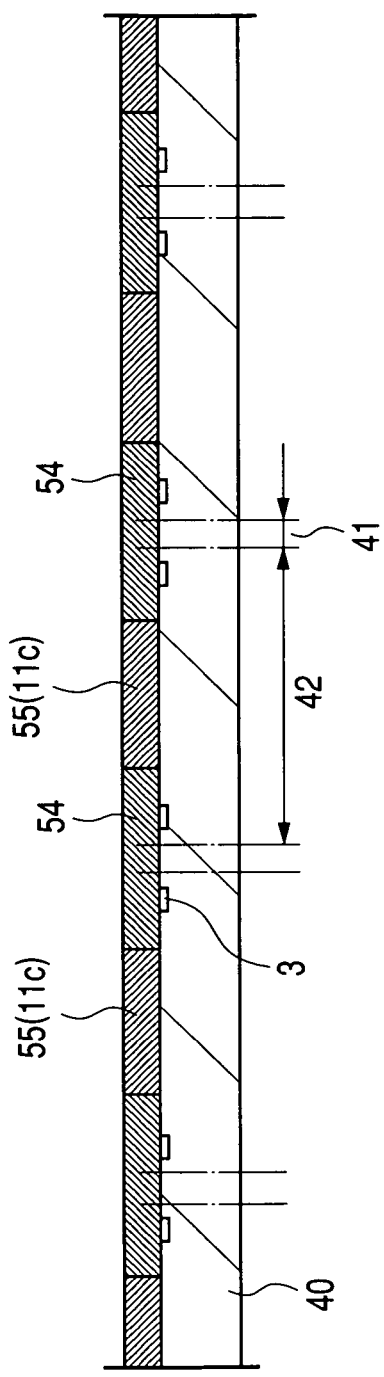
Figure 43C:
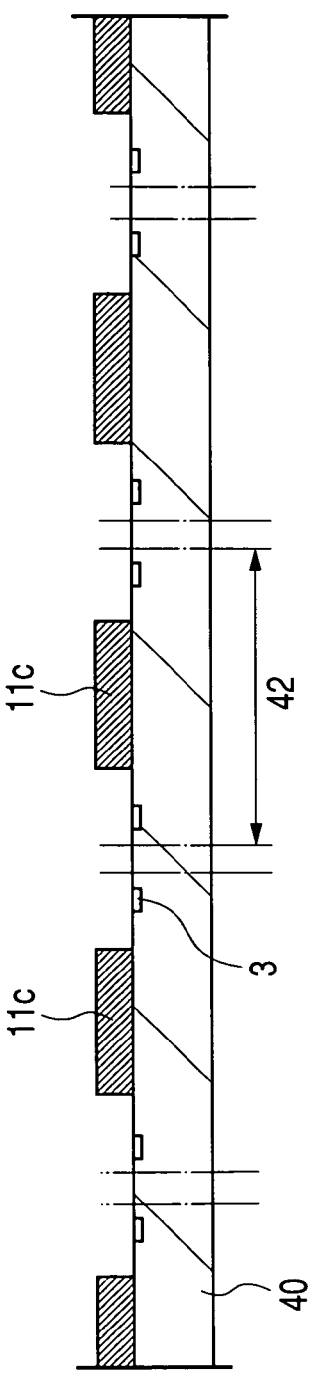

FIGS. 43A to 43C are sectional views showing steps in the manufacture of the semiconductor chip of this fifteenth embodiment.

First, the semiconductor wafer 40 shown in FIG. 36 is formed, and, thereafter, as shown in FIG. 43A, a mask 54 for screen printing is disposed on the main surface of the semiconductor wafer 40. The mask 54 has plural apertures at locations corresponding to the plural chip-forming areas 42 on the semiconductor wafer 40. Like the spacer-forming areas 47 on the wafer 45 for spacers, as shown in FIG. 37, the plural apertures each have a contour size smaller than each of the chip-forming areas 42 on the semiconductor wafer 40.

Next, the apertures of the mask 54 are filled with, for example, a polyimide resin by means of a squeezer to form an insulating layer 55, as shown in FIG. 43B. Thereafter, the mask 54 is removed from the main surface of the semiconductor wafer 40 and then the insulating layer 55 is cured. Through these steps, spacers 11c are formed by the insulating layer 55, respectively, on the chip-forming areas 42 on the semiconductor wafer 40.

Subsequently, the semiconductor wafer 40 is made thin in the same way as in the thirteenth embodiment, and, then, the plural chip-forming areas 42 of the semiconductor wafer 40 are divided (diced) into individual areas in the same manner as in the thirteenth embodiment to form semiconductor chips 2 having spacers 11b on their main surfaces.

Also, according to this fifteenth embodiment, wherein the semiconductor chips 2 are formed in the above-described manner, the same effects as in the thirteenth embodiment are obtained.

Sixteenth Embodiment

In this sixteenth embodiment, reference will be made to an example in which the present invention is applied to a stack type semiconductor device.

Figure 44:
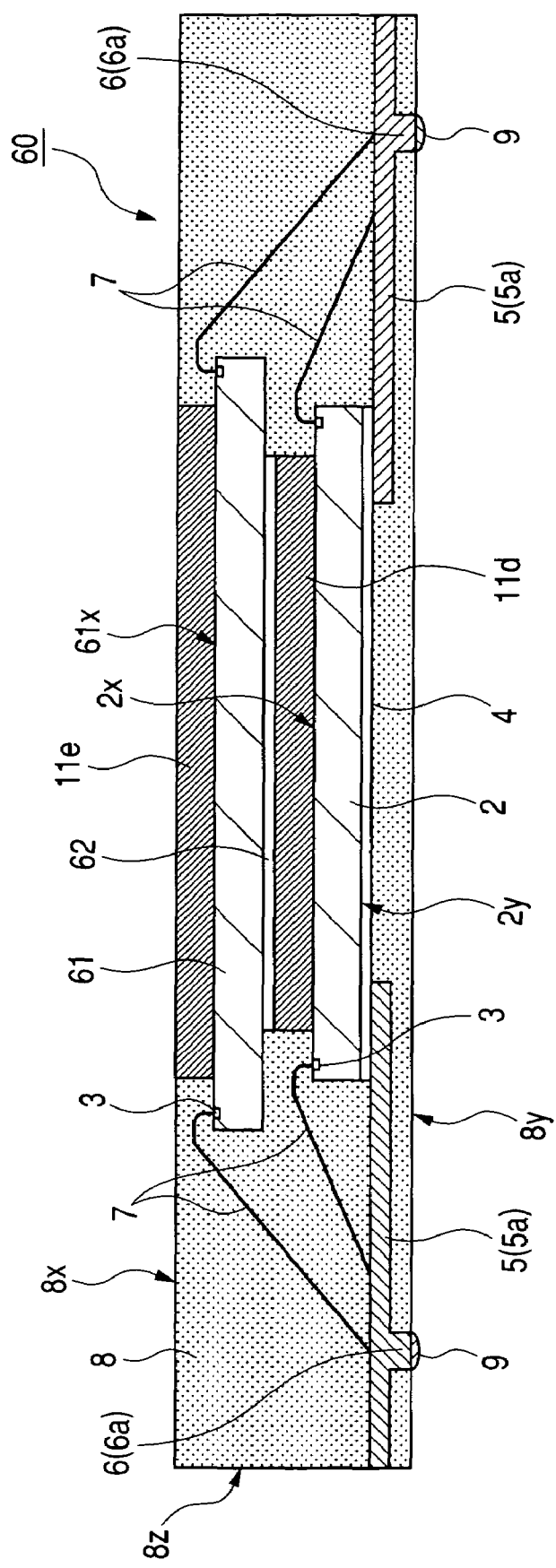
FIG. 44 is a diagrammatic sectional view showing an internal structure of a semiconductor device according to a sixteenth embodiment of the present invention.
Figure 45A:
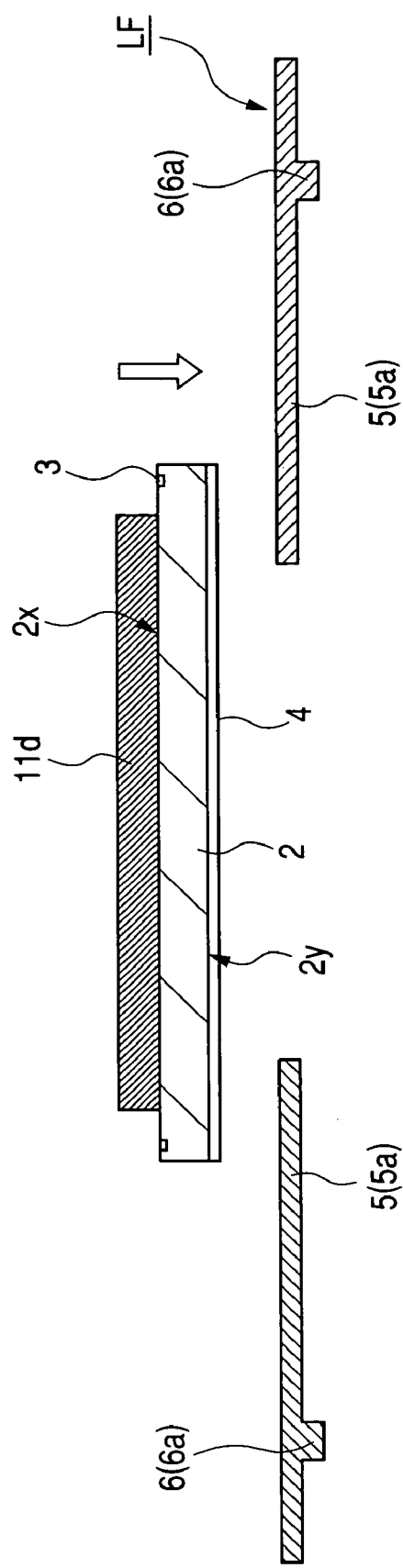
Figure 45B:
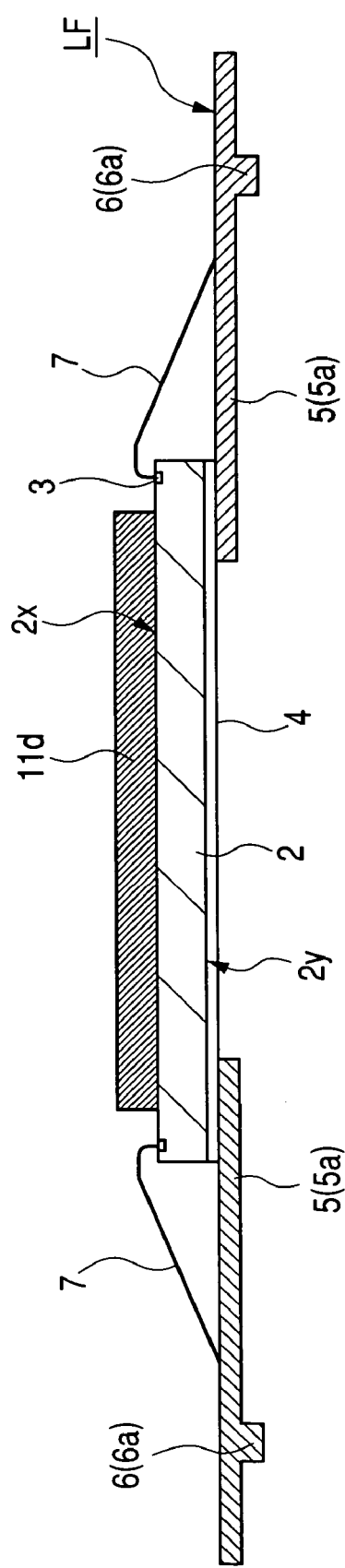

FIG. 44 is a sectional view showing an internal structure of the semiconductor device of this sixteenth embodiment, FIGS. 45A and 45B are sectional views showing manufacturing steps for the semiconductor device of this sixteenth embodiment, of which FIG. 45A shows a chip mounting step and FIG. 45B shows a wire bonding step; and, FIGS. 46A and 46B are sectional views showing manufacturing steps for the semiconductor device of this sixteenth embodiment, of which FIG. 46A shows a chip mounting step and FIG. 46B shows a wire bonding step.

As shown in FIG. 44, a semiconductor device 60 of this sixteenth embodiment basically has the same configuration as that of the sixth embodiment and is different in the following configuration.

The semiconductor device 60 of this sixteenth embodiment has a package structure wherein a semiconductor chip 61 is stacked on a main surface 2x of a semiconductor chip 2 through a spacer 11d and these two semiconductor chips are sealed with one resin sealing member 8. The semiconductor chip 61 is provided on a main surface thereof with an integrated circuit and plural bonding pads 3. A back surface of the semiconductor chip 61 opposite to the main surface thereof is bonded and fixed to an upper surface of the spacer 11d through an adhesive 62. A back surface of the spacer 11e is bonded and fixed to the main surface of the semiconductor chip 61, while an upper surface of the spacer 11e opposite to the back surface is exposed from a main surface (upper surface) 8x of the resin sealing member 8. The plural bonding pads 3 on the semiconductor chip 61 are electrically connected respectively to corresponding plural leads 5 through bonding wires 7.

The semiconductor chips 2 and 61 used in this sixteenth embodiment are formed, for example, by the same semiconductor chip forming method as that described in connection with the fourteenth or fifteenth embodiment. The semiconductor chip 61 used in this sixteenth embodiment is formed in a contour size larger than that of the semiconductor chip 2, though no limitation is made thereto. For manufacturing the semiconductor device 60 of this sixteenth embodiment, a block molding type transfer molding method is adopted, for example.

Such a package structure is obtained by performing the resin-sealing operation in the molding step, while keeping the terminal portions 6 of leads 5 in contact with an inner surface portion of the cavity opposed to the terminal portions 6 and keeping the upper surface of the spacer 11e in contact with an inner surface portion of the cavity opposed to the upper surface of the spacer 11d.

Next, with reference to FIGS. 45A, 45B and 46A, 46B, a description will be given below about how to manufacture the semiconductor device 60.

First, the lead frame LF shown in FIGS. 8 and 9, as well as the semiconductor chips 2 and 61, are provided. The semiconductor chips 2 and 61 have spacers (11d, 11e) on the respective main surfaces.

Then, as shown in FIG. 45A, the semiconductor chip 2 is bonded and fixed to the lead frame LF. The bonding and fixing between the lead frame LF and the semiconductor chip 2 are effected by bonding and fixing ends on one side of the leads 5 to a back surface 2y of the semiconductor chip 2.

Next, as shown in FIG. 45B, the plural bonding pads 3 on the semiconductor chip 2 and the plural leads 5 are electrically connected together through plural bonding wires 7, and, thereafter, as shown in FIG. 46A, the semiconductor chip 61 is bonded and fixed to the spacer 11d on the semiconductor chip 2. The bonding and fixing between the spacer 11*d* and the semiconductor chip 61 are effected by bonding and fixing the back surface of the semiconductor chip 61 to the upper surface of the spacer 11*d*.

Then, as shown in FIG. 46B, the plural bonding pads 3 on the semiconductor chip 61 and the plural leads 5 are electrically connected together through plural bonding wires 7.

Thereafter, a resin sealing member is formed in the same way as in the sixth embodiment, and, then, it is divided (diced) in the same manner as in the sixth embodiment. Through these steps the semiconductor device 60 shown in FIG. 44 is nearly completed.

Also, according to the package structure of this sixteenth embodiment, the same effects as in the sixth embodiment are obtained.

In this sixteenth embodiment, moreover, since the semiconductor chip 61 is stacked on the semiconductor chip 2 through the spacer 11*d*, the semiconductor chip 61 which is larger in contour size than the semiconductor chip 2 can be stacked on the chip 2.

Moreover, since the semiconductor chip 61 which is larger in contour size than the semiconductor chip 2 can be stacked on the chip 2, the length of each of the bonding wires 7 which provide electric connections between the bonding pads 3 on the upper-stage semiconductor chip 61 and the leads 5 can be made shorter than in the case of stacking a semiconductor chip that is smaller than the semiconductor chip 2 onto the semiconductor chip 2.

Further, since the semiconductor chips 2 and 61 used in this sixteenth embodiment are formed by the method wherein spacers are formed on individual chip-forming areas in the wafer stage, the semiconductor chips 2 and 61 can be prevented from being damaged by a shock during their conveyance with a collet or a shock induced at the time of mounting the semiconductor chip 2 onto the lead frame or a shock induced at the time of mounting the semiconductor chip 61 onto the semiconductor chip 2. Consequently, the semiconductor device 60, which is high in manufacturing yield, can be provided.

Additionally, even if the semiconductor chips 2 and 61 are made thin, their mechanical strengths are ensured by the spacers (11*d*, 11*e*), so that the semiconductor device 60 of a thin type which is high in manufacturing yield can be provided.

Seventeenth Embodiment

In connection with this seventeenth embodiment, reference will be made to an example in which the present invention is applied to a CSP (Chip Size Package) type semiconductor device having a wiring substrate called an interposer.

Figure 47:
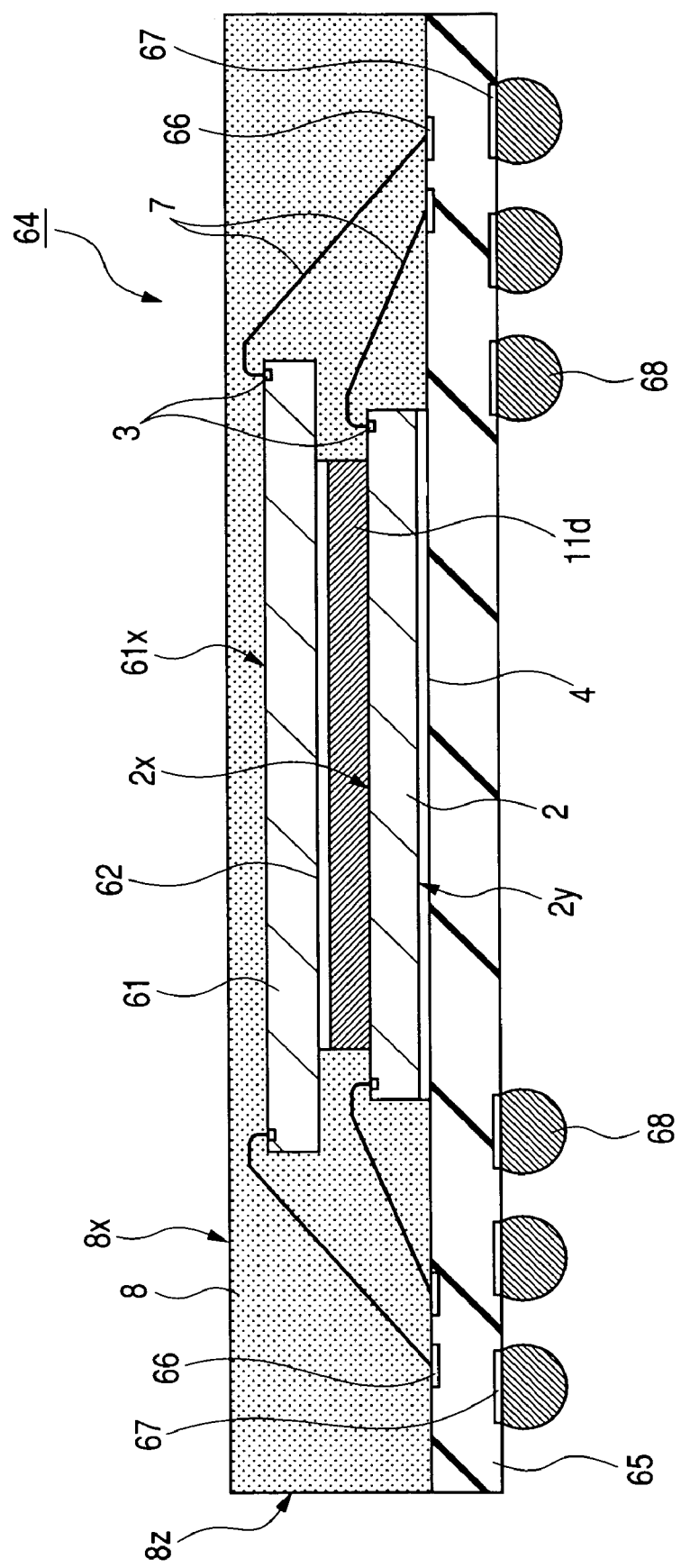
FIG. 47 is a diagrammatic sectional view showing an internal structure of a semiconductor device according to a seventeenth embodiment of the present invention.

FIG. 47 is a sectional view showing an internal structure of a semiconductor device according to this seventeenth embodiment; FIGS. 48A and 48B are sectional views showing steps in the manufacture of the semiconductor device of this seventeenth embodiment, of which FIG. 48A shows a chip mounting step and FIG. 48B shows a wire bonding step; and FIGS. 49A and 49B are sectional views showing manufacturing steps for the semiconductor device of this seventeenth embodiment, of which FIG. 49A shows a chip mounting step and FIG. 49B shows a wire bonding step.

As shown in FIG. 47, a semiconductor device 64 of this seventeenth embodiment has a package structure wherein two semiconductor chips (2, 61) are stacked on a main surface of a wiring substrate 65. A back surface 2*y* of the semiconductor chip 2 is bonded and fixed to the main surface of the wiring substrate 65 through an adhesive 4 and a spacer 11*d* is disposed on a main surface 2*x* of the semiconductor chip 2. A back surface of the semiconductor chip 61 is bonded and fixed to an upper surface of the spacer 11*d* through an adhesive.

For example, the semiconductor chip 2 used in this seventeenth embodiment is formed by the same method as the semiconductor chip forming method described in connection with the fourteenth or fifteenth embodiment, while the semiconductor chip 61 used in this seventeenth embodiment is formed in accordance with a conventional wafer process.

Plural connecting portions 66 are arranged around the semiconductor chips 2 and 61. The plural connecting portions 66 are constituted by portions of wiring lines formed on the wiring substrate 65 and are arranged at locations corresponding to the plural bonding pads 3 formed on the semiconductor chips 2 and 61.

The plural connecting portions 66 are electrically connected through wiring lines on the wiring substrate 65 to plural electrodes (lands) 67 formed on a back surface of the wiring substrate 65 opposed to the main surface of the same substrate. Salient electrodes (bump electrodes) 68, which are used, for example, as external terminals, are connected respectively to the plural electrodes 67 electrically and mechanically.

The plural bonding pads 3 on the semiconductor chips 2 and 61 are electrically connected respectively to the plural connecting portions 66 on the wiring substrate 65 through the plural bonding wires 7.

The semiconductor chips 2, 61 and the plural bonding wires 7 are sealed with a resin sealing member 8 which selectively covers the main surface of the wiring substrate 65. The resin sealing member 8 is formed by a one-side molding technique.

Next, with reference to FIGS. 48A, 48B and 49A, 49B, a description will be given about how to manufacture the semiconductor device 64.

First, the wiring substrate 65 and the semiconductor chips 2, 61 are provided. The semiconductor chip 2 has the spacer 11*d* on its main surface.

Then, as shown in FIG. 48A, the semiconductor chip 2 is bonded and fixed to the main surface of the wiring substrate 65. The bonding and fixing between the wiring substrate 65 and the semiconductor chip 2 are effected by bonding and fixing the back surface 2*y* of the semiconductor chip 2 to the main surface of the wiring substrate 65 through an adhesive 4.

Next, as shown in FIG. 48B, the plural bonding pads 3 on the semiconductor chip 2 and the plural connecting portions 66 on the wiring substrate 65 are electrically connected through plural bonding wires 7. Thereafter, as shown in FIG. 49A, the semiconductor chip 61 is bonded and fixed to the spacer 11*d* on the semiconductor chip 2. The bonding and fixing between the spacer 11*d* and the semiconductor chip 61 are effected by bonding and fixing the back surface of the semiconductor chip 61 to the upper surface of the spacer 11*d* through the adhesive 62.

Then, as shown in FIG. 49B, the plural bonding pads 3 on the semiconductor chip 61 and the plural connecting portions 66 on the wiring substrate 65 are electrically connected through plural bonding wires 7.

Subsequently, a resin sealing member is formed on the main surface of the wiring substrate 65 basically in the same way as in the sixth embodiment to seal the two semiconductor chips (2, 61) and the plural bonding wires 7. Then, salient electrodes 68 are formed on the electrodes 67 on the back surface of the wiring substrate 65, followed by division (dicing) of the resin sealing member and the wiring substrate 65 basically in the same manner as in the sixth embodiment. Through these steps, the semiconductor device 64 shown in FIG. 47 is nearly completed.

Thus, also according to the package structure of this seventeenth embodiment, the same effects as in the sixteenth embodiment are obtained.

Although the present invention has been described above on the basis of the various embodiments, it goes without saying that the present invention is not limited to the above-described embodiments and that various changes may be made within a scope not departing from the gist of the invention.

Effects obtained by typical modes of the invention as disclosed herein are as outlined below.

According to the present invention, it is possible to improve the mounting reliability of the semiconductor device.

According to the present invention, it is possible to reduce the thickness of the semiconductor device.

According to the present invention, it is possible to reduce the cost of the semiconductor device.

What is claimed is:

1. A semiconductor device comprising:
   a semiconductor chip having over a main surface thereof an integrated circuit and plural electrodes;
   plural leads arranged around said semiconductor chip;
   plural wires electrically connecting the plural electrodes on said semiconductor chip with the plural leads; and
   a resin sealing member adapted to seal said semiconductor chip, portions of said plural leads and said plural wires;
   wherein the plural leads have plural first leads including first terminal portions respectively and plural second leads including second terminal portions respectively, the plural second leads each being disposed between adjacent ones of said first leads;
   wherein end portions on one side of each of the plural first leads are positioned outside said semiconductor chip;
   wherein end portions on one side of each of the plural second leads are fixed to a back surface of said semiconductor chip;
   wherein the first terminal portions are arranged along side faces of the resin sealing member respectively;
   wherein the second terminal portions are arranged inside said first terminal portions respectively; and
   wherein the first terminal portions and the second terminal portions are arranged in a staggered arrangement.

2. The semiconductor device according to claim 1, wherein said semiconductor chip is fixed to the end portions on one side of each of the plural second leads through a base which has a main surface and a back side.

3. The semiconductor device according to claim 2, wherein the end portions on one side of each of the plural second leads are fixed to the back side of the base.

4. The semiconductor device according to claim 1, wherein the plural leads each have a first portion, a second portion bent from the first portion to a back surface of the resin sealing member, and a third portion extending from the second portion toward the side face of the resin sealing member.

5. The semiconductor device according to claim 4, wherein said semiconductor chip is fixed to the first portion; and
   wherein the first terminal portions and the second terminal portions are formed in the third portion.

6. The semiconductor device according to claim 1, wherein the plural leads are fixed to said semiconductor chip through an adhesive.

* * * * *